(12) United States Patent
Woodgate et al.

(10) Patent No.: US 10,185,076 B2
(45) Date of Patent: Jan. 22, 2019

(54) DIRECTIONAL BACKLIGHTS WITH LIGHT EMITTING ELEMENT PACKAGES

(71) Applicant: RealD Spark, LLC, Beverly Hills, CA (US)

(72) Inventors: Graham J. Woodgate, Henley-on-Thames (GB); Michael G. Robinson, Boulder, CO (US); Jonathan Harrold, Leamington Spa (GB)

(73) Assignee: RealD Spark, LLC, Beverly Hills, CA (US)

( * ) Notice: Subject to any disclaimer, the term of this patent is extended or adjusted under 35 U.S.C. 154(b) by 0 days.

(21) Appl. No.: 15/413,232

(22) Filed: Jan. 23, 2017

(65) Prior Publication Data
US 2017/0199319 A1     Jul. 13, 2017

Related U.S. Application Data

(62) Division of application No. 14/538,411, filed on Nov. 11, 2014, now Pat. No. 9,551,825.
(Continued)

(51) Int. Cl.
*F21V 8/00*     (2006.01)
*H01L 25/075*     (2006.01)
(Continued)

(52) U.S. Cl.
CPC ......... *G02B 6/0073* (2013.01); *G02B 6/0046* (2013.01); *G02B 6/0048* (2013.01);
(Continued)

(58) Field of Classification Search
CPC .... G02B 6/0023; G02B 6/0025; G02B 6/005; G02B 6/0053; G02B 6/0055;
(Continued)

(56) References Cited

U.S. PATENT DOCUMENTS 2,133,121 A    10/1938   Stearns
2,810,905 A    10/1957   Barlow
(Continued)

FOREIGN PATENT DOCUMENTS

CN     1142869 A     2/1997
CN     1377453     10/2002
(Continued)

OTHER PUBLICATIONS

PCT/US2014/065020 International search report and written opinion of international searching authority dated Feb. 24, 2015.
(Continued)

*Primary Examiner* — Alan B Cariaso
(74) *Attorney, Agent, or Firm* — Penny L. Lowry; Neil G. Mothew

(57) ABSTRACT

A light emitting diode package for a directional display may comprise light emitting diodes and a protection diode. The protection diode may be arranged in a well that is at a different location to the well that the light emitting diodes are arranged. The directional display may include a waveguide. The waveguide may include light extraction features arranged to direct light from an array of light sources by total internal reflection to an array of viewing windows and a reflector arranged to direct light from the waveguide by transmission through extraction features of the waveguide to the same array of viewing windows. The brightness of the directional display can be increased. An efficient and bright directional display system can be achieved. Efficient light baffling for light escaping from the edge of the waveguide is achieved through light deflecting extraction films.

20 Claims, 39 Drawing Sheets

Related U.S. Application Data

(60) Provisional application No. 61/904,880, filed on Nov. 15, 2013, provisional application No. 61/934,086, filed on Jan. 31, 2014.

(51) Int. Cl.
*H01L 25/16* (2006.01)
*H01L 33/64* (2010.01)
*G02B 27/22* (2018.01)
*H01L 27/15* (2006.01)
*H01L 29/866* (2006.01)
*H01L 33/48* (2010.01)
*H01L 33/50* (2010.01)
*H01L 33/62* (2010.01)
*H01L 23/00* (2006.01)

(52) U.S. Cl.
CPC ......... *G02B 6/0055* (2013.01); *G02B 6/0063* (2013.01); *G02B 6/0068* (2013.01); *G02B 27/225* (2013.01); *G02B 27/2214* (2013.01); *H01L 24/48* (2013.01); *H01L 25/0753* (2013.01); *H01L 25/167* (2013.01); *H01L 27/15* (2013.01); *H01L 29/866* (2013.01); *H01L 33/486* (2013.01); *H01L 33/505* (2013.01); *H01L 33/62* (2013.01); *H01L 33/642* (2013.01); *H01L 33/647* (2013.01); *G02B 6/0053* (2013.01); *H01L 24/49* (2013.01); *H01L 2224/48091* (2013.01); *H01L 2224/48137* (2013.01); *H01L 2224/48247* (2013.01); *H01L 2224/48257* (2013.01); *H01L 2224/49113* (2013.01); *H01L 2924/00014* (2013.01); *H01L 2933/0066* (2013.01); *H01L 2933/0075* (2013.01)

(58) Field of Classification Search
CPC .. G02B 6/0068; G02B 6/0073; G02B 6/0046; G02B 6/0063
See application file for complete search history.

(56) References Cited

U.S. PATENT DOCUMENTS

| | | | |
|---|---|---|---|
| 5,347,644 A | 9/1994 | Sedlmayr | |
| 5,703,667 A | 12/1997 | Ochiai | |
| 5,727,107 A | 3/1998 | Umemoto et al. | |
| 5,771,066 A | 6/1998 | Barnea | |
| 5,896,225 A | 4/1999 | Chikazawa | |
| 5,903,388 A | 5/1999 | Sedlmayr | |
| 5,959,664 A | 9/1999 | Woodgate | |
| 5,971,559 A | 10/1999 | Ishikawa et al. | |
| 6,014,164 A | 1/2000 | Woodgate et al. | |
| 6,075,557 A | 6/2000 | Holliman et al. | |
| 6,108,059 A | 8/2000 | Yang | |
| 6,144,118 A | 11/2000 | Cahill et al. | |
| 6,199,995 B1 | 3/2001 | Umemoto | |
| 6,305,813 B1 | 10/2001 | Lekson et al. | |
| 6,464,365 B1 | 10/2002 | Gunn et al. | |
| 6,663,254 B2 | 12/2003 | Ohsumi | |
| 6,847,488 B2 | 1/2005 | Travis | |
| 6,870,671 B2 | 3/2005 | Travis | |
| 6,883,919 B2 | 4/2005 | Travis | |
| 7,052,168 B2 | 5/2006 | Epstein et al. | |
| 7,058,252 B2 | 6/2006 | Woodgate | |
| 7,073,933 B2 | 7/2006 | Gotoh et al. | |
| 7,101,048 B2 | 9/2006 | Travis | |
| 7,136,031 B2 | 11/2006 | Lee et al. | |
| 7,186,014 B2 * | 3/2007 | Shimura | G02B 6/0053 349/65 |
| 7,215,415 B2 | 5/2007 | Maehara | |
| 7,410,286 B2 | 8/2008 | Travis | |
| 7,430,358 B2 | 9/2008 | Qi et al. | |
| 7,528,893 B2 | 5/2009 | Schultz | |
| 7,545,429 B2 | 6/2009 | Travis | |
| 7,660,047 B1 | 2/2010 | Travis et al. | |
| 7,750,981 B2 | 7/2010 | Shestak | |
| 7,750,982 B2 | 7/2010 | Nelson et al. | |
| 7,944,428 B2 | 5/2011 | Travis | |
| 7,970,246 B2 | 6/2011 | Travis et al. | |
| 7,976,208 B2 | 7/2011 | Travis | |
| 8,016,475 B2 | 9/2011 | Travis | |
| 8,177,406 B2 * | 5/2012 | Pakhchyan | G02B 5/045 362/606 |
| 8,216,405 B2 | 7/2012 | Emerton | |
| 8,223,296 B2 | 7/2012 | Lee et al. | |
| 8,325,295 B2 | 12/2012 | Sugita | |
| 8,354,806 B2 | 1/2013 | Travis | |
| 8,477,261 B2 | 7/2013 | Travis | |
| 8,502,253 B2 | 8/2013 | Min | |
| 8,534,901 B2 | 9/2013 | Panagotacos et al. | |
| 8,556,491 B2 | 10/2013 | Lee | |
| 8,651,725 B2 | 2/2014 | Ie et al. | |
| 8,714,804 B2 | 5/2014 | Kim et al. | |
| 8,752,995 B2 | 6/2014 | Park | |
| 8,864,361 B2 * | 10/2014 | Motooka | G02B 6/0013 349/64 |
| 8,905,613 B2 * | 12/2014 | Niu | G09F 13/04 362/290 |
| 8,931,943 B2 * | 1/2015 | Kunimochi | G02B 6/0011 362/609 |
| 8,939,633 B2 * | 1/2015 | Yabe | G02B 6/0028 362/620 |
| 2001/0001207 A1 * | 5/2001 | Shimizu | C09K 11/7774 257/98 |
| 2002/0113246 A1 | 8/2002 | Nagai et al. | |
| 2002/0113866 A1 | 8/2002 | Taniguchi et al. | |
| 2003/0137738 A1 | 7/2003 | Ozawa et al. | |
| 2003/0137821 A1 | 7/2003 | Gotoh et al. | |
| 2004/0108971 A1 | 6/2004 | Waldern et al. | |
| 2004/0170011 A1 | 9/2004 | Kim et al. | |
| 2004/0263968 A1 | 12/2004 | Kobayashi et al. | |
| 2005/0135116 A1 | 6/2005 | Epstein et al. | |
| 2005/0180167 A1 | 8/2005 | Hoelen et al. | |
| 2005/0264717 A1 | 12/2005 | Chien et al. | |
| 2005/0274956 A1 | 12/2005 | Bhat | |
| 2005/0276071 A1 | 12/2005 | Sasagawa et al. | |
| 2006/0132423 A1 | 6/2006 | Travis | |
| 2006/0139447 A1 | 6/2006 | Unkrich | |
| 2006/0158729 A1 | 7/2006 | Vissenberg et al. | |
| 2006/0215129 A1 | 9/2006 | Alasaarela et al. | |
| 2006/0267040 A1 | 11/2006 | Baek et al. | |
| 2006/0269213 A1 | 11/2006 | Hwang et al. | |
| 2006/0291053 A1 | 12/2006 | Robinson et al. | |
| 2006/0291243 A1 | 12/2006 | Niioka et al. | |
| 2007/0025680 A1 | 2/2007 | Winston et al. | |
| 2007/0115552 A1 | 5/2007 | Robinson et al. | |
| 2007/0188667 A1 | 8/2007 | Schwerdtner | |
| 2007/0223252 A1 | 9/2007 | Lee et al. | |
| 2008/0084519 A1 | 4/2008 | Brigham et al. | |
| 2008/0086289 A1 | 4/2008 | Brott | |
| 2008/0128728 A1 | 6/2008 | Nemchuk et al. | |
| 2008/0225205 A1 | 9/2008 | Travis | |
| 2008/0259012 A1 | 10/2008 | Fergason | |
| 2008/0291359 A1 | 11/2008 | Miyashita | |
| 2008/0297459 A1 | 12/2008 | Sugimoto et al. | |
| 2008/0304282 A1 | 12/2008 | Mi et al. | |
| 2008/0316768 A1 | 12/2008 | Travis | |
| 2009/0016057 A1 | 1/2009 | Rinko | |
| 2009/0067156 A1 | 3/2009 | Bonnett et al. | |
| 2009/0140656 A1 | 6/2009 | Kohashikawa et al. | |
| 2009/0160757 A1 | 6/2009 | Robinson | |
| 2009/0190072 A1 | 7/2009 | Nagata et al. | |
| 2009/0190079 A1 | 7/2009 | Saitoh | |
| 2009/0224271 A1 | 9/2009 | Seo et al. | |
| 2009/0225380 A1 | 9/2009 | Schwerdtner et al. | |
| 2009/0278936 A1 | 11/2009 | Pastoor et al. | |
| 2010/0053771 A1 | 3/2010 | Travis et al. | |
| 2010/0091254 A1 | 4/2010 | Travis et al. | |
| 2010/0096652 A1 | 4/2010 | Choi et al. | |
| 2010/0165598 A1 | 7/2010 | Chen et al. | |
| 2010/0177387 A1 | 7/2010 | Travis et al. | |

(56) References Cited

U.S. PATENT DOCUMENTS

| | | |
|---|---|---|
| 2010/0188438 A1 | 7/2010 | Kang |
| 2010/0188602 A1 | 7/2010 | Feng |
| 2010/0214135 A1 | 8/2010 | Bathiche |
| 2010/0220260 A1 | 9/2010 | Sugita et al. |
| 2010/0231498 A1 | 9/2010 | Large |
| 2010/0277575 A1 | 11/2010 | Ismael et al. |
| 2010/0278480 A1 | 11/2010 | Vasylyev |
| 2010/0295930 A1 | 11/2010 | Ezhov |
| 2010/0300608 A1 | 12/2010 | Emerton et al. |
| 2010/0302135 A1 | 12/2010 | Larson et al. |
| 2011/0012151 A1 | 1/2011 | Ono |
| 2011/0013417 A1 | 1/2011 | Saccomanno et al. |
| 2011/0032483 A1 | 2/2011 | Hruska et al. |
| 2011/0044056 A1 | 2/2011 | Travis |
| 2011/0044579 A1 | 2/2011 | Travis et al. |
| 2011/0051237 A1 | 3/2011 | Hasegawa et al. |
| 2011/0187293 A1 | 8/2011 | Travis |
| 2011/0188120 A1 | 8/2011 | Tabirian et al. |
| 2011/0216266 A1 | 9/2011 | Travis |
| 2011/0221998 A1 | 9/2011 | Adachi et al. |
| 2011/0242298 A1 | 10/2011 | Bathiche et al. |
| 2011/0255303 A1 | 10/2011 | Nichol et al. |
| 2011/0285927 A1 | 11/2011 | Schultz et al. |
| 2011/0310232 A1 | 12/2011 | Wilson et al. |
| 2012/0002136 A1 | 1/2012 | Nagata et al. |
| 2012/0013720 A1 | 1/2012 | Kadowaki et al. |
| 2012/0127573 A1 | 5/2012 | Robinson et al. |
| 2012/0243204 A1 | 9/2012 | Robinson |
| 2012/0275186 A1 | 11/2012 | Min |
| 2013/0101253 A1 | 4/2013 | Popovich et al. |
| 2013/0135588 A1 | 5/2013 | Popovich et al. |

FOREIGN PATENT DOCUMENTS

| | | |
|---|---|---|
| CN | 1454329 | 11/2003 |
| CN | 1466005 | 1/2004 |
| CN | 1696788 | 11/2005 |
| CN | 1823292 | 8/2006 |
| CN | 1826553 | 8/2006 |
| EP | 0860729 | 8/1998 |
| EP | 0939273 | 1/1999 |
| EP | 0656555 B1 | 3/2003 |
| EP | 1601019 A2 | 11/2005 |
| EP | 2003394 | 12/2008 |
| JP | 08-237691 | 9/1996 |
| JP | 08254617 | 10/1996 |
| JP | 08340556 | 12/1996 |
| JP | 2000-200049 | 7/2000 |
| JP | 2001-093321 | 4/2001 |
| JP | 2002049004 | 2/2002 |
| JP | 2003-215705 | 7/2003 |
| JP | 2004319364 | 11/2004 |
| JP | 2005135844 | 5/2005 |
| JP | 2005183030 | 7/2005 |
| JP | 2005-259361 | 9/2005 |
| JP | 2006004877 | 1/2006 |
| JP | 2006031941 | 2/2006 |
| JP | 3968742 B2 | 8/2007 |
| JP | 2007273288 A | 10/2007 |
| JP | 2008204874 | 9/2008 |
| JP | 2010160527 | 7/2010 |
| KR | 1020030064258 | 7/2003 |
| KR | 10-0932304 | 12/2009 |
| KR | 1020110006773 | 1/2011 |
| KR | 1020110017918 | 2/2011 |
| KR | 1020110067534 | 6/2011 |
| KR | 10-2012-004989 | 5/2012 |
| KR | 1020120048301 | 5/2012 |
| TW | 200528780 | 9/2005 |
| WO | 9527915 A1 | 10/1995 |
| WO | 2001-061241 | 8/2001 |
| WO | 2007111436 A1 | 10/2007 |

OTHER PUBLICATIONS

EP-14862283.0 European Extended Search Report of European Patent Office dated Jun. 29, 2017.
International search report and written opinion of international searching authority for co-pending PCT application No. PCT/US2013/041192 dated Aug. 28, 2013.
International search report and written opinion of international search authority for co-pending PCT application No. PCT/US2013/041619 dated Aug. 27, 2013.
International search report and written opinion of international searching authority for co-pending PCT application No. PCT/US2013/041655 dated Aug. 27, 2013.
International search report and written opinion of international searching authority for co-pending PCT application No. PCT/US2013/041703 dated Aug. 27, 2013.
International search report and written opinion of international searching authority for co-pending PCT application No. PCT/US2013/041548 dated Aug. 27, 2013.
International search report and written opinion of international searching authority for co-pending PCT application No. PCT/US2013/041683 dated Aug. 27, 2013.
International search report and written opinion of international searching authority for co-pending PCT application No. PCT/US2013/041228 dated Aug. 23, 2013.
International search report and written opinion of international searching authority for co-pending PCT application No. PCT/US2013/041235 dated Aug. 23, 2013.
International search report and written opinion of international searching authority for co-pending PCT application No. PCT/US2013/041697 dated Aug. 23, 2013.
Tabiryan et al., "The Promise of Diffractive Waveplates," Optics and Photonics News, vol. 21, Issue 3, pp. 40-45 (Mar. 2010).
International search report and written opinion of international searching authority for PCT application PCT/US2012/037677 dated Jun. 29, 2012.
International search report and written opinion of the international searching authority from PCT/US2012/052189 dated Jan. 29, 2013.
CN-201380026050.0 Chinese 1st Office Action of the State Intellectual Property Office of P.R. dated Jun. 3, 2016.
Kalantar, et al. "Backlight Unit With Double Surface Light Emission," J. Soc. Inf. Display, vol. 12, Issue 4, pp. 379-387 (Dec. 2004).
International search report and written opinion of international searching authority for PCT application PCT/US2013/077288 dated Apr. 18, 2014.
201380026076.5 Chinese first office action dated May 11, 2016.
International search report and written opinion of international searching authority for PCT application PCT/US2014/017779 dated May 28, 2014.
International search report and written opinion of international searching authority for PCT application PCT/US2013/063133 dated Jan. 20, 2014.
International search report and written opinion of international searching authority for PCT application PCT/US2013/063125 dated Jan. 20, 2014.

* cited by examiner

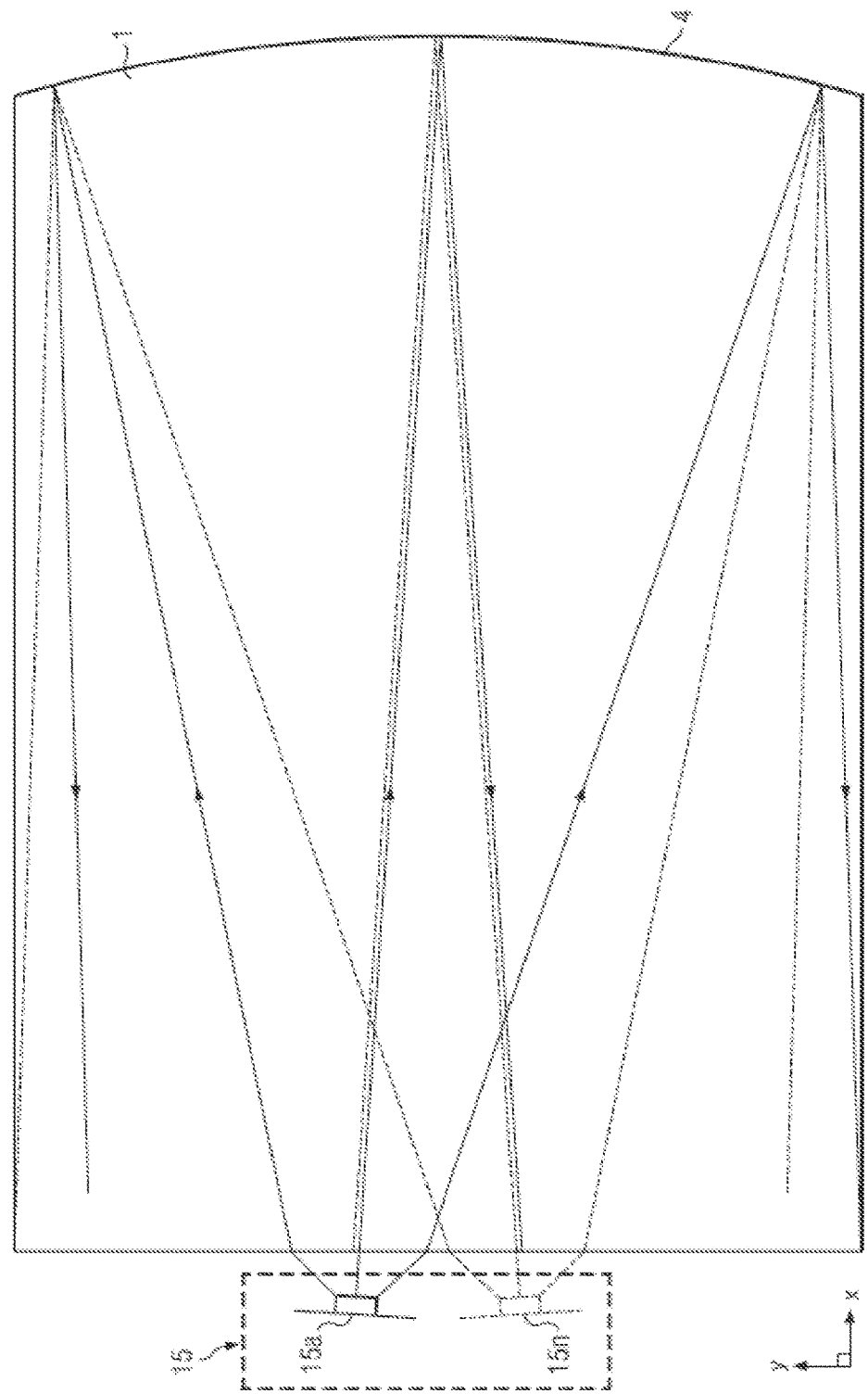

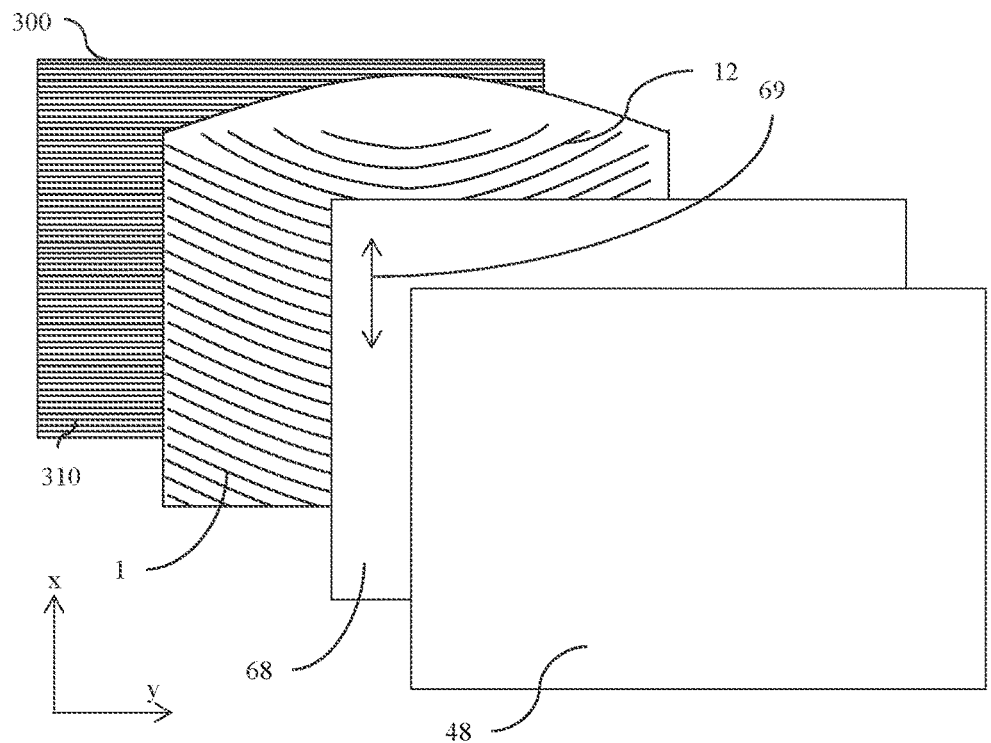
FIG. 12B
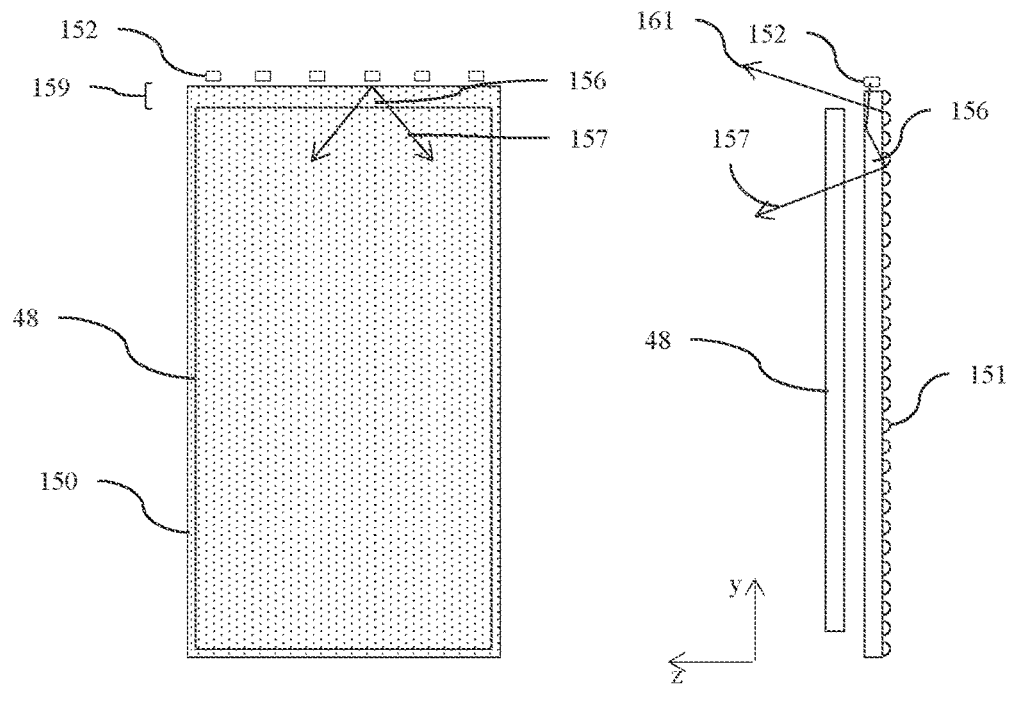
FIG. 13A
FIG. 13B

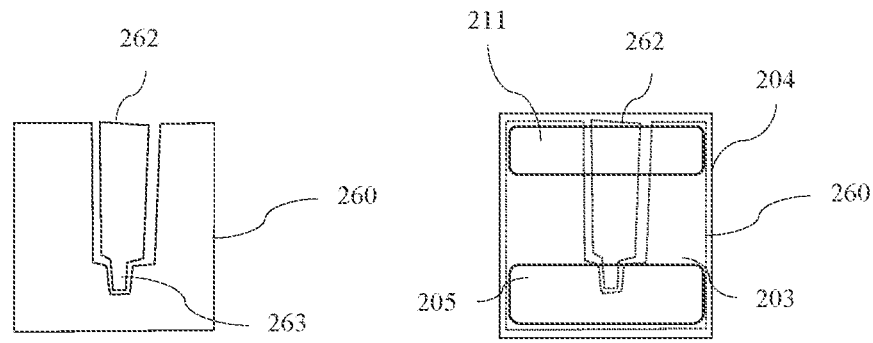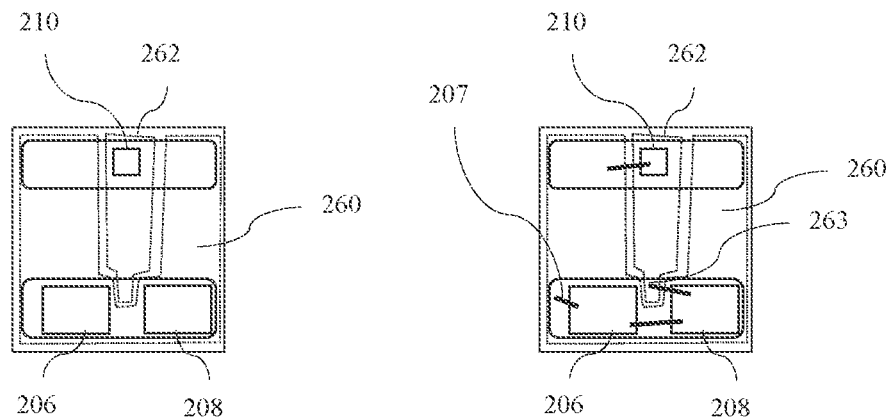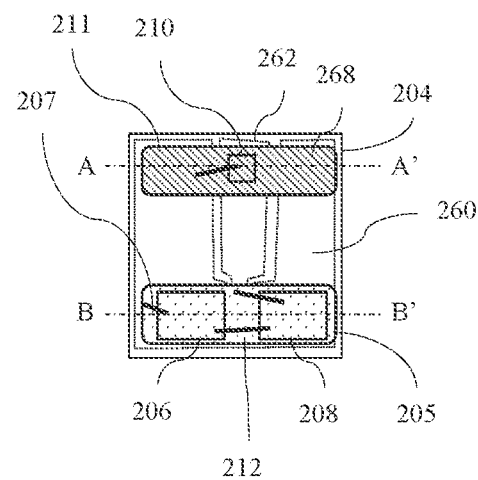
FIG. 27E

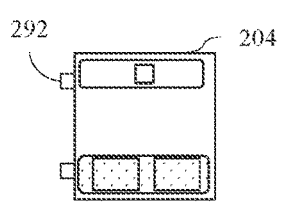 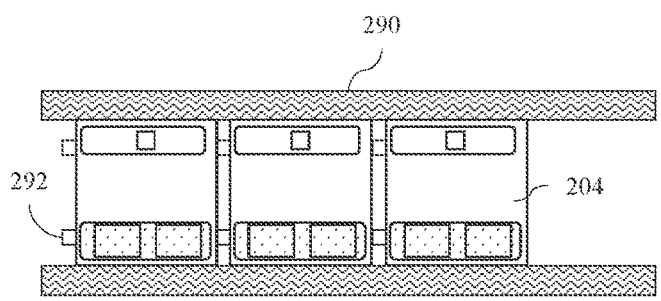
*FIG. 35A*    *FIG. 35B*
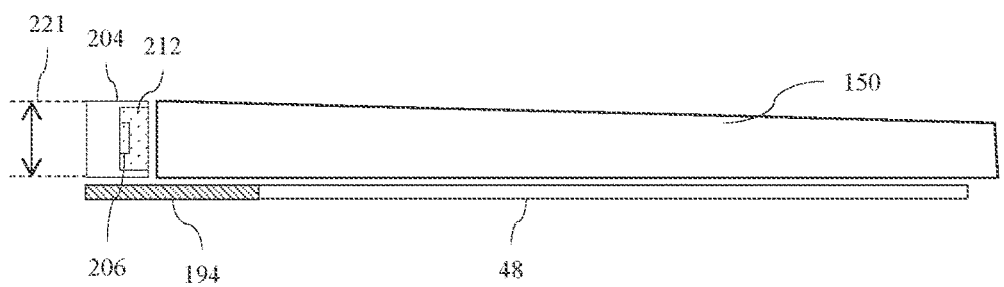
*FIG. 36*

DIRECTIONAL BACKLIGHTS WITH LIGHT EMITTING ELEMENT PACKAGES

CROSS-REFERENCE TO RELATED APPLICATIONS

This application is a divisional of U.S. patent application Ser. No. 14/538,411 filed Nov. 11, 2014, now U.S. Pat. No. 9,551,825.

TECHNICAL FIELD

This disclosure generally relates to illumination of light modulation devices, and more specifically relates to light emitting diode packages for use in light guides for providing large area illumination from localized light sources for use in 2D, 3D, and/or autostereoscopic display devices.

BACKGROUND

Spatially multiplexed autostereoscopic displays typically align a parallax component such as a lenticular screen or parallax barrier with an array of images arranged as at least first and second sets of pixels on a spatial light modulator, for example an LCD. The parallax component directs light from each of the sets of pixels into different respective directions to provide first and second viewing windows in front of the display. An observer with an eye placed in the first viewing window can see a first image with light from the first set of pixels; and with an eye placed in the second viewing window can see a second image, with light from the second set of pixels.

Such displays have reduced spatial resolution compared to the native resolution of the spatial light modulator and further, the structure of the viewing windows is determined by the pixel aperture shape and parallax component imaging function. Gaps between the pixels, for example for electrodes, typically produce non-uniform viewing windows. Undesirably such displays exhibit image flicker as an observer moves laterally with respect to the display and so limit the viewing freedom of the display. Such flicker can be reduced by defocusing the optical elements; however such defocusing results in increased levels of image cross talk and increases visual strain for an observer. Such flicker can be reduced by adjusting the shape of the pixel aperture, however such changes can reduce display brightness and can include addressing electronics in the spatial light modulator.

BRIEF SUMMARY

According to a first aspect of the present disclosure, there may be provided a light emitting diode package for a directional display apparatus comprising: a body of packaging material; at least one light generation element arranged to generate light in an emission band; and a protection diode; wherein the at least one light generation element is arranged in a first well in said body, and the protection diode is not arranged in the first well. The protection diode may be arranged in a second well in said body. The second well may contain a protective material covering the protection diode. The first well may have lateral extents in first and second directions that are orthogonal to each other, the lateral extent in the first direction being greater than the lateral extent in the second direction, and the second well being displaced from the first well in the second direction. The lateral extent of the first well in the second direction may be less than 150% of the lateral extent of the light generation element in the second direction.

The light emitting diode package may comprise at least two light generation elements arranged as an array in the first direction. The at least two light generation elements may have the same lateral extent and position in the second direction. The first well may contain a material covering the at least one light generation element, which material is a transparent material or a wavelength conversion material arranged to convert at least some of the light in the emission band generated by the light generation element into light in a conversion band. The material contained in the first well may be said wavelength conversion material, the emission band being blue light and the conversion band being yellow light. The material contained in the first well may be said wavelength conversion material and is a phosphor or a quantum dot material.

The light emitting diode package may further comprise: at least two conductive heat slugs, the at least one light generation element being located on a first one of the heat slugs, the protection diode being located on a second one of the heat slugs, and the first and second heat slugs extending underneath the first well; wire bonds connecting the at least one light generation element and the protection diode to the first and second heat slugs, the wire bonds that connect the at least one light generation element to the first and second heat slugs being located in the first well. The light generation element may be a semiconductor diode. The light emitting diode package may further comprise a pair of walls extending outwardly from the body on opposite sides of the well, the walls forming a slot for receiving an input end of a waveguide, the protection diode being displaced from the first well laterally of the slot.

Advantageously the luminous flux per unit length of the package when arranged in an array of packages can be increased in comparison to packages in which the protection diode is in the same well as the light emitting elements. Advantageously the luminance of a display backlight can be increased. Outdoors operation in high luminance environments can be achieved. The protection diode can be protected from damage during assembly and used. Heat sinking performance of the package can be maintained, achieving desirable efficiency and thermal management properties.

According to another aspect of the present disclosure, there may be provided a light emitting diode array for a directional display apparatus, comprising a first array of light emitting diode packages, each being a light emitting diode package according to the first aspect, being arrayed linearly. The ratio of the luminous emittance per unit length of the first array of light emitting diode packages to the lateral extent of the first wells orthogonal to the direction in which the light emitting diode packages are arrayed is greater than 15 lumens per $mm^2$. The light emitting diode array may further comprise a second array of light emitting diode packages, the first and second arrays of light emitting diodes having luminous emittances per unit length that are different from each other.

Advantageously a display may be provided with high luminance in on-axis viewing positions for efficient outdoors use and lower luminance in wide angle viewing while reducing cost of the array of light emitting elements in the arrays.

According to another aspect of the present disclosure, there may be provided a directional backlight for a directional display apparatus comprising: a light emitting diode array according to the second aspect; a waveguide comprising an input end arranged to receive input light from the light emitting diode array at respective input positions, first and second, opposed guide surfaces for guiding input light along the waveguide, and a reflective end for reflecting input light back through the waveguide, the second guide surface being arranged to deflect light after reflection from the reflective end as output light through the first guide surface, and the waveguide being arranged to direct the output light into optical windows in output directions that are distributed in a lateral direction in dependence on the input position of the input light. The first guide surface may be arranged to guide light by total internal reflection and the second guide surface may comprise a plurality of light extraction features oriented to direct light guided through the waveguide in directions allowing exit through the first guide surface as the output light and intermediate regions between the light extraction features that are arranged to guide light through the waveguide. The first guide surface may be arranged to guide light by total internal reflection and the second guide surface may be substantially planar and inclined at an angle to direct light in directions that break that total internal reflection for outputting light through the first guide surface, and the display device further comprises a deflection element extending across the first guide surface of the waveguide for deflecting light towards the normal to the first guide surface.

According to another aspect of the present disclosure, there may be provided a directional display apparatus comprising: a directional backlight according to the third aspect; and a transmissive spatial light modulator arranged to receive the output light from the first guide surface of the waveguide and to modulate it to display an image.

Advantageously a high luminance display can be achieved with high efficiency while providing controllable light output directionality and switching between high luminance, high efficiency and wide angle modes of operation.

According to another aspect of the present disclosure, there may be provided a method of forming an array of light emitting diode packages, the method using a linear holder comprising a slot capable of receiving a line of light emitting diode packages, the method comprising: disposing the light emitting diode packages in the slot of the holder; aligning the linear holder with an array substrate; providing solder and thermal connection between the array of light emitting diode packages and the array substrate; and removing the linear holder. The light emitting diode packages may have lugs arranged to provide a controlled spacing in the linear holder.

Advantageously the cost of manufacture of an array of LED packages can be reduced while achieving desirable alignment tolerances for packages in the array.

According to another aspect of the present disclosure, there may be provided a directional backlight for a directional display apparatus, comprising: an array of light sources; a waveguide comprising an input end arranged to receive input light from the light emitting diode array at respective input positions, and first and second, opposed guide surfaces for guiding input light along the waveguide, the second guide surface being arranged to deflect light as output light through the first guide surface, and the waveguide being arranged to direct the output light into optical windows in output directions that are distributed in a lateral direction in dependence on the input position of the input light; and an input end, front light shielding arrangement for shielding the light sources, comprising: an extraction film strip extending across the first guide surface adjacent the input end, the extraction film strip comprising an array of alternating first and second facets, the first facets being oriented to receive light that leaks from the first guide surface while being guided along the waveguide, and the second facets being arranged to deflect the received light towards the normal to the first guide surface; and a mask arranged outside the extraction film strip arranged to absorb the received light after deflection by the second facets.

The extraction film strip may be absorptive for absorbing at least part of the received light. The directional backlight may further comprise an input end, rear light shielding arrangement for shielding the light sources, comprising: an extraction film strip extending across the second guide surface adjacent the input end, the extraction film strip comprising an array of alternating first and second facets, the first facets being oriented to receive light that leaks from the second guide surface while being guided along the waveguide and the second facets being arranged to deflect the received light towards the normal to the first guide surface; and a mask arranged outside the extraction film strip arranged to absorb the received light after deflection by the second facets. The waveguide may further comprise a reflective end for reflecting input light back through the waveguide, the second guide surface being arranged to deflect light after reflection from the reflective end as said output light. The directional backlight may further comprise a reflective end, front light shielding arrangement for shielding the light sources, comprising: an extraction film strip extending across the first guide surface adjacent the reflective end, the extraction film strip comprising an array of alternating first and second facets, the first facets being oriented to receive light that leaks from the first guide surface while being guided along the waveguide, and the second facets being arranged to deflect the received light towards the normal to the first guide surface; and a mask arranged outside the extraction film strip arranged to absorb the received light after deflection by the second facets. The directional backlight may further comprise a reflective end, rear light shielding arrangement for shielding the light sources, comprising: an extraction film strip extending across the second guide surface adjacent the input end, the extraction film strip comprising an array of alternating first and second facets, the first facets being oriented to receive light that leaks from the second guide surface while being guided along the waveguide and the second facets being arranged to deflect the received light towards the normal to the first guide surface; and a mask arranged outside the extraction film strip arranged to absorb the received light after deflection by the second facets. The mask of the or each light shielding arrangement may be a layer formed on the outside surface of the extraction film strip. The first guide surface may be arranged to guide light by total internal reflection and the second guide surface may comprise a plurality of light extraction features oriented to direct light guided through the waveguide in directions allowing exit through the first guide surface as the output light and intermediate regions between the light extraction features that are arranged to guide light through the waveguide. The first guide surface may be arranged to guide light by total internal reflection and the second guide surface may be substantially planar and inclined at an angle to direct light in directions that break that total internal reflection for outputting light through the first guide surface, and the display device may further comprise a deflection element extending across the first guide surface of the waveguide for deflecting light towards the normal to the first guide surface.

Advantageously the visibility of the array of light emitting elements due to imperfections in alignment and in the manufacture of the waveguide may be reduced in regions close to the light emitting elements. Stray light may be captured efficiently and not redirected into the waveguide. The stray light collection mechanism may not substantially contact the surface of the waveguide, thus minimizing light loss from the waveguide.

According to another aspect of the present disclosure, there may be provided a directional display apparatus comprising: a directional backlight according to the sixth aspect; and a transmissive spatial light modulator arranged to receive the output light from the first guide surface of the waveguide and to modulate it to display an image. The mask of the input end, front light shielding arrangement may be a portion of the spatial light modulator.

Advantageously contrast ratio of greater than 10:1 can be achieved in a display for outdoors use, for example in environments with illuminance of 10,000 lux or greater. Display white state luminance in comparison with the ambient luminance of illuminated background may be provided to achieve display usability in high ambient illuminance environments. In operation, the power consumption of light emitting diodes in a directional display device can be the same or less than for a conventional wide angle backlight. The direction of output illumination can be controlled. The size of display to achieve said contrast performance can be substantially greater than that which can be achieved using known LED package arrangements. The package may be provided with desirable protection levels from electro static discharge. The wire bonds to the diodes within the package can be provided in wells and covered with encapsulation to protect them during operation and handling. Further the separation of the LED packages can be reduced so that flicker for a moving observer can be reduced in such directional displays that incorporate head tracking, as there may be more optical windows within the viewing window, achieving finer control of viewing window structure according to viewer position.

Advantageously high contrast may be achieved for outdoors use for viewing positions close to on-axis viewing, while achieving reduced cost of the LED packages used for off axis viewing. Thus the device cost can be reduced and the number of LEDs in the array reduced, reducing complexity and mean time between failure of the array.

Advantageously the cost can be reduced and accuracy of alignment increased for alignment of thin waveguides with respect to the LED packages. Further stray light in the region near to the LED packages can be reduced.

Advantageously a large number of LED packages can be arranged with small gaps between the packages, increasing the illuminance levels at which desirable contrast ratio can be achieved in a directional display. Further a single alignment and attachment step can be used for the whole array attachment to the base substrate, reducing cost and complexity while maintaining the higher array yield that can be enabled by using individual LED packages in the array.

Advantageously the cost of the light source is reduced, and tracking technologies are not required, further reducing cost and increasing device lifetime. Further high gain optical output can be achieved with high optical efficiency.

Display backlights in general employ waveguides and edge emitting sources. Certain imaging directional backlights have the additional capability of directing the illumination through a display panel into viewing windows. An imaging system may be formed between multiple sources and the respective window images. One example of an imaging directional backlight is an optical valve that may employ a folded optical system and hence may also be an example of a folded imaging directional backlight. Light may propagate substantially without loss in one direction through the optical valve while counter-propagating light may be extracted by reflection off tilted facets as described in patent application Ser. No. 13/300,293, which is herein incorporated by reference, in its entirety.

Embodiments herein may provide an autostereoscopic display with large area and thin structure. Further, as will be described, the waveguides of the present disclosure may achieve thin optical components with large back working distances. Such components can be used in directional backlights, to provide directional displays including autostereoscopic displays. Further, embodiments may provide a controlled illuminator for the purposes of an efficient autostereoscopic display, and efficient 2D display, a high brightness 2D display or 2D displays achieving a privacy function.

Embodiments of the present disclosure may be used in a variety of optical systems. The embodiment may include or work with a variety of projectors, projection systems, optical components, displays, microdisplays, computer systems, processors, self-contained projector systems, visual and/or audiovisual systems and electrical and/or optical devices. Aspects of the present disclosure may be used with practically any apparatus related to optical and electrical devices, optical systems, presentation systems or any apparatus that may contain any type of optical system. Accordingly, embodiments of the present disclosure may be employed in optical systems, devices used in visual and/or optical presentations, visual peripherals and so on and in a number of computing environments.

Before proceeding to the disclosed embodiments in detail, it should be understood that the disclosure is not limited in its application or creation to the details of the particular arrangements shown, because the disclosure is capable of other embodiments. Moreover, aspects of the disclosure may be set forth in different combinations and arrangements to define embodiments unique in their own right. Also, the terminology used herein is for the purpose of description and not of limitation.

Directional backlights offer control over the illumination emanating from substantially the entire output surface controlled typically through modulation of independent LED light sources arranged at the input aperture side of an optical waveguide. Controlling the emitted light directional distribution can achieve single person viewing for a security or privacy function, where the display can be seen by a single viewer from a limited range of angles; high electrical efficiency, where illumination may be provided over a small angular directional distribution; alternating left and right eye viewing for time sequential stereoscopic and autostereoscopic display; and low cost.

These and other advantages and features of the present disclosure will become apparent to those of ordinary skill in the art upon reading this disclosure in its entirety.

BRIEF DESCRIPTION OF THE DRAWINGS

Embodiments are illustrated by way of example in the accompanying FIGURES, in which like reference numbers indicate similar parts, and in which:

FIG. 1A is a schematic diagram illustrating a front view of light propagation in one embodiment of a directional display device, in accordance with the present disclosure;

FIG. 12B is a schematic diagram illustrating a front view of a directional display device with a waveguide with curved light extraction features and a rear reflector with an array of linear reflective facets, in accordance with the present disclosure;

FIGS. 13A-13B are schematic diagrams illustrating front and side views of a conventional backlight apparatus comprising a diffusing light guiding plate, in accordance with the present disclosure;

FIGS. 27A-27E are schematic diagrams illustrating front views of LED package assembly steps for the package of FIG. 25A, in accordance with the present disclosure;

FIGS. 35A-35B are schematic diagrams illustrating front views of some of the assembly steps for an LED package array, in accordance with the present disclosure;

FIG. 36 is a schematic diagram illustrating a side view of a conventional waveguide and aligned LED, in accordance with the present disclosure;

DETAILED DESCRIPTION

Figure 1B:
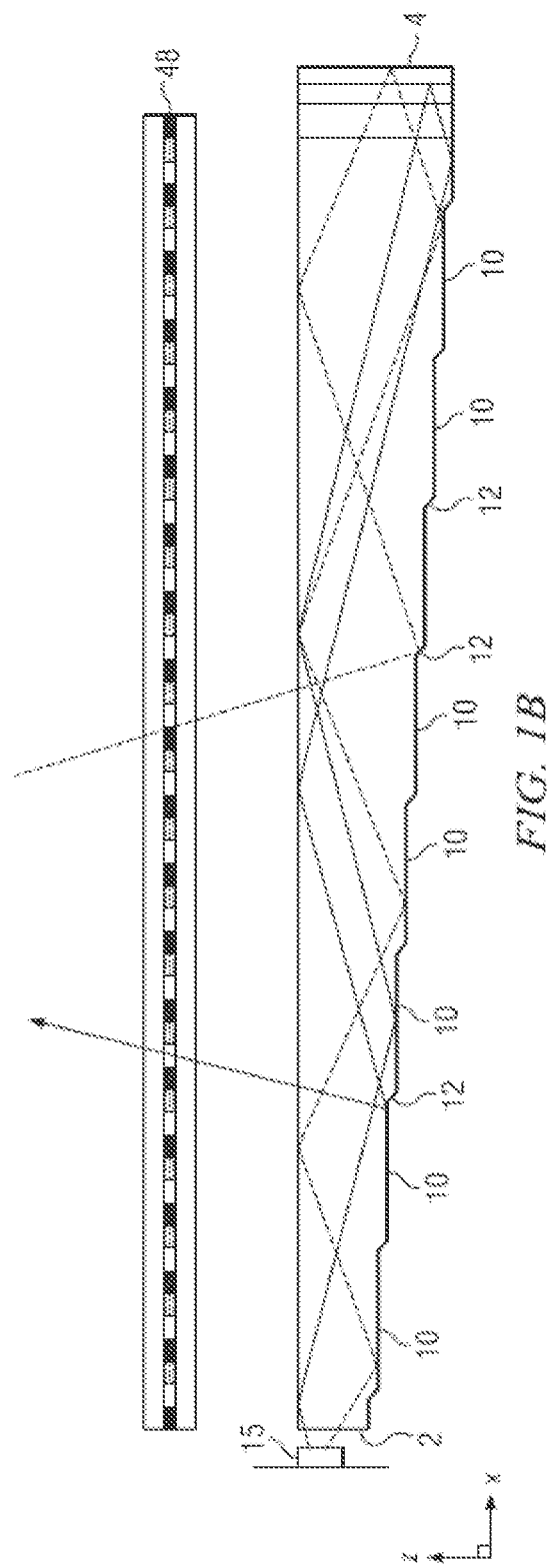
FIG. 1B is a schematic diagram illustrating a side view of light propagation in one embodiment of the directional display device of FIG. 1A, in accordance with the present disclosure.

Time multiplexed autostereoscopic displays can advantageously improve the spatial resolution of autostereoscopic display by directing light from all of the pixels of a spatial light modulator to a first viewing window in a first time slot, and all of the pixels to a second viewing window in a second time slot. Thus an observer with eyes arranged to receive light in first and second viewing windows will see a full resolution image across the whole of the display over multiple time slots. Time multiplexed displays can advantageously achieve directional illumination by directing an illuminator array through a substantially transparent time multiplexed spatial light modulator using directional optical elements, wherein the directional optical elements substantially form an image of the illuminator array in the window plane.

The uniformity of the viewing windows may be advantageously independent of the arrangement of pixels in the spatial light modulator. Advantageously, such displays can provide observer tracking displays which have low flicker, with low levels of cross talk for a moving observer.

To achieve high uniformity in the window plane, it is desirable to provide an array of illumination elements that have a high spatial uniformity. The illuminator elements of the time sequential illumination system may be provided, for example, by pixels of a spatial light modulator with size approximately 100 micrometers in combination with a lens array. However, such pixels suffer from similar difficulties as for spatially multiplexed displays. Further, such devices may have low efficiency and higher cost, requiring additional display components.

High window plane uniformity can be conveniently achieved with macroscopic illuminators, for example, an array of LEDs in combination with homogenizing and diffusing optical elements that are typically of size 1 mm or greater. However, the increased size of the illuminator elements means that the size of the directional optical elements increases proportionately. For example, a 16 mm wide illuminator imaged to a 65 mm wide viewing window may utilize a 200 mm back working distance. Thus, the increased thickness of the optical elements can prevent useful application, for example, to mobile displays, or large area displays.

Addressing the aforementioned shortcomings, optical valves as described in commonly-owned U.S. patent application Ser. No. 13/300,293 advantageously can be arranged in combination with fast switching transmissive spatial light modulators to achieve time multiplexed autostereoscopic illumination in a thin package while providing high resolution images with flicker free observer tracking and low levels of cross talk. Described is a one dimensional array of viewing positions, or windows, that can display different images in a first, typically horizontal, direction, but contain the same images when moving in a second, typically vertical, direction.

Conventional non-imaging display backlights commonly employ optical waveguides and have edge illumination from light sources such as LEDs. However, it should be appreciated that there are many fundamental differences in the function, design, structure, and operation between such conventional non-imaging display backlights and the imaging directional backlights discussed in the present disclosure.

Generally, for example, in accordance with the present disclosure, imaging directional backlights are arranged to direct the illumination from multiple light sources through a display panel to respective multiple viewing windows in at least one axis. Each viewing window is substantially formed as an image in at least one axis of a light source by the imaging system of the imaging directional backlight. An imaging system may be formed between multiple light sources and the respective window images. In this manner, the light from each of the multiple light sources is substantially not visible for an observer's eye outside of the respective viewing window.

In contradistinction, conventional non-imaging backlights or light guiding plates (LGPs) are used for illumination of 2D displays. See, e.g., Kalil Kalantar et al., *Backlight Unit With Double Surface Light Emission*, J. Soc. Inf. Display, Vol. 12, Issue 4, pp. 379-387 (December 2004). Non-imaging backlights are typically arranged to direct the illumination from multiple light sources through a display panel into a substantially common viewing zone for each of the multiple light sources to achieve wide viewing angle and high display uniformity. Thus non-imaging backlights do not form viewing windows. In this manner, the light from each of the multiple light sources may be visible for an observer's eye at substantially all positions across the viewing zone. Such conventional non-imaging backlights may have some directionality, for example, to increase screen gain compared to Lambertian illumination, which may be provided by brightness enhancement films such as BEF™ from 3M. However, such directionality may be substantially the same for each of the respective light sources. Thus, for these reasons and others that should be apparent to persons of ordinary skill, conventional non-imaging backlights are different to imaging directional backlights. Edge lit non-imaging backlight illumination structures may be used in liquid crystal display systems such as those seen in 2D Laptops, Monitors and TVs. Light propagates from the edge of a lossy waveguide which may include sparse features; typically local indentations in the surface of the guide which cause light to be lost regardless of the propagation direction of the light.

As used herein, an optical valve is an optical structure that may be a type of light guiding structure or device referred to as, for example, a light valve, an optical valve directional backlight, and a valve directional backlight ("v-DBL"). In the present disclosure, optical valve is different to a spatial light modulator (even though spatial light modulators may be sometimes generally referred to as a "light valve" in the art). One example of an imaging directional backlight is an optical valve that may employ a folded optical system. Light may propagate substantially without loss in one direction through the optical valve, may be incident on an imaging reflector, and may counter-propagate such that the light may be extracted by reflection off tilted light extraction features, and directed to viewing windows as described in patent application Ser. No. 13/300,293, which is herein incorporated by reference in its entirety.

As used herein, examples of an imaging directional backlight include a stepped waveguide imaging directional backlight, a folded imaging directional backlight, a wedge type directional backlight, or an optical valve.

Additionally, as used herein, a stepped waveguide imaging directional backlight may be an optical valve. A stepped waveguide is a waveguide for an imaging directional backlight including a waveguide for guiding light, further including a first light guiding surface; and a second light guiding surface, opposite the first light guiding surface, further including a plurality of light guiding features interspersed with a plurality of extraction features arranged as steps.

Moreover, as used, a folded imaging directional backlight may be at least one of a wedge type directional backlight, or an optical valve.

In operation, light may propagate within an exemplary optical valve in a first direction from an input side to a reflective side and may be transmitted substantially without loss. Light may be reflected at the reflective side and propagates in a second direction substantially opposite the first direction. As the light propagates in the second direction, the light may be incident on light extraction features, which are operable to redirect the light outside the optical valve. Stated differently, the optical valve generally allows light to propagate in the first direction and may allow light to be extracted while propagating in the second direction.

The optical valve may achieve time sequential directional illumination of large display areas. Additionally, optical elements may be employed that are thinner than the back working distance of the optical elements to direct light from macroscopic illuminators to a window plane. Such displays may use an array of light extraction features arranged to extract light counter propagating in a substantially parallel waveguide.

Thin imaging directional backlight implementations for use with LCDs have been proposed and demonstrated by 3M, for example U.S. Pat. No. 7,528,893; by Microsoft, for example U.S. Pat. No. 7,970,246 which may be referred to herein as a "wedge type directional backlight;" by RealD, for example U.S. patent application Ser. No. 13/300,293 which may be referred to herein as an "optical valve" or "optical valve directional backlight," all of which are herein incorporated by reference in their entirety.

The present disclosure provides stepped waveguide imaging directional backlights in which light may reflect back and forth between the internal faces of, for example, a stepped waveguide which may include a first side and a first set of features. As the light travels along the length of the stepped waveguide, the light may not substantially change angle of incidence with respect to the first side and first set of surfaces and so may not reach the critical angle of the medium at these internal faces. Light extraction may be advantageously achieved by a second set of surfaces (the step "risers") that are inclined to the first set of surfaces (the step "treads"). Note that the second set of surfaces may not be part of the light guiding operation of the stepped waveguide, but may be arranged to provide light extraction from the structure. By contrast, a wedge type imaging directional backlight may allow light to guide within a wedge profiled waveguide having continuous internal surfaces. The optical valve is thus not a wedge type imaging directional backlight.

FIG. 1A is a schematic diagram illustrating a front view of light propagation in one embodiment of a directional display device, and FIG. 1B is a schematic diagram illustrating a side view of light propagation in the directional display device of FIG. 1A.

FIG. 1A illustrates a front view in the xy plane of a directional backlight of a directional display device, and includes an illuminator array 15 which may be used to illuminate a stepped waveguide 1. Illuminator array 15 includes illuminator elements 15*a* through illuminator element 15*n* (where n is an integer greater than one). In one example, the stepped waveguide 1 of FIG. 1A may be a stepped, display sized waveguide 1. Illumination elements 15*a* through 15*n* are light sources that may be light emitting diodes (LEDs). Although LEDs are discussed herein as illuminator elements 15*a*-15*n*, other light sources may be used such as, but not limited to, diode sources, semiconductor sources, laser sources, local field emission sources, organic emitter arrays, and so forth. Additionally, FIG. 1B illustrates a side view in the xz plane, and includes illuminator array 15, SLM (spatial light modulator) 48, extraction features 12, guiding features 10, and stepped waveguide 1, arranged as shown. The side view provided in FIG. 1B is an alternative view of the front view shown in FIG. 1A. Accordingly, the illuminator array 15 of FIGS. 1A and 1B corresponds to one another and the stepped waveguide 1 of FIGS. 1A and 1B may correspond to one another.

Further, in FIG. 1B, the stepped waveguide 1 may have an input end 2 that is thin and a reflective end 4 that is thick. Thus the waveguide 1 extends between the input end 2 that receives input light and the reflective end 4 that reflects the input light back through the waveguide 1. The length of the input end 2 in a lateral direction across the waveguide is greater than the height of the input end 2. The illuminator elements 15a-15n are disposed at different input positions in a lateral direction across the input end 2.

The waveguide 1 has first and second, opposed guide surfaces extending between the input end 2 and the reflective end 4 for guiding light forwards and back along the waveguide 1 by total internal reflection. The first guide surface is planar. The second guide surface has a plurality of light extraction features 12 facing the reflective end 4 and inclined to reflect at least some of the light guided back through the waveguide 1 from the reflective end in directions that break the total internal reflection at the first guide surface and allow output through the first guide surface, for example, upwards in FIG. 1B, that is supplied to the SLM 48.

In this example, the light extraction features 12 are reflective facets, although other reflective features may be used. The light extraction features 12 do not guide light through the waveguide, whereas the intermediate regions of the second guide surface intermediate the light extraction features 12 guide light without extracting it. Those regions of the second guide surface are planar and may extend parallel to the first guide surface, or at a relatively low inclination. The light extraction features 12 extend laterally to those regions so that the second guide surface has a stepped shape including of the light extraction features 12 and intermediate regions. The light extraction features 12 are oriented to reflect light from the light sources, after reflection from the reflective end 4, through the first guide surface.

The light extraction features 12 are arranged to direct input light from different input positions in the lateral direction across the input end in different directions relative to the first guide surface that are dependent on the input position. As the illumination elements 15a-15n are arranged at different input positions, the light from respective illumination elements 15a-15n is reflected in those different directions. In this manner, each of the illumination elements 15a-15n directs light into a respective optical window in output directions distributed in the lateral direction in dependence on the input positions. The lateral direction across the input end 2 in which the input positions are distributed corresponds with regard to the output light to a lateral direction to the normal to the first guide surface. The lateral directions as defined at the input end 2 and with regard to the output light remain parallel in this embodiment where the deflections at the reflective end 4 and the first guide surface are generally orthogonal to the lateral direction. Under the control of a control system, the illuminator elements 15a-15n may be selectively operated to direct light into a selectable optical window. The optical windows may be used individually or in groups as viewing windows.

The reflective end 4 may have positive optical power in the lateral direction across the waveguide. In embodiments in which typically the reflective end 4 has positive optical power, the optical axis may be defined with reference to the shape of the reflective end 4, for example being a line that passes through the centre of curvature of the reflective end 4 and coincides with the axis of reflective symmetry of the end 4 about the x-axis. In the case that the reflecting surface 4 is flat, the optical axis may be similarly defined with respect to other components having optical power, for example the light extraction features 12 if they are curved, or the Fresnel lens 62 described below. The optical axis 238 is typically coincident with the mechanical axis of the waveguide 1.

The SLM 48 extends across the waveguide is transmissive and modulates the light passing therethrough. Although the SLM 48 may be a liquid crystal display (LCD) but this is merely by way of example, and other spatial light modulators or displays may be used including LCOS, DLP devices, and so forth, as this illuminator may work in reflection. In this example, the SLM 48 is disposed across the first guide surface of the waveguide and modulates the light output through the first guide surface after reflection from the light extraction features 12.

The operation of a directional display device that may provide a one dimensional array of viewing windows is illustrated in front view in FIG. 1A, with its side profile shown in FIG. 1B. In operation, in FIGS. 1A and 1B, light may be emitted from an illuminator array 15, such as an array of illuminator elements 15a through 15n, located at different positions, y, along the surface of thin end side 2, x=0, of the stepped waveguide 1. The light may propagate along +x in a first direction, within the stepped waveguide 1, while at the same time, the light may fan out in the xy plane and upon reaching the far curved end side 4, may substantially or entirely fill the curved end side 4. While propagating, the light may spread out to a set of angles in the xz plane up to, but not exceeding the critical angle of the guide material. The extraction features 12 that link the guiding features 10 of the bottom side of the stepped waveguide 1 may have a tilt angle greater than the critical angle and hence may be missed by substantially all light propagating along +x in the first direction, ensuring the substantially lossless forward propagation.

Continuing the discussion of FIGS. 1A and 1B, the curved end side 4 of the stepped waveguide 1 may be made reflective, typically by being coated with a reflective material such as, for example, silver, although other reflective techniques may be employed. Light may therefore be redirected in a second direction, back down the guide in the direction of −x and may be substantially collimated in the xy or display plane. The angular spread may be substantially preserved in the xz plane about the principal propagation direction, which may allow light to hit the riser edges and reflect out of the guide. In an embodiment with approximately 45 degree tilted extraction features 12, light may be effectively directed approximately normal to the xy display plane with the xz angular spread substantially maintained relative to the propagation direction. This angular spread may be increased when light exits the stepped waveguide 1 through refraction, but may be decreased somewhat dependent on the reflective properties of the extraction features 12.

In some embodiments with uncoated extraction features 12, reflection may be reduced when total internal reflection (TIR) fails, squeezing the xz angular profile and shifting off normal. However, in other embodiments having silver coated or metallized extraction features, the increased angular spread and central normal direction may be preserved. Continuing the description of the embodiment with silver coated extraction features, in the xz plane, light may exit the stepped waveguide 1 approximately collimated and may be directed off normal in proportion to the y-position of the respective illuminator element 15a-15n in illuminator array 15 from the input edge center. Having independent illuminator elements 15a-15n along the input edge 2 then enables light to exit from the entire first light directing side 6 and propagate at different external angles, as illustrated in FIG. 1A.

Figure 2A:
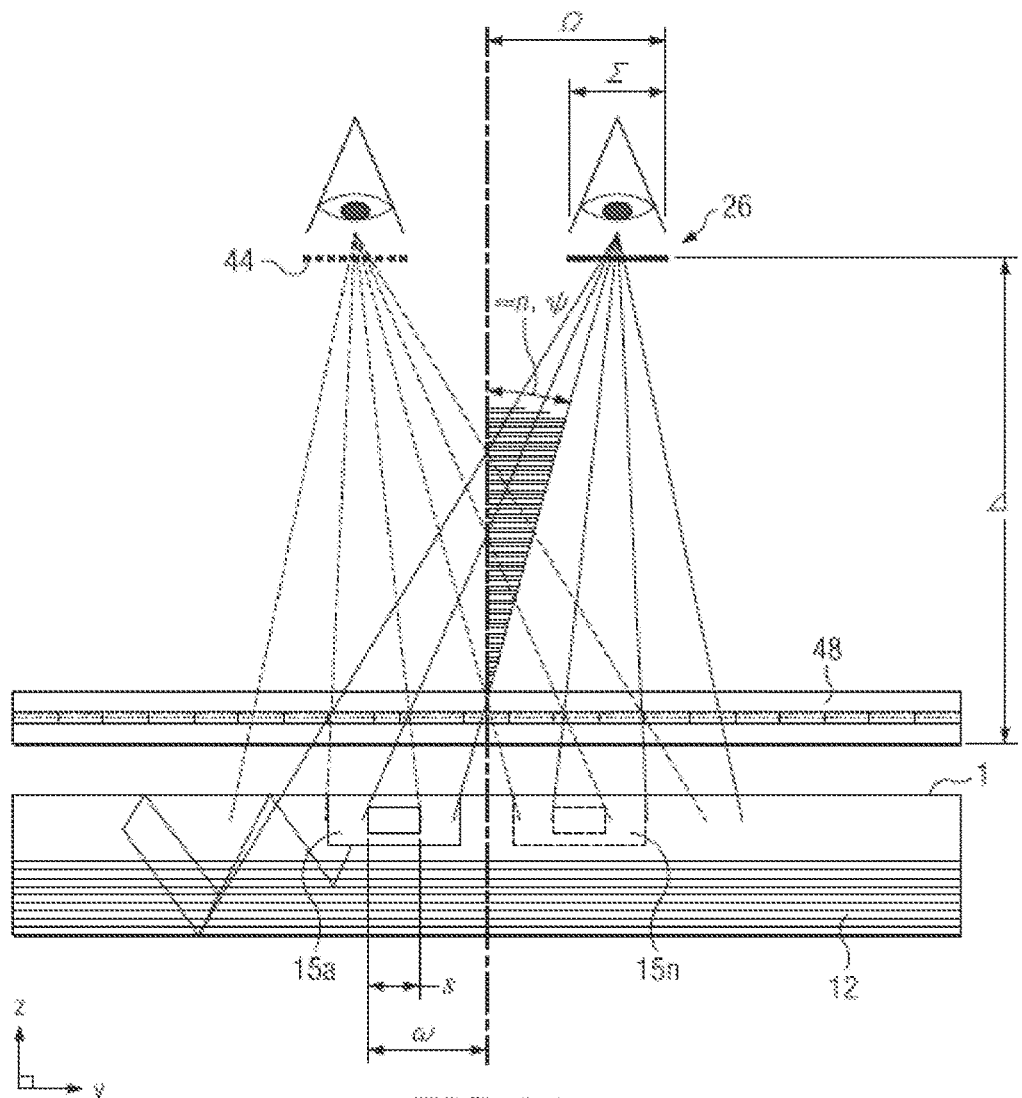
FIG. 2A is a schematic diagram illustrating in a top view of light propagation in another embodiment of a directional display device, in accordance with the present disclosure.
Figure 2B:
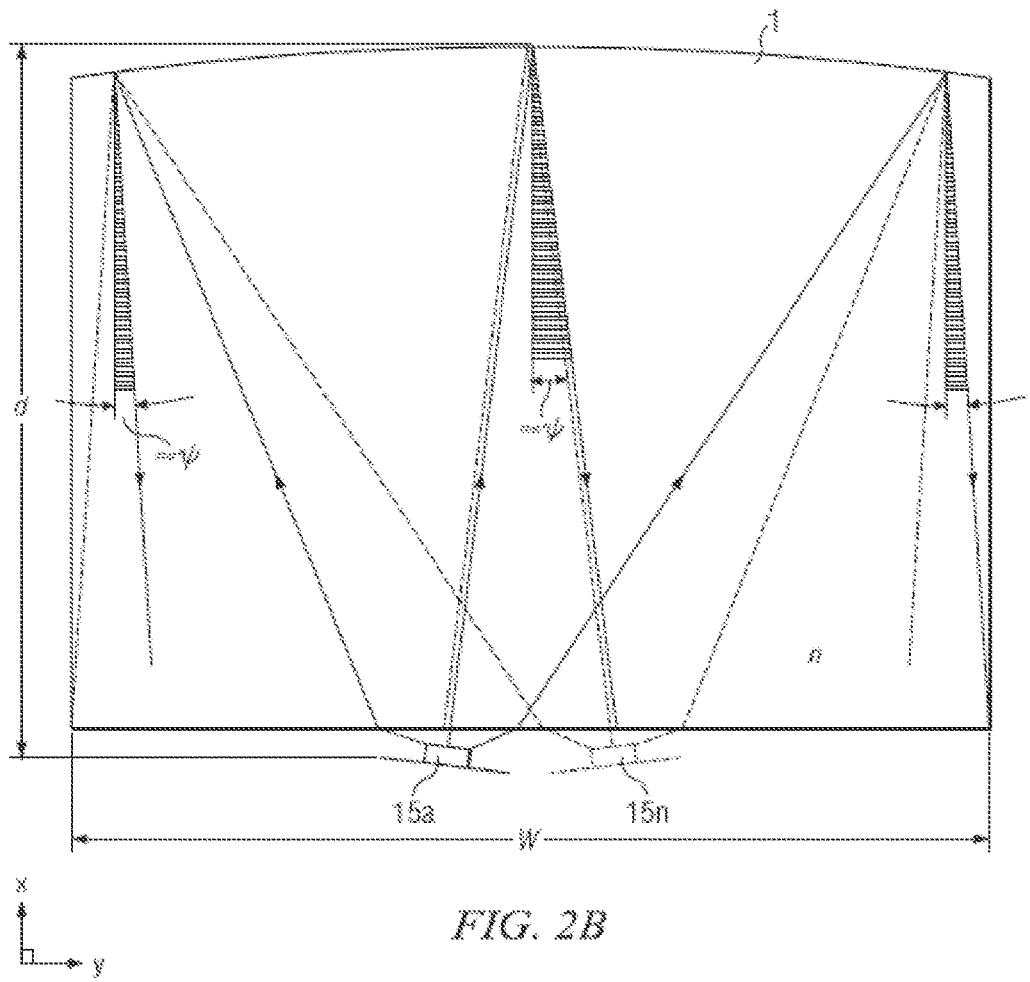
FIG. 2B is a schematic diagram illustrating light propagation in a front view of the directional display device of FIG. 2A, in accordance with the present disclosure.
Figure 2C:
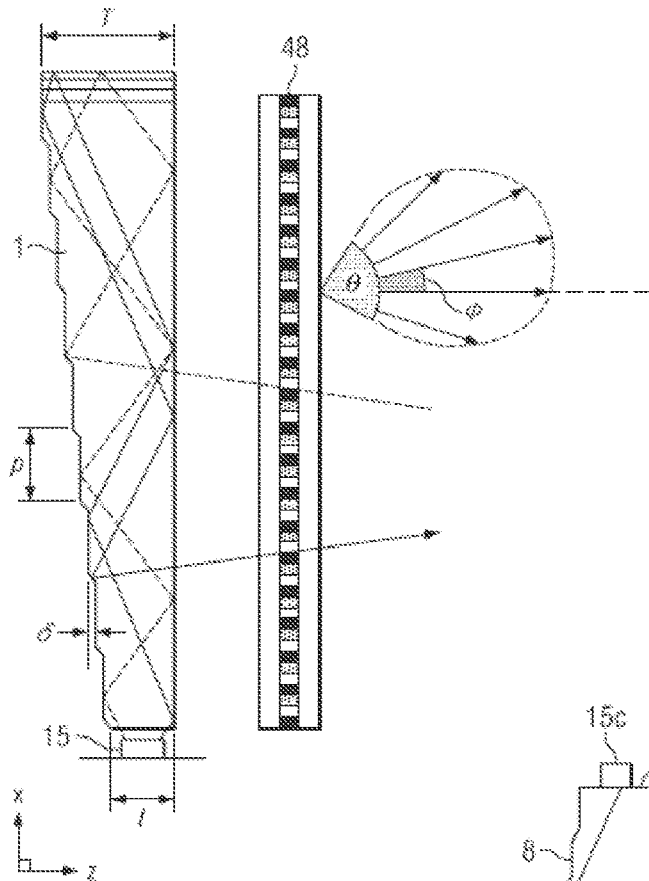
FIG. 2C is a schematic diagram illustrating light propagation in a side view of the directional display device of FIG. 2A, in accordance with the present disclosure.

Illuminating a spatial light modulator (SLM) 48 such as a fast liquid crystal display (LCD) panel with such a device may achieve autostereoscopic 3D as shown in top view or yz-plane viewed from the illuminator array 15 end in FIG. 2A, front view in FIG. 2B and side view in FIG. 2C. FIG. 2A is a schematic diagram illustrating in a top view, propagation of light in a directional display device, FIG. 2B is a schematic diagram illustrating in a front view, propagation of light in a directional display device, and FIG. 2C is a schematic diagram illustrating in side view propagation of light in a directional display device. As illustrated in FIGS. 2A, 2B, and 2C, a stepped waveguide 1 may be located behind a fast (e.g., greater than 100 Hz) LCD panel SLM 48 that displays sequential right and left eye images. In synchronization, specific illuminator elements 15a through 15n of illuminator array 15 (where n is an integer greater than one) may be selectively turned on and off, providing illuminating light that enters right and left eyes substantially independently by virtue of the system's directionality. In the simplest case, sets of illuminator elements of illuminator array 15 are turned on together, providing a one dimensional viewing window 26 or an optical pupil with limited width in the horizontal direction, but extended in the vertical direction, in which both eyes horizontally separated may view a left eye image, and another viewing window 44 in which a right eye image may primarily be viewed by both eyes, and a central position in which both the eyes may view different images. In this way, 3D may be viewed when the head of a viewer is approximately centrally aligned. Movement to the side away from the central position may result in the scene collapsing onto a 2D image.

The reflective end 4 may have positive optical power in the lateral direction across the waveguide. In embodiments in which typically the reflective end 4 has positive optical power, the optical axis may be defined with reference to the shape of the reflective end 4, for example being a line that passes through the centre of curvature of the reflective end 4 and coincides with the axis of reflective symmetry of the end 4 about the x-axis. In the case that the reflecting surface 4 is flat, the optical axis may be similarly defined with respect to other components having optical power, for example the light extraction features 12 if they are curved, or the Fresnel lens 62 described below. The optical axis 238 is typically coincident with the mechanical axis of the waveguide 1. The cylindrical reflecting surface at end 4 may typically be a spherical profile to optimize performance for on-axis and off-axis viewing positions. Other profiles may be used.

Figure 3:
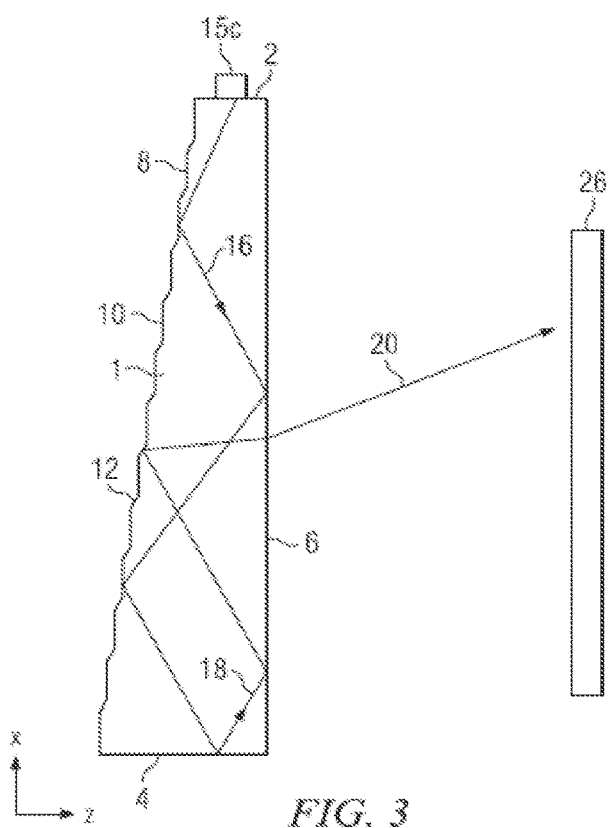
FIG. 3 is a schematic diagram illustrating in a side view of a directional display device, in accordance with the present disclosure.

FIG. 3 is a schematic diagram illustrating in side view a directional display device. Further, FIG. 3 illustrates additional detail of a side view of the operation of a stepped waveguide 1, which may be a transparent material. The stepped waveguide 1 may include an illuminator input side 2, a reflective side 4, a first light directing side 6 which may be substantially planar, and a second light directing side 8 which includes guiding features 10 and light extraction features 12. In operation, light rays 16 from an illuminator element 15c of an illuminator array 15 (not shown in FIG. 3), that may be an addressable array of LEDs for example, may be guided in the stepped waveguide 1 by means of total internal reflection by the first light directing side 6 and total internal reflection by the guiding feature 10, to the reflective side 4, which may be a mirrored surface. Although reflective side 4 may be a mirrored surface and may reflect light, it may in some embodiments also be possible for light to pass through reflective side 4.

Continuing the discussion of FIG. 3, light ray 18 reflected by the reflective side 4 may be further guided in the stepped waveguide 1 by total internal reflection at the reflective side 4 and may be reflected by extraction features 12. Light rays 18 that are incident on extraction features 12 may be substantially deflected away from guiding modes of the stepped waveguide 1 and may be directed, as shown by ray 20, through the side 6 to an optical pupil that may form a viewing window 26 of an autostereoscopic display. The width of the viewing window 26 may be determined by at least the size of the illuminator, output design distance and optical power in the side 4 and extraction features 12. The height of the viewing window may be primarily determined by the reflection cone angle of the extraction features 12 and the illumination cone angle input at the input side 2. Thus each viewing window 26 represents a range of separate output directions with respect to the surface normal direction of the spatial light modulator 48 that intersect with a plane at the nominal viewing distance.

Figure 4A:
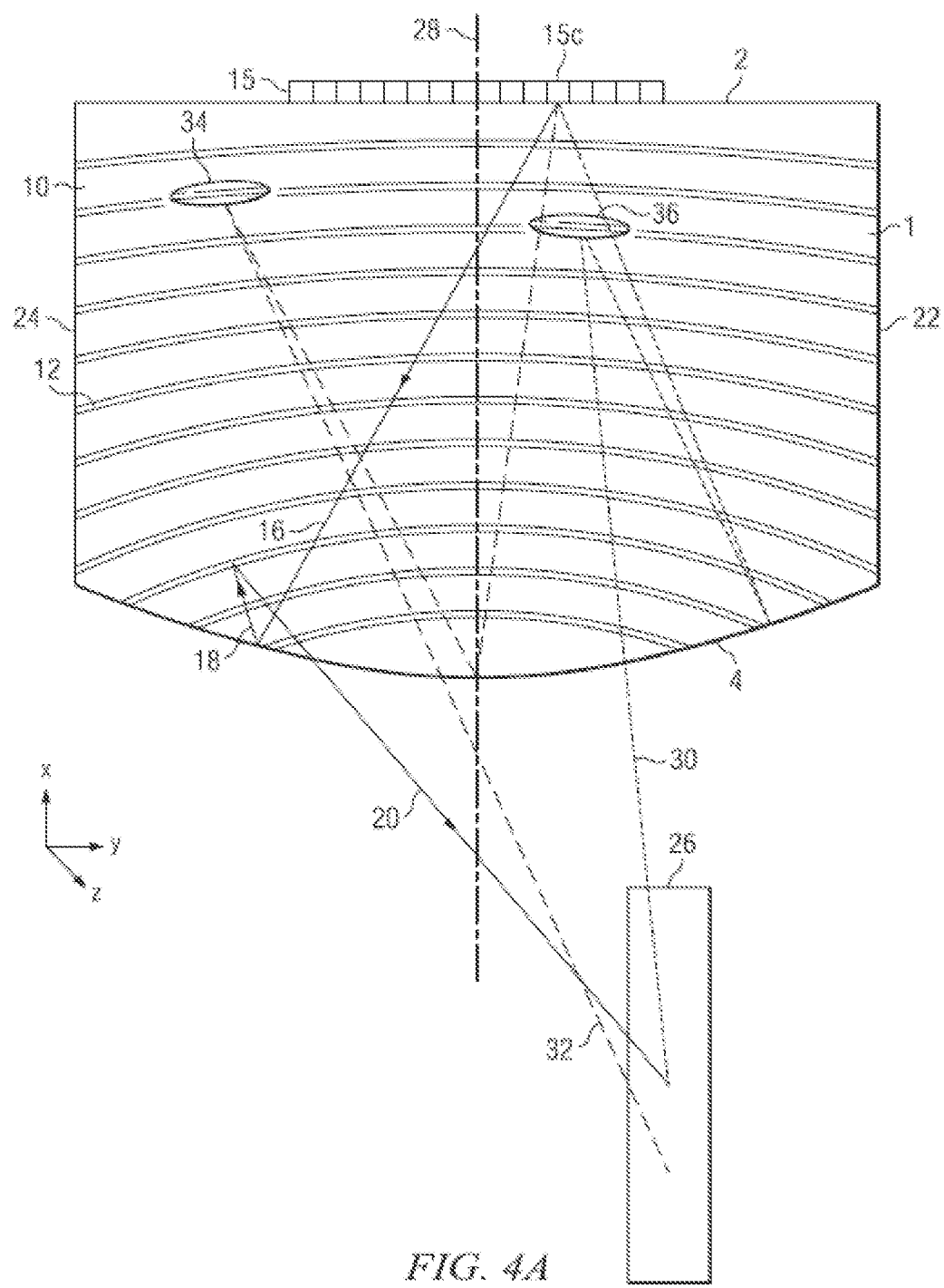
FIG. 4A is schematic diagram illustrating in a front view, generation of a viewing window in a directional display device and including curved light extraction features, in accordance with the present disclosure.

FIG. 4A is a schematic diagram illustrating in front view a directional display device which may be illuminated by a first illuminator element and including curved light extraction features. Further, FIG. 4A shows in front view further guiding of light rays from illuminator element 15c of illuminator array 15, in the stepped waveguide 1 having an optical axis 28. In FIG. 4A, the directional backlight may include the stepped waveguide 1 and the light source illuminator array 15. Each of the output rays are directed from the input side 2 towards the same viewing window 26 from the respective illuminator 15c. The light rays of FIG. 4A may exit the reflective side 4 of the stepped waveguide 1. As shown in FIG. 4A, ray 16 may be directed from the illuminator element 15c towards the reflective side 4. Ray 18 may then reflect from a light extraction feature 12 and exit the reflective side 4 towards the viewing window 26. Thus light ray 30 may intersect the ray 20 in the viewing window 26, or may have a different height in the viewing window as shown by ray 32. Additionally, in various embodiments, sides 22, 24 of the waveguide 1 may be transparent, mirrored, or blackened surfaces. Continuing the discussion of FIG. 4A, light extraction features 12 may be elongate, and the orientation of light extraction features 12 in a first region 34 of the light directing side 8 (light directing side 8 shown in FIG. 3, but not shown in FIG. 4A) may be different to the orientation of light extraction features 12 in a second region 36 of the light directing side 8. Similar to other embodiments discussed herein, for example as illustrated in FIG. 3, the light extraction features of FIG. 4A may alternate with the guiding features 10. As illustrated in FIG. 4A, the stepped waveguide 1 may include a reflective surface on reflective side 4. In one embodiment, the reflective end of the stepped waveguide 1 may have positive optical power in a lateral direction across the stepped waveguide 1.

In another embodiment, the light extraction features 12 of each directional backlight may have positive optical power in a lateral direction across the waveguide.

In another embodiment, each directional backlight may include light extraction features 12 which may be facets of the second guide surface. The second guide surface may have regions alternating with the facets that may be arranged to direct light through the waveguide without substantially extracting it.

Figure 4B:
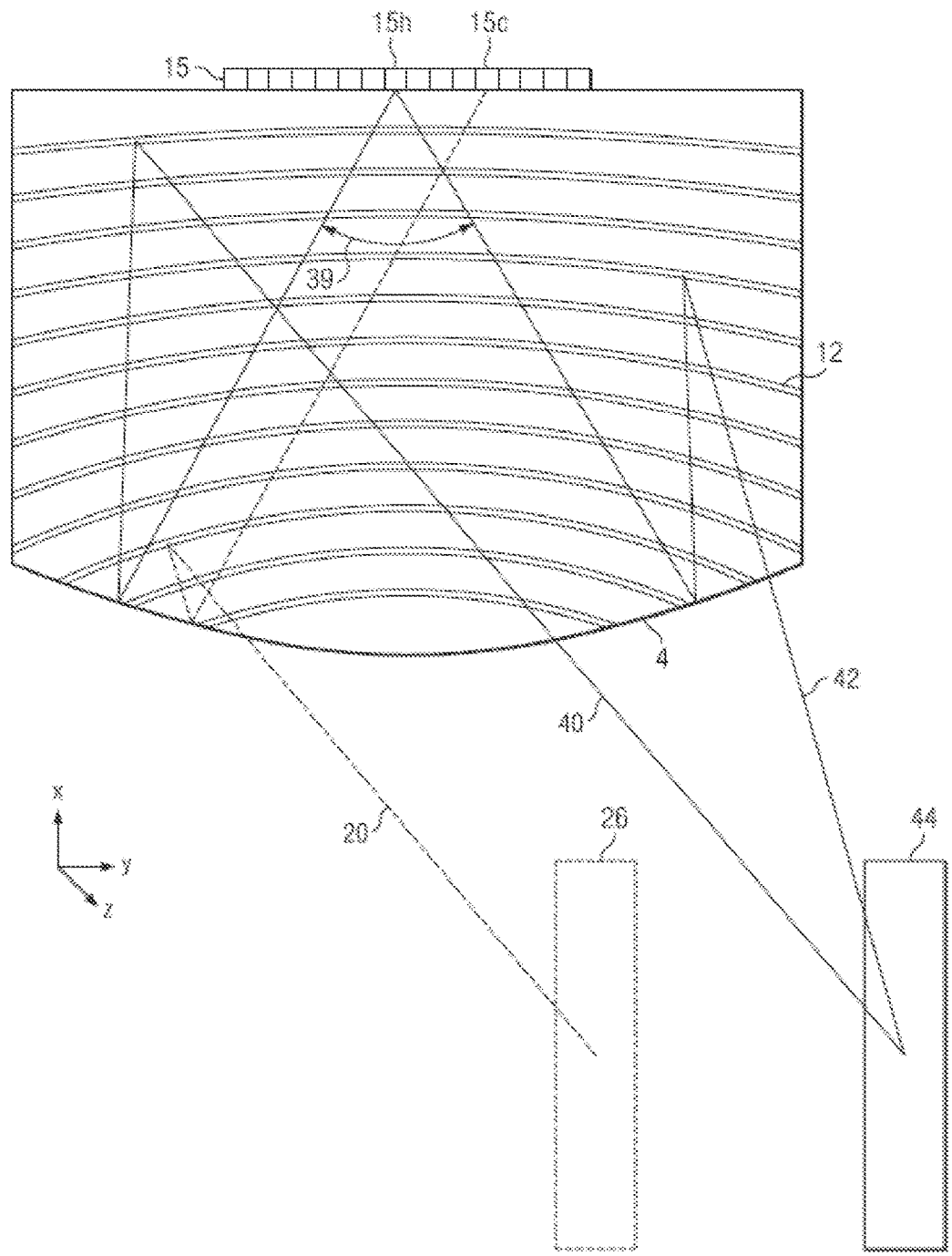
FIG. 4B is a schematic diagram illustrating in a front view, generation of a first and a second viewing window in a directional display device and including curved light extraction features, in accordance with the present disclosure.

FIG. 4B is a schematic diagram illustrating in front view a directional display device which may illuminated by a second illuminator element. Further, FIG. 4B shows the light rays 40, 42 from a second illuminator element 15h of the illuminator array 15. The curvature of the reflective surface on the side 4 and the light extraction features 12 cooperatively produce a second viewing window 44 laterally separated from the viewing window 26 with light rays from the illuminator element 15h.

Advantageously, the arrangement illustrated in FIG. 4B may provide a real image of the illuminator element 15*c* at a viewing window 26 in which the real image may be formed by cooperation of optical power in reflective side 4 and optical power which may arise from different orientations of elongate light extraction features 12 between regions 34 and 36, as shown in FIG. 4A. The arrangement of FIG. 4B may achieve improved aberrations of the imaging of illuminator element 15*c* to lateral positions in viewing window 26. Improved aberrations may achieve an extended viewing freedom for an autostereoscopic display while achieving low cross talk levels.

Figure 5:
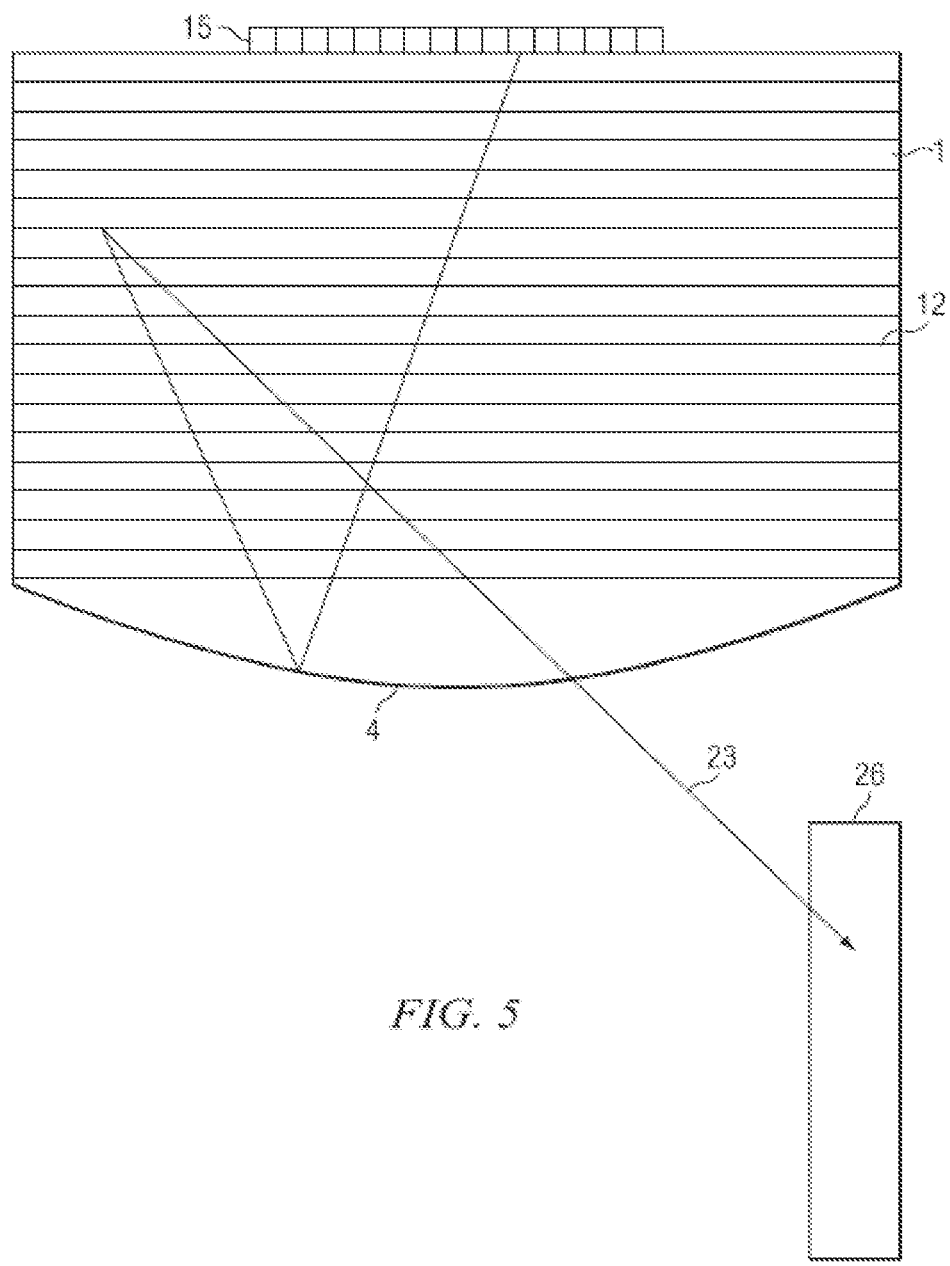
FIG. 5 is a schematic diagram illustrating generation of a first viewing window in a directional display device including linear light extraction features, in accordance with the present disclosure.

FIG. 5 is a schematic diagram illustrating in front view an embodiment of a directional display device having substantially linear light extraction features. Further, FIG. 5 shows a similar arrangement of components to FIG. 1 (with corresponding elements being similar), with one of the differences being that the light extraction features 12 are substantially linear and parallel to each other. Advantageously, such an arrangement may provide substantially uniform illumination across a display surface and may be more convenient to manufacture than the curved extraction features of FIG. 4A and FIG. 4B. The optical axis 321 of the directional waveguide 1 may be the optical axis direction of the surface at side 4. The optical power of the side 4 is arranged to be across the optical axis direction, thus rays incident on the side 4 will have an angular deflection that varies according to the lateral offset 319 of the incident ray from the optical axis 321.

Figure 6A:
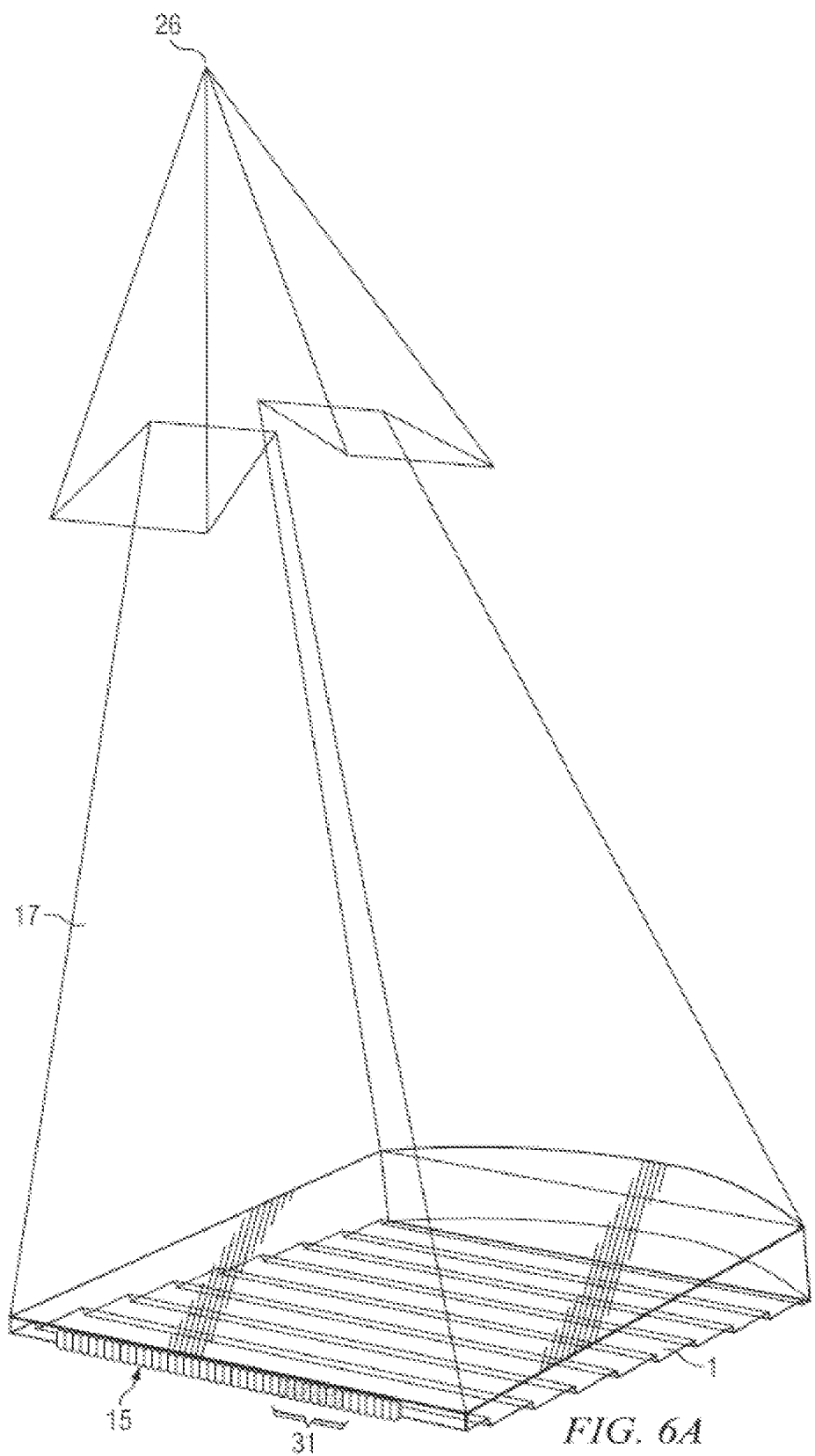
FIG. 6A is a schematic diagram illustrating one embodiment of the generation of a first viewing window in a time multiplexed directional display device, in accordance with the present disclosure.
Figure 6B:
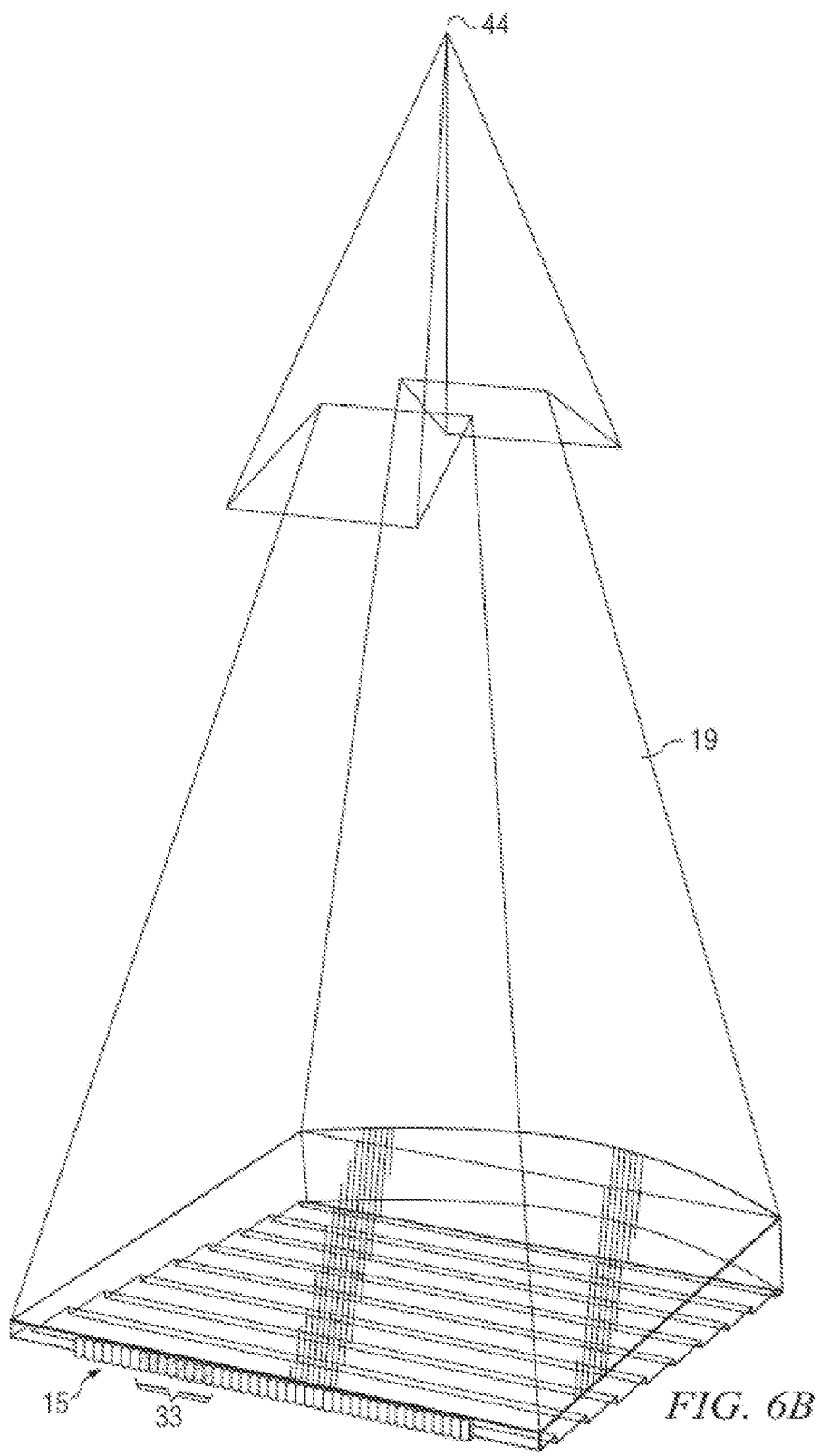
FIG. 6B is a schematic diagram illustrating another embodiment of the generation of a second viewing window in a time multiplexed directional display device in a second time slot, in accordance with the present disclosure.
Figure 6C:
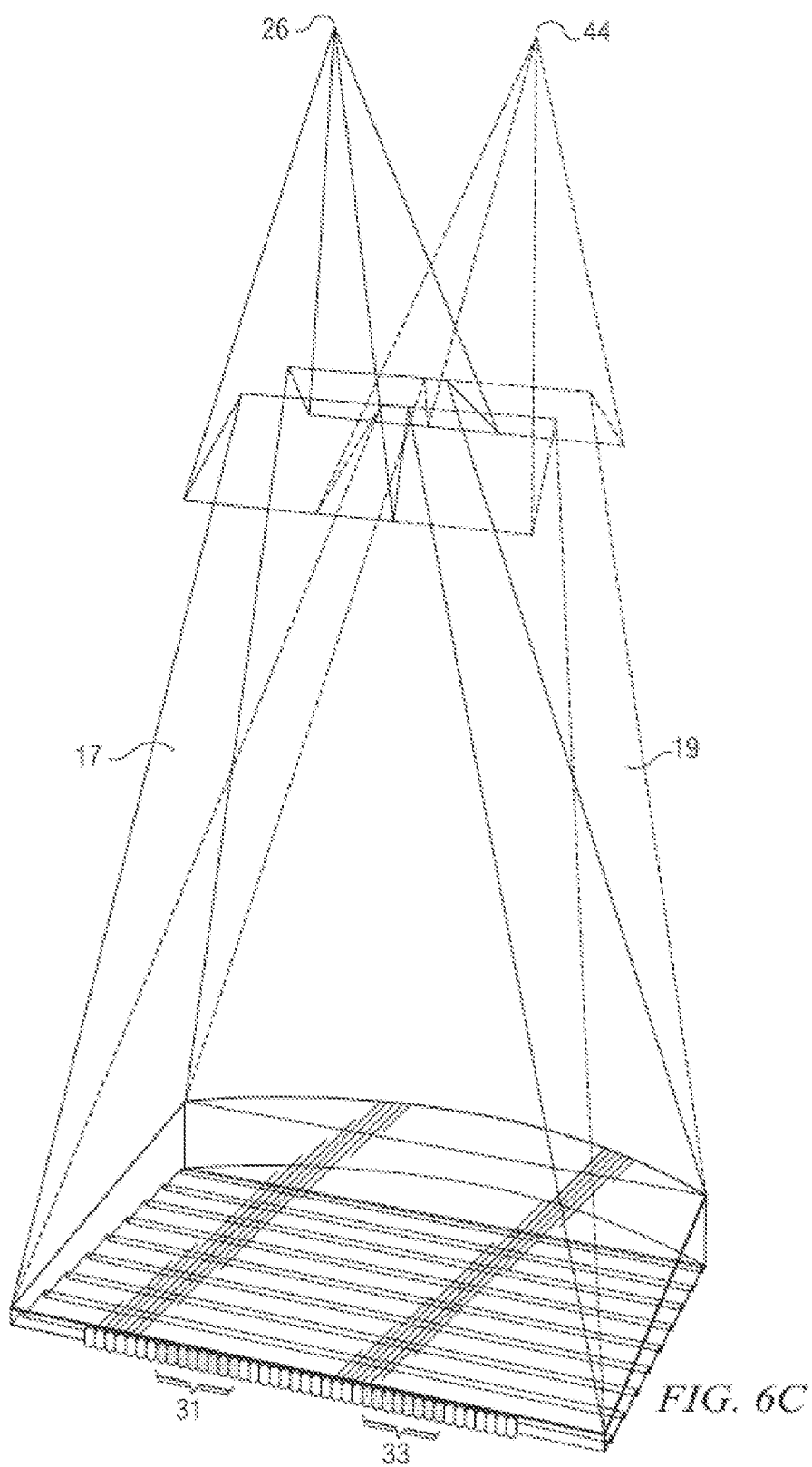
FIG. 6C is a schematic diagram illustrating another embodiment of the generation of a first and a second viewing window in a time multiplexed directional display device, in accordance with the present disclosure.

FIG. 6A is a schematic diagram illustrating one embodiment of the generation of a first viewing window in a time multiplexed imaging directional display device in a first time slot, FIG. 6B is a schematic diagram illustrating another embodiment of the generation of a second viewing window in a time multiplexed imaging directional backlight apparatus in a second time slot, and FIG. 6C is a schematic diagram illustrating another embodiment of the generation of a first and a second viewing window in a time multiplexed imaging directional display device. Further, FIG. 6A shows schematically the generation of viewing window 26 from stepped waveguide 1. Illuminator element group 31 in illuminator array 15 may provide a light cone 17 directed towards a viewing window 26. FIG. 6B shows schematically the generation of viewing window 44. Illuminator element group 33 in illuminator array 15 may provide a light cone 19 directed towards viewing window 44. In cooperation with a time multiplexed display, windows 26 and 44 may be provided in sequence as shown in FIG. 6C. If the image on a spatial light modulator 48 (not shown in FIGS. 6A, 6B, 6C) is adjusted in correspondence with the light direction output, then an autostereoscopic image may be achieved for a suitably placed viewer. Similar operation can be achieved with all the imaging directional backlights described herein. Note that illuminator element groups 31, 33 each include one or more illumination elements from illumination elements 15*a* to 15*n*, where n is an integer greater than one.

Figure 7:
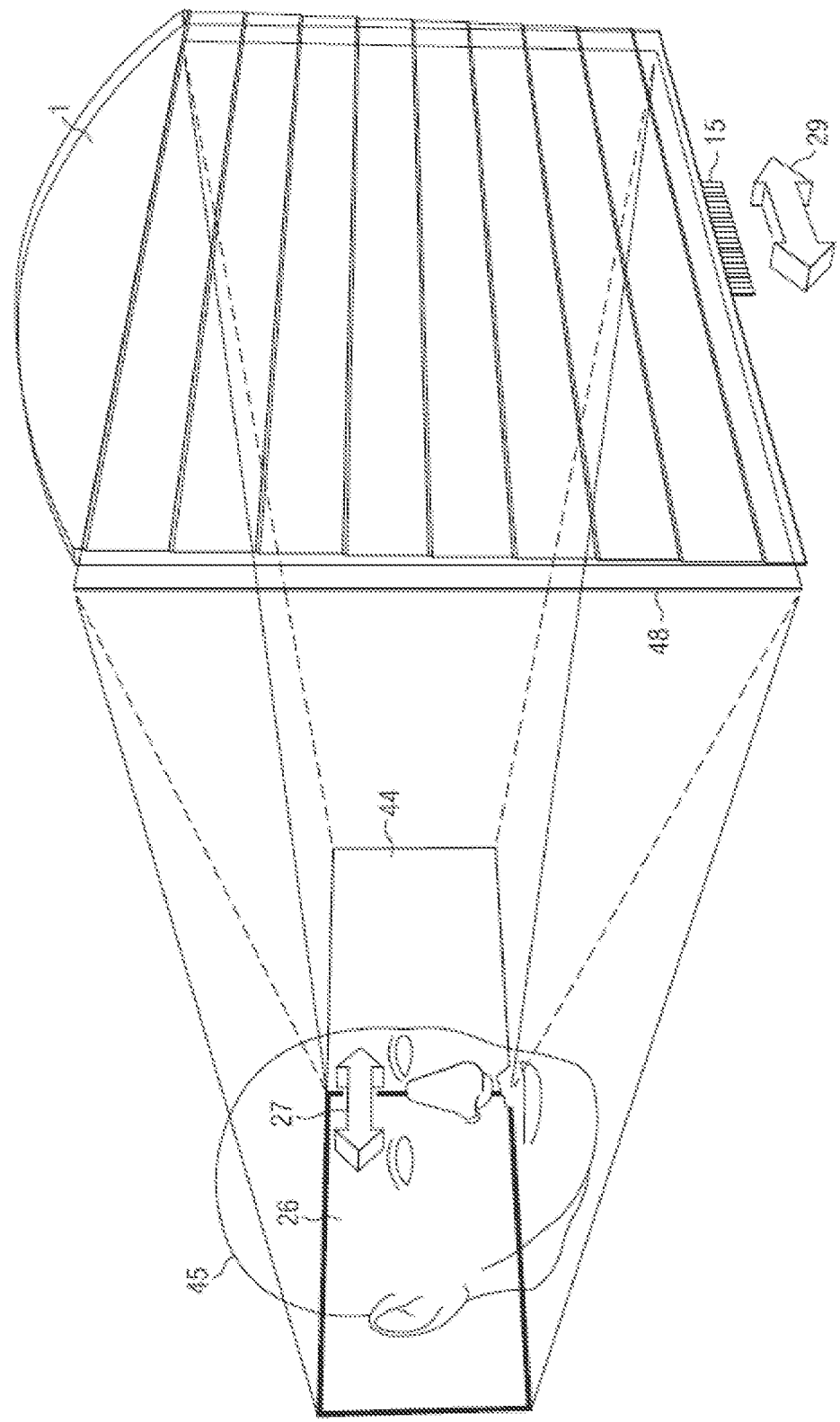
FIG. 7 is a schematic diagram illustrating an observer tracking autostereoscopic directional display device, in accordance with the present disclosure.

FIG. 7 is a schematic diagram illustrating one embodiment of an observer tracking autostereoscopic display apparatus including a time multiplexed directional display device. As shown in FIG. 7, selectively turning on and off illuminator elements 15*a* to 15*n* along axis 29 provides for directional control of viewing windows. The head 45 position may be monitored with a camera, motion sensor, motion detector, or any other appropriate optical, mechanical or electrical means, and the appropriate illuminator elements of illuminator array 15 may be turned on and off to provide substantially independent images to each eye irrespective of the head 45 position. The head tracking system (or a second head tracking system) may provide monitoring of more than one head 45, 47 (head 47 not shown in FIG. 7) and may supply the same left and right eye images to each viewers' left and right eyes providing 3D to all viewers. Again similar operation can be achieved with all the imaging directional backlights described herein.

Figure 8:
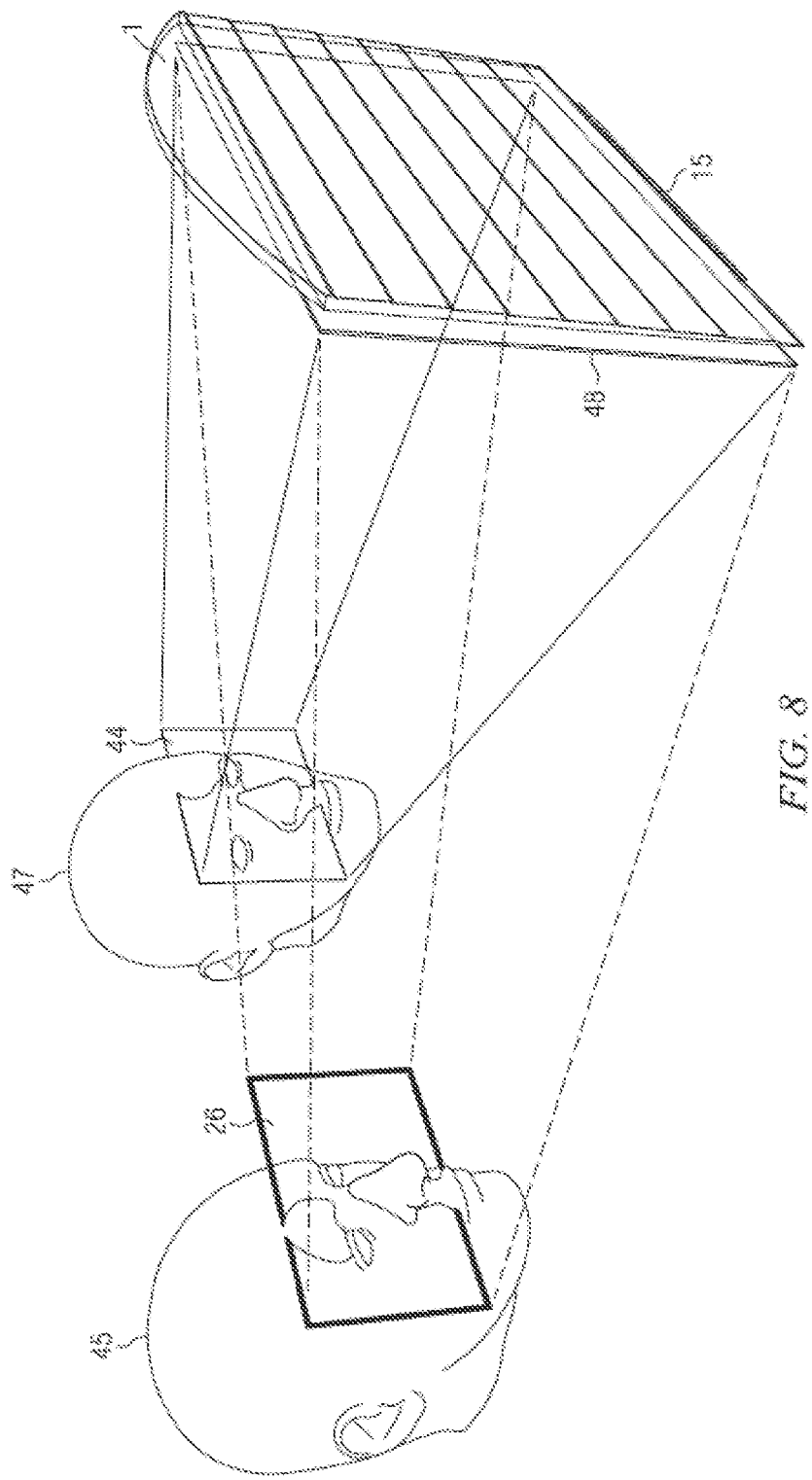
FIG. 8 is a schematic diagram illustrating a multi-viewer directional display device, in accordance with the present disclosure.

FIG. 8 is a schematic diagram illustrating one embodiment of a multi-viewer directional display device as an example including an imaging directional backlight. As shown in FIG. 8, at least two 2D images may be directed towards a pair of viewers 45, 47 so that each viewer may watch a different image on the spatial light modulator 48. The two 2D images of FIG. 8 may be generated in a similar manner as described with respect to FIG. 7 in that the two images may be displayed in sequence and in synchronization with sources whose light is directed toward the two viewers. One image is presented on the spatial light modulator 48 in a first phase, and a second image is presented on the spatial light modulator 48 in a second phase different from the first phase. In correspondence with the first and second phases, the output illumination is adjusted to provide first and second viewing windows 26, 44 respectively. An observer with both eyes in viewing window 26 will perceive a first image while an observer with both eyes in viewing window 44 will perceive a second image.

Figure 9:
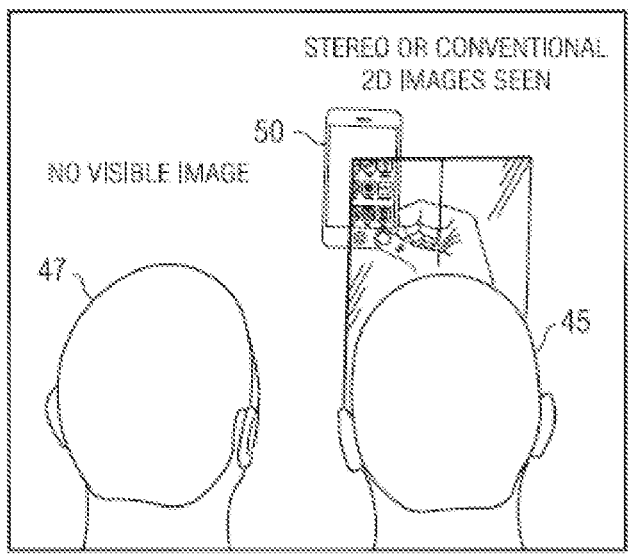
FIG. 9 is a schematic diagram illustrating a privacy directional display device, in accordance with the present disclosure.

FIG. 9 is a schematic diagram illustrating a privacy directional display device which includes an imaging directional backlight. 2D display systems may also utilize directional backlighting for security and efficiency purposes in which light may be primarily directed at the eyes of a first viewer 45 as shown in FIG. 9. Further, as illustrated in FIG. 9, although first viewer 45 may be able to view an image on device 50, light is not directed towards second viewer 47. Thus second viewer 47 is prevented from viewing an image on device 50. Each of the embodiments of the present disclosure may advantageously provide autostereoscopic, dual image or privacy display functions.

Figure 10:
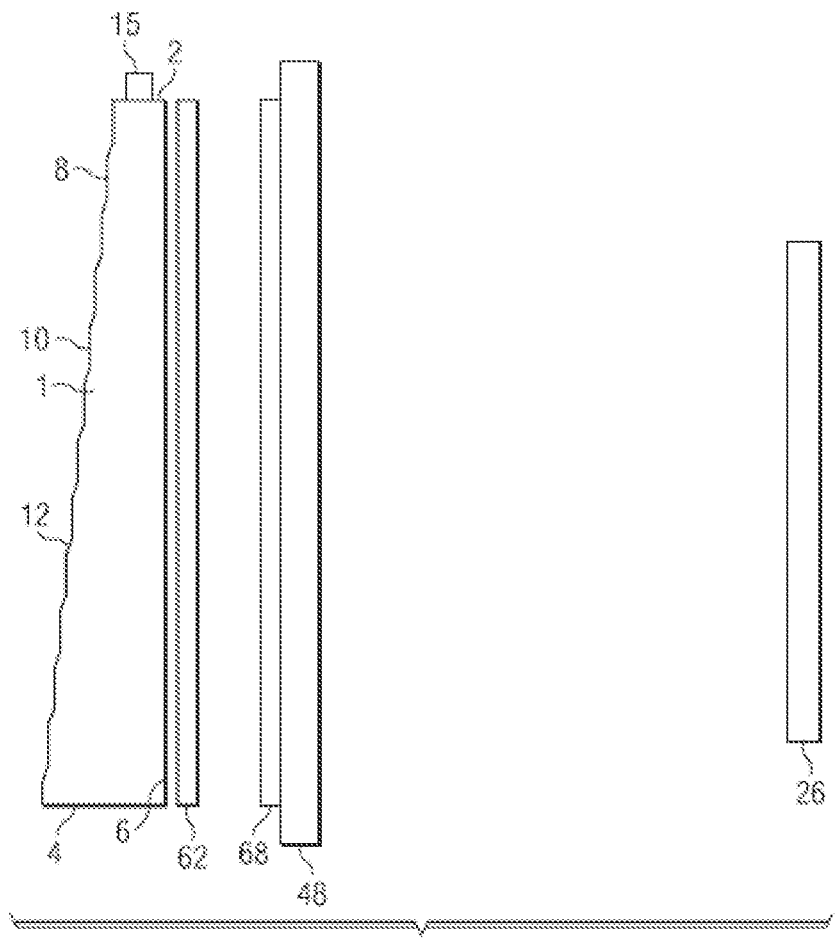
FIG. 10 is a schematic diagram illustrating in side view, the structure of a directional display device, in accordance with the present disclosure.

FIG. 10 is a schematic diagram illustrating in side view the structure of a time multiplexed directional display device as an example including an imaging directional backlight. Further, FIG. 10 shows in side view an autostereoscopic directional display device, which may include the stepped waveguide 1 and a Fresnel lens 62 arranged to provide the viewing window 26 for a substantially collimated output across the stepped waveguide 1 output surface. A vertical diffuser 68 may be arranged to extend the height of the viewing window 26 further. The light may then be imaged through the spatial light modulator 48. The illuminator array 15 may include light emitting diodes (LEDs) that may, for example, be phosphor converted blue LEDs, or may be separate RGB LEDs. Alternatively, the illuminator elements in illuminator array 15 may include a uniform light source and spatial light modulator arranged to provide separate illumination regions. Alternatively the illuminator elements may include laser light source(s). The laser output may be directed onto a diffuser by means of scanning, for example, using a galvo or MEMS scanner. In one example, laser light may thus be used to provide the appropriate illuminator elements in illuminator array 15 to provide a substantially uniform light source with the appropriate output angle, and further to provide reduction in speckle. Alternatively, the illuminator array 15 may be an array of laser light emitting elements. Additionally in one example, the diffuser may be a wavelength converting phosphor, so that illumination may be at a different wavelength to the visible output light.

There will now be described some waveguides, directional backlights and directional display devices that are based on and incorporate the structures of FIGS. 1 to 10 above. Except for the modifications and/or additional features which will now be described, the above description applies equally to the following waveguides, directional backlights and display devices, but for brevity will not be repeated. The waveguides described below may be incorporated into a directional backlight or a directional display device as described above. Similarly, the directional backlights described below may be incorporated into a directional display device as described above.

Figure 11:
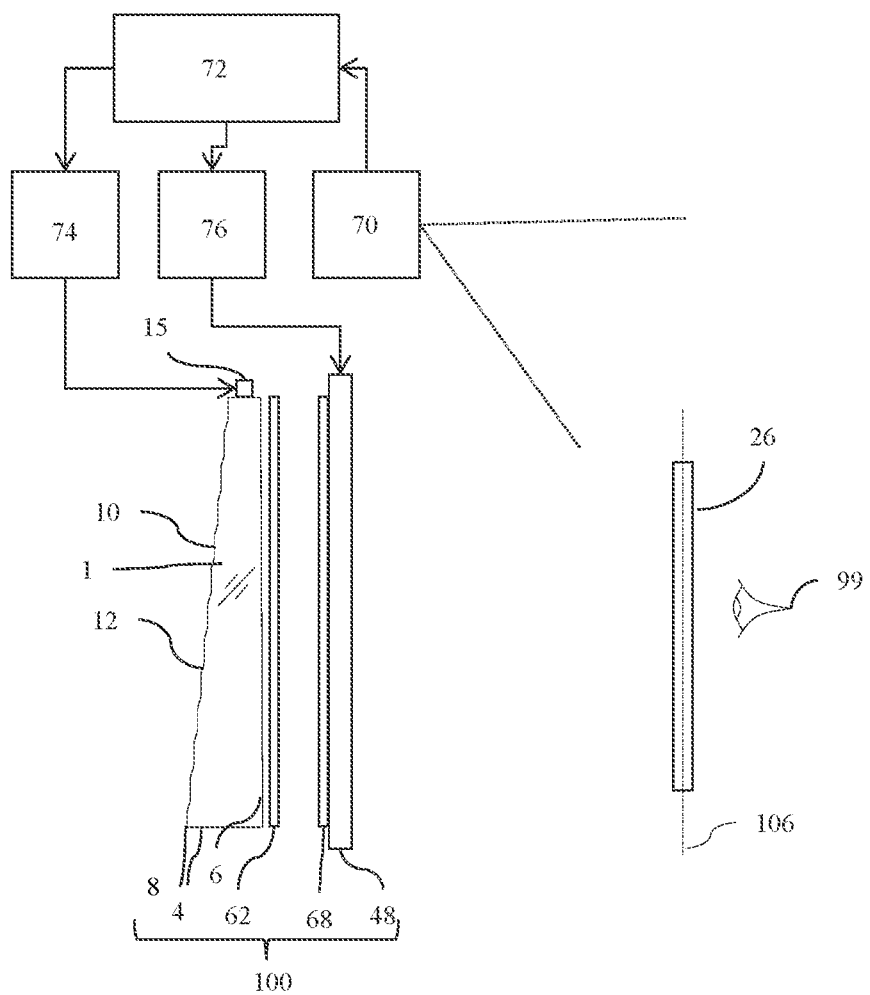
FIG. 11 is a schematic diagram illustrating control system for an observer tracking directional display apparatus, in accordance with the present disclosure.

FIG. 11 is a schematic diagram illustrating a directional display apparatus comprising a display device 100 and a control system. The arrangement and operation of the control system will now be described and may be applied, with changes as necessary, to each of the display devices disclosed herein.

The directional display device 100 comprises a directional backlight that comprises waveguide 1 and an array of illuminator elements 15 arranged as described above. The control system is arranged to selectively operate the illumination elements 15a-15n to direct light into selectable viewing windows.

The waveguide 1 is arranged as described above. The reflective end 4 converges the reflected light. A Fresnel lens 62 may be arranged to cooperate with reflective end 4 to achieve viewing windows 26 at a viewing plane 106 observed by an observer 99. A transmissive spatial light modulator (SLM) 48 may be arranged to receive the light from the directional backlight. Further a diffuser 68 may be provided to substantially remove Moire beating between the waveguide 1 and pixels of the SLM 48 as well as the Fresnel lens 62.

As illustrated in FIG. 11, a directional backlight may include a stepped waveguide 1 and a light source illuminator array 15. As illustrated in FIG. 11, the stepped waveguide 1 includes a light directing side 8, a reflective side 4, guiding features 10 and light extraction features 12.

The control system may comprise a sensor system arranged to detect the position of the observer 99 relative to the display device 100. The sensor system comprises a position sensor 70, such as a camera, and a head position measurement system 72 that may for example comprise a computer vision image processing system. The control system may further comprise an illumination controller 74 and an image controller 76 that are both supplied with the detected position of the observer supplied from the head position measurement system 72.

The illumination controller 74 selectively operates the illuminator elements 15 to direct light to into the viewing windows 26 in cooperation with waveguide 1. The illumination controller 74 selects the illuminator elements 15 to be operated in dependence on the position of the observer detected by the head position measurement system 72, so that the viewing windows 26 into which light is directed are in positions corresponding to the left and right eyes of the observer 99. In this manner, the lateral output directionality of the waveguide 1 corresponds with the observer position.

The image controller 76 controls the SLM 48 to display images. To provide an autostereoscopic display, the image controller 76 and the illumination controller 74 may operate as follows. The image controller 76 controls the SLM 48 to display temporally multiplexed left and right eye images. The illumination controller 74 operate the light sources 15 to direct light into viewing windows in positions corresponding to the left and right eyes of an observer synchronously with the display of left and right eye images. In this manner, an autostereoscopic effect is achieved using a time division multiplexing technique.

The above descriptions may apply to each or all of the following apparatuses, modifications and/or additional features, individually, or any combination thereof, which will now be described.

In another embodiment, a directional display apparatus may further include a control system which may be arranged to selectively operate the light sources to direct light into viewing windows corresponding to output directions as previously discussed. This embodiment may also be used in conjunction with any of the directional backlights, directional display devices, directional display apparatuses, and so forth as described herein.

In another embodiment, a directional display apparatus may be an autostereoscopic display apparatus with a control system. The control system may be further arranged to control the directional display device to temporally display multiplexed left and right images and to substantially synchronously direct the displayed images into viewing windows in positions corresponding to at least the left and right eyes of an observer. The control system may include a sensor system which may be arranged to detect the position of an observer across the display device, and also may be arranged to direct the displayed images into viewing windows in positions corresponding to at least the left and right eyes of an observer. The position of the viewing windows may primarily depend on the detected position of the observer.

Figure 12A:
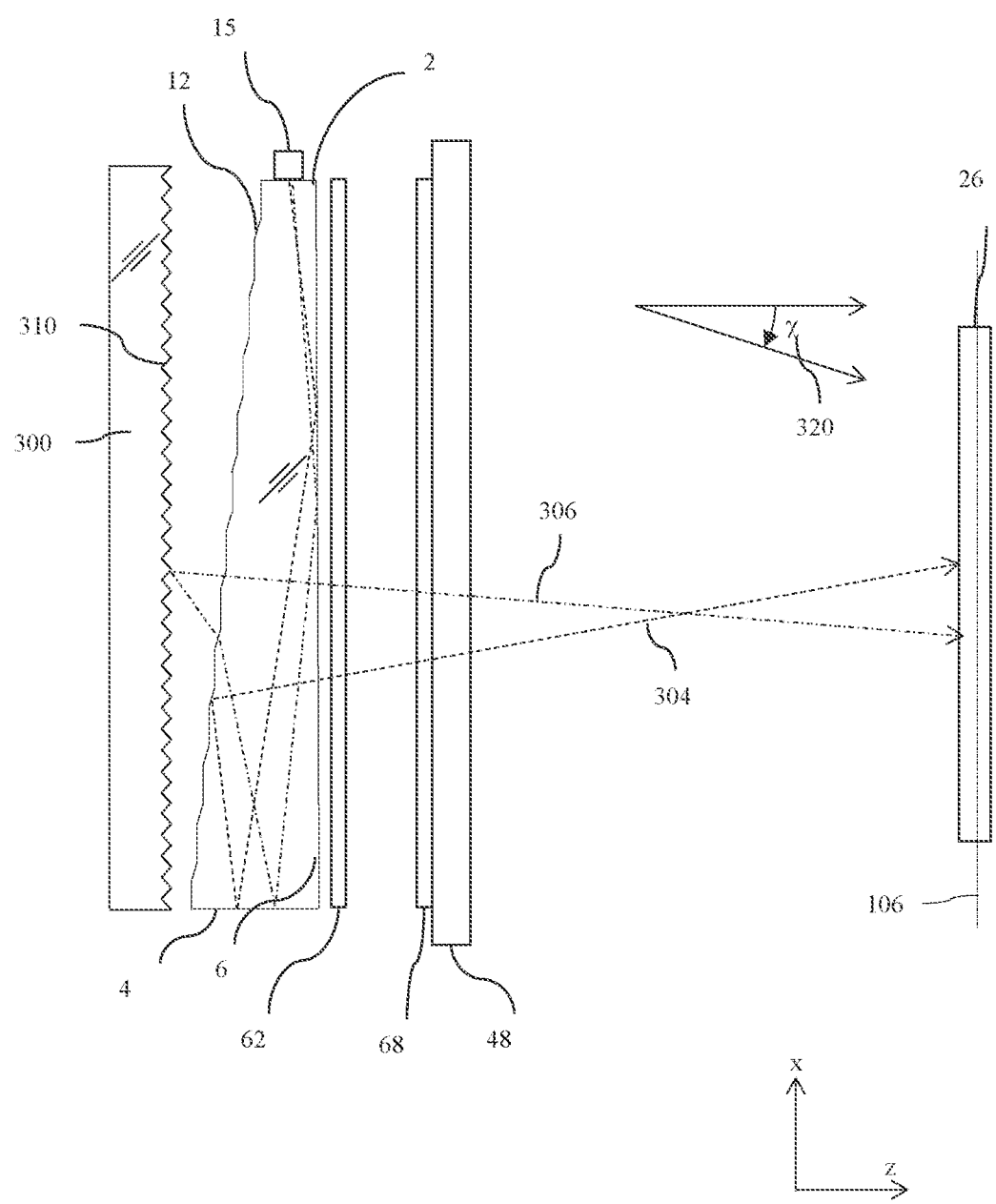
FIG. 12A is a schematic diagram illustrating a side view of a directional display device with a rear reflector with an array of reflective facets, in accordance with the present disclosure.

FIG. 12A is a schematic diagram illustrating a side view of a directional display device with a rear reflector 300. The directional display device may include a directional backlight and a transmissive spatial light modulator. The rear reflector 300 may include an array of reflective facets 310. The array is a linear array in that it repeats in a linear direction (e.g. vertically in FIG. 12). Light rays 304 that are reflected from light extraction features 12 of the waveguide 1 are directed to a vertical viewing position in the viewing window 26, with an angular distribution in the x direction Light rays 304 that are reflected from light extraction 306 that are transmitted through the features 12 are lost to the system, or may interact with materials behind the display and scatter to produce undesirable cross talk between respective viewing windows.

In the present disclosure an optical window refers to the image of a single light source in the window plane. By way of comparison, a viewing window 26 is a region in the window plane 106 in which light is provided and which may include image data of substantially the same image from across the display area. Thus a viewing window may be formed from multiple optical windows. Typically the optical windows have a small lateral extent (y-axis direction) and a large extent in a vertical direction orthogonal to the lateral extent (x-axis direction).

In the present embodiment, light rays 306 that are transmitted through the features 12 are incident on the reflective facets of rear reflector 300. The light rays 306 are thus redirected towards the viewing window 26. For a given light source of the array 15, the lateral extent and position of the respective optical windows for rays 304, 306 is substantially the same; however the distribution of light in the vertical direction may be different for light ray bundles directed by reflection or transmission at features 12.

A directional backlight may thus include a waveguide and an array of light sources disposed at different input positions in a lateral direction across the input end of the waveguide. The waveguide may have an input end, may include first and second opposed guide surfaces for guiding light along the waveguide, and a reflective end facing the input end for reflecting the input light back through the waveguide. The first guide surface may be arranged to guide light by total internal reflection and the second guide surface may have a stepped shape which may include a plurality of facets oriented to reflect light from the light sources, after reflection from the reflective end, through the first guide surface into optical windows in output directions. The output directions may be distributed in a lateral direction to the normal to the first guide surface in dependence on the input positions, and intermediate regions between the facets that are arranged to direct light through the waveguide without extracting it. The directional backlight may also include a rear reflector which may include a linear array of reflective facets arranged to reflect light from the light sources that is transmitted through the plurality of facets of the waveguide, back through the waveguide to exit through the first guide surface into the optical windows.

A directional display device may thus also include a directional backlight and a transmissive spatial light modulator arranged to receive the output light from the first guide surface. A display apparatus may thus also include a directional display device, and a control system arranged to selectively operate the light sources to direct light into viewing windows corresponding to the output directions. The display apparatus may be an autostereoscopic display apparatus in which the control system is further arranged to control the display device to display temporally multiplexed left and right images and synchronously to direct the displayed images into viewing windows in positions corresponding to left and right eyes of an observer. The control system may further include a sensor system arranged to detect the position of an observer across the display device. The control system may be arranged to direct the displayed images into viewing windows in positions corresponding to left and right eyes of an observer, in dependence on the detected position of the observer.

Advantageously, the optical windows and viewing windows 26 achieved by the rays 304, 306 may substantially overlap in the lateral direction. Thus the cross talk of the display may be substantially maintained. Further the total intensity of light rays directed to viewing window 26 may be increased and the display brightness may be increased. The battery lifetime of a mobile display device may be increased, and the cost and number of light sources may be reduced for a desired brightness level. Further cross talk from unwanted transmitted light through features 12 is reduced or eliminated. Further, the reflector 300 may be formed in a thin film that may be mounted in the case of a display system, thus minimizing cost and thickness. Alternatively the structure of the reflector 300 may be formed on a rear case of the backlight, for example by molding the structure of the reflector 300 as part of the display case and then coating with a metallization layer. Advantageously this may provide a stiff and flat structure, achieving high window quality for the viewing windows 26 that are reflected from the reflector 300.

FIG. 12B is a schematic diagram illustrating a front view of a directional display device including a waveguide 1 with curved light extraction features 12 and a rear reflector 300 including an array of linear reflective facets 310. The directional display device may include a directional backlight and a transmissive spatial light modulator. The curved features 12 may be arranged to achieve viewing windows 26 at the window plane 106 without a Fresnel lens and may have a substantially uniform first radius of curvature in the x-y plane. Advantageously the thickness of the system and light losses due to additional surfaces can be reduced. Further the reflector 300 can be cut from a large continuous sheet of material compared to an arrangement wherein the reflective facets 310 are curved as will be described below, thus reducing cost.

The luminous intensity of a display device is a measure of the power emitted by the display device in a particular direction per unit solid angle. The brightness of the display device 100 as perceived by the observer 99 is elicited by the luminance which is a photometric measure of the luminous intensity per unit area of light traveling in a given direction. The illuminator elements of the array 15 provide respective luminous flux.

FIGS. 13A-13B are schematic diagrams illustrating front and side views of a conventional backlight apparatus comprising a diffusing light guiding plate. Known light guide plate 150 typically comprises light extraction structures 151 such as microlenses. Light from sparse arrays 152 of light emitting diodes, LEDs is directed into the light guide plate 150 and incident directly onto the structures 151 at which point may be directed by means of rays 157 out of the light guide plate 150. Rays 157 may be directed towards the spatial light modulator 48. However in region 156 near to the LEDs, the light propagates within a cone which may be defined by the critical angle of the light within the material, and additionally by structures at the input side of the plate 150. In the region 156, the extracted luminance from rays 161 is thus high and may provide undesirable visibility of the LED array 152. Such an arrangement may thus employ extended bezel regions 159 outside the area of the display 48 to reduce the LED visibility.

It may be desirable to increase display luminance, for example to achieve increased image contrast in high illuminance environments, for example for outdoors use.

To increase display luminance in the backlight of FIGS. 13A-B the number of LEDs can be increased and/or the luminous intensity of the LEDs can be increased. For the reasons of source visibility it is typically undesirable to achieve high display luminance through small numbers of high luminous flux LEDs. Thus it is preferable to use larger numbers of lower luminous flux LEDs in such a display to minimise individual source visibility in conventional light guide plates. Thus in conventional light guide plates for backlights it may be undesirable to increase the source luminous intensity.

Figure 14:
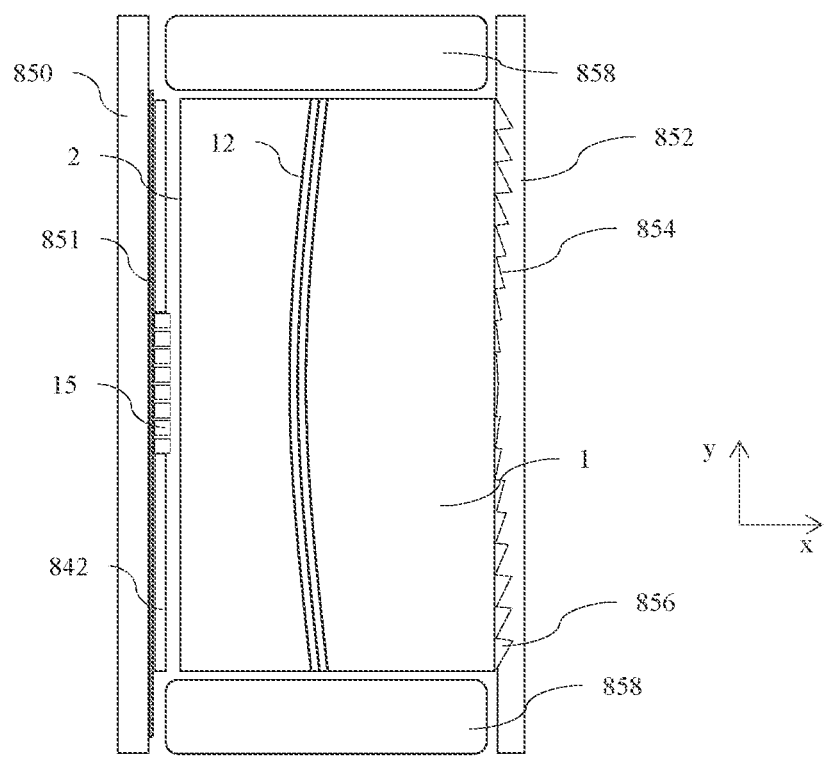
FIG. 14 is a schematic diagram illustrating a front view of a display device comprising an optical valve, an LED array arranged on a first device frame and a Fresnel mirror arranged on a second device frame, in accordance with the present disclosure.

FIG. 14 is a schematic diagram illustrating a front view of a display device comprising an optical valve, an LED array arranged on a first device frame and a Fresnel mirror arranged on a second device frame. Light source array 15 such as an LED array is assembled on a substrate comprising an electrode and insulator layer 851 and a metal frame 850 that may be the outer frame of a display device such as a mobile phone or tablet. Further films 842 such as ESR™ from 3M Corporation or wire grid polarizers may be applied in the regions of the array 15 to recycle light within the waveguide 1. Further a Fresnel mirror 854 may be formed on or in the frame 852 of the device. Such Fresnel mirror may be molded directly into the frame itself or may be formed on the frame. The Fresnel mirror may be attached by means of an index matching material 856 to the waveguide 1 forming an integrated component. Further the light source array may be in proximity to the input side of the waveguide 1. Further electronic components and boards 858 may be arranged around the backlight.

Advantageously the size of the bezel of the display device may be reduced and the number of separate components further reduced, minimizing cost. Further the frame 850 may provide a heat-sink for the LEDs of the array 15, thus improving thermal contact to the external environment, improving efficiency and lifetime of the LEDs.

Figure 15:
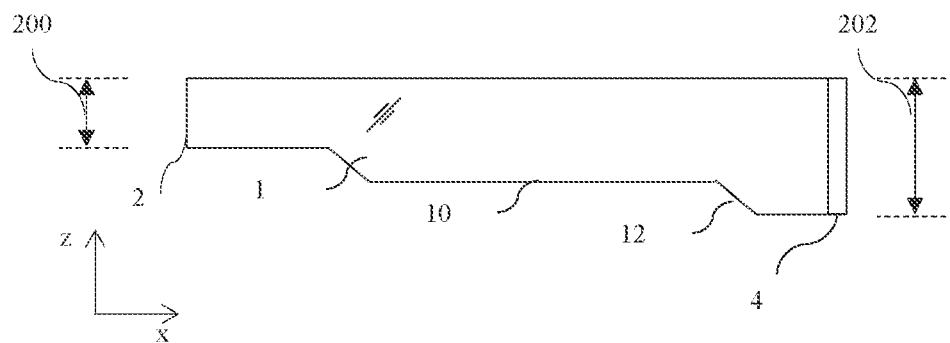
FIG. 15 is a schematic diagram illustrating a side view of an optical valve, in accordance with the present disclosure.

FIG. 15 is a schematic diagram illustrating a side view of an optical valve. The efficiency of the optical valve may be approximately determined by the ratio:

Efficiency=(Mirror height 202−Input aperture height 200)/Mirror height 202   eqn.1

It may be desirable to increase the efficiency of the optical valve. However increasing the mirror height 202 may undesirably increase the device thickness which can be particularly undesirable for mobile display devices for example. In another arrangement the height 200 of the input aperture may be reduced. For efficient light coupling efficiency, reduced LED output aperture height is thus desirable and will be described in the disclosure, below.

Figure 16:
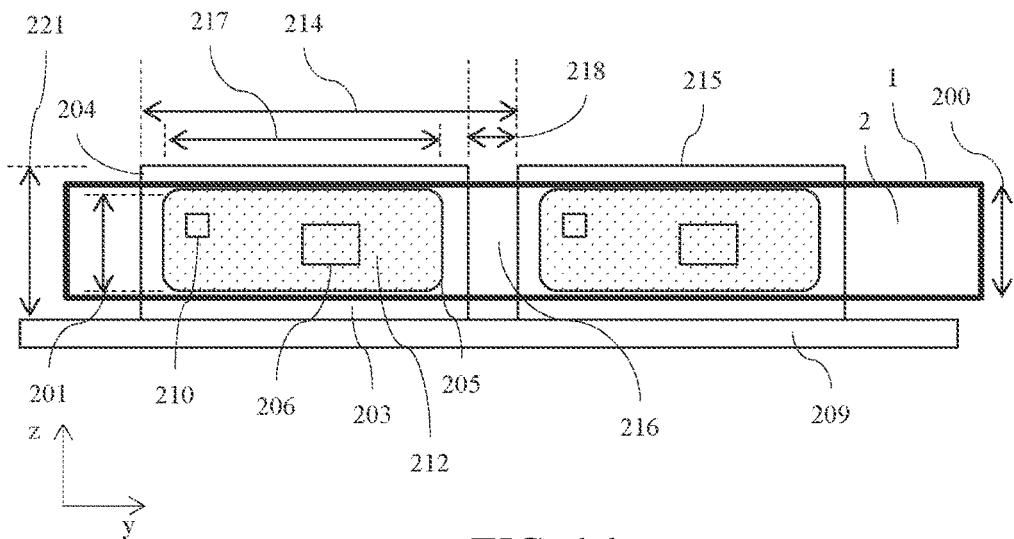
FIG. 16 is a schematic diagram illustrating a front view of an LED array, in accordance with the present disclosure.

FIG. 16 is a schematic diagram illustrating a front view of an LED array. LED package 204 may comprise at least one light generation element 206 arranged to generate light in an emission band, and may be a semiconductor diode such as a gallium nitride emitting diode emitting blue light. Thus Wavelength conversion material 212 is arranged to convert at least some of the light in the emission band generated by the light generation element into light in a conversion band. The material 212 may comprise for example a phosphor or a quantum dot material arranged to convert some of the blue light from the diode 206 into yellow light. The combined output may be white light of a color temperature desirable for display illumination.

Protection diode 210 may be provided to reduce failure of LED 206 from electro static discharge during handling and operation. Such diodes 210 are particularly desirable in the arrays of LEDs that may be used with optical valve 1 output illumination. The package 204 with height 221 may further comprise heat sink elements as will be described and a packaging body 203 which may typically comprise an acrylate or other polymeric molding material. The light emitting diode 206, protection diode 210 and material 212 may be contained within a well 205 in the packaging body 203. The well may comprise an indentation within the body 203 of the package 204 as will be described and has a height 201 and width 217.

The array 15 of light emitting elements may comprise at least package 204 and an adjacent package 215 and spacing 214 may be arranged between the packages 204, 215 including a gap 218. The packages 204, 215 may be mounted on a substrate 209 that may comprise support, thermal connection and electrical connections to the packages of the array.

For efficient coupling between the LED 204 and the optical valve 1, the height 201 of the well 205 may be arranged to be less than the height 200 of the input side 2 of the optical valve 1 and the LED 204 may be aligned with the input side 2.

In operation the output luminance of the display is determined by the Array Package Luminous Emittance (APLE) measured in lumens per millimetre for example. In an illustrative example package 204 may provide an output of 25 lumens, have a spacing 214 of 3.5 mm comprising package 204 width of 3.0 mm and gap width 218 of 0.5 mm. The height 200 may be 1.1 mm and the well 205 height 201 may be 1.0 mm. An APLE of 7.1 lm/mm is thus achieved. In a directional 16:9 aspect ratio display of diagonal 4" illuminated by two packages 204, 215 and arranged as shown in FIGS. 12A-12B a display luminance of greater than 1500 nits for on axis viewing may be achieved for the same power consumption of a conventional backlight similar to that shown in FIGS. 13A-13B arranged to achieve a display luminance of 500 nits.

In operation in brightly lit outdoors environments, such a display may advantageously achieved increased usability. For example in a luminance environment of 20,000 lux, the eye of an observer may adapt to the perceived white level of the background, that may be equivalent to an equivalent object luminance of approximately 6300 nits. A display with luminance of 500 nits may have a white state that appears to be 8% of the perceived white level of the background, whereas the display with luminance of 1500 nits may have a white state that appears to be 24% of the perceived white level of the background. Thus the 500 nit display may be perceived as being very dim compared to the 1500 nit display. High luminance displays can thus achieve improved visibility in outdoors environments. Further the appearance of reflections from the front surface of the display can be minimised.

It may be desirable to achieve a thinner optical valve while maintaining optical efficiency and further it may be desirable to achieve increased display luminance for use in high illuminance environments.

Figure 17:
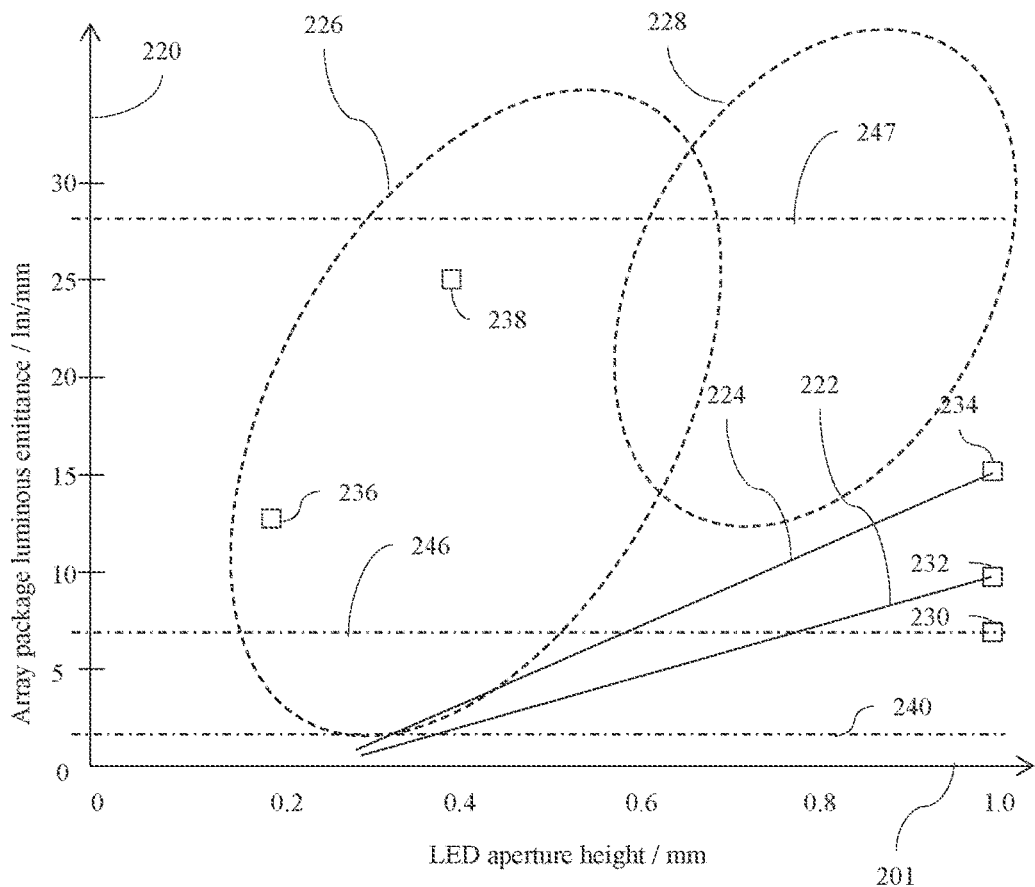
FIG. 17 is a schematic diagram illustrating a graph of array package luminous emittance against LED aperture height, in accordance with the present disclosure.

FIG. 17 is a schematic diagram illustrating a graph of array package luminous emittance, APLE 220 against LED aperture height 201. Lines 222, 224 indicate typical trends for known LEDs in rated and maximum operating modes. In operation in high efficiency mode and wide angle mode, the LEDs may be operated at or below the rated mode APLE 220. In outdoors operation the LEDs may be operated in maximum operating mode, which may be for short periods.

To continue the illustrative embodiment, the array 214, 215 may be represented by point 230 which is below the rated operating point 232. Thus line 246 represents the APLE appropriate to achieve 1500 nits luminance in a 4" display. Further, the output APLE can further be reduced by reducing drive current to line 240 to achieve 400 nits output for a 4" display. The desirable APLE may be independent of LED aperture height 201.

In a further illustrative embodiment, the desirable APLE 220 may scale substantially linearly with display height and illuminance environment. Thus an 8" diagonal display may have a desirable APLE 220 at illuminance levels of 40,000 lux as shown by line 247.

Thus it may be desirable to achieve APLE 220 levels for low thickness packages in the region 226 that are substantially above the line 224 to achieve high outdoors operation contrast and low thickness. Further APLE levels in region 228 and further regions not shown may be desirable for large area display operation, for example in large tablet, laptop, television and monitor applications. Preferably the ratio of the luminous emittance per unit length of an array of light emitting diode packages to the lateral extent of the first wells orthogonal to the direction in which the light emitting diode packages are arrayed is greater than 15 lumens per $mm^2$. Thus preferably a device with emitting aperture height of 0.4 mm may have an APLE 220 of greater than 61 m/mm. More preferably the ratio of the luminous emittance per unit length is greater than 20 lumens per $mm^2$ and most preferably greater than 30 $lm/mm^2$.

Improvements in optical efficiency, panel transmission, polarization control, scatter losses may reduce APLE specifications for a given contrast performance and height 201. However, such desirable points may typically remain above line 224.

Figure 18A:
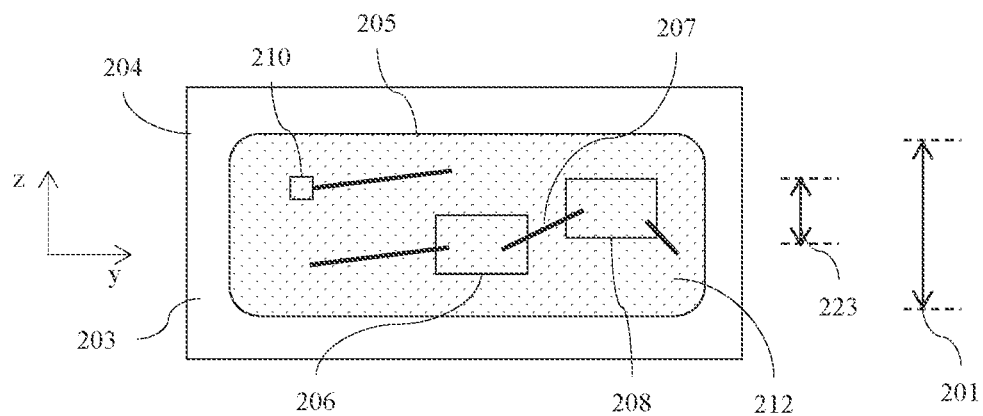
FIG. 18A is a schematic diagram illustrating a front view of an LED package, in accordance with the present disclosure.

FIG. 18A is a schematic diagram illustrating a front view of an LED package. The package may comprise two LEDs 206, 208 arranged in series. Advantageously the efficiency of the two packages for high package output luminous flux may be increased due to current crowding and thermal constraints for example, while utilizing higher voltage and lower current operation for a given total power consumption. Electrodes that may be trailing wire bonds 207 are further illustrated.

Figure 18B:
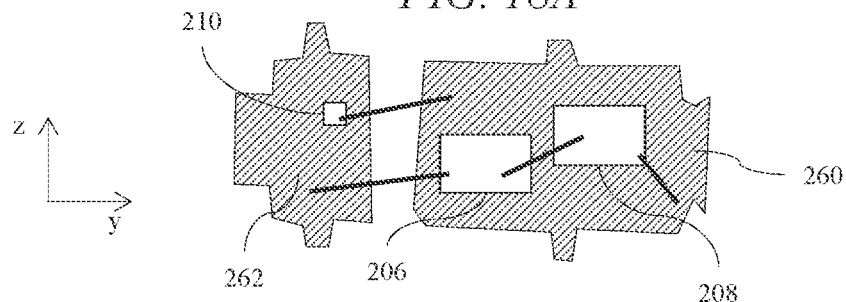
FIG. 18B is a schematic diagram illustrating a front view of an LED heat sink arrangement, in accordance with the present disclosure.

FIG. 18B is a schematic diagram illustrating a front view of an LED heat sink arrangement. Thus packaging body 203 and wavelength conversion material 212, which may typically comprise a phosphor slurry and shown in FIG. 18A are omitted.

Figure 18C:
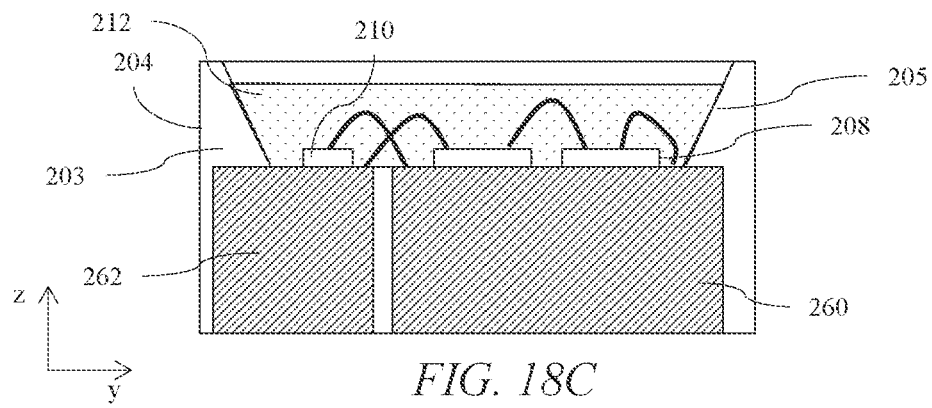
FIG. 18C is a schematic diagram illustrating a side view of an LED package, in accordance with the present disclosure.
Figure 18D:
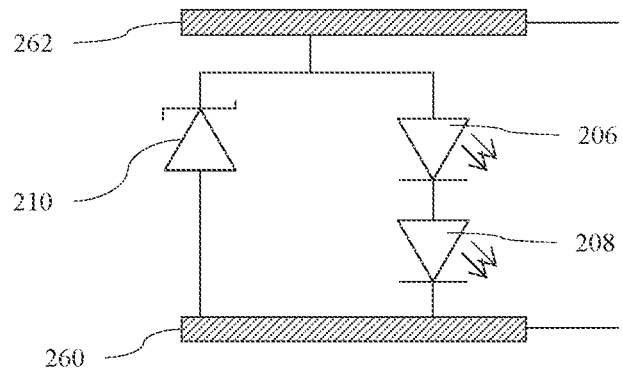
FIG. 18D is a schematic diagram illustrating an LED package electrical circuit, in accordance with the present disclosure.

FIG. 18C is a schematic diagram illustrating a side view of an LED package. Heat sinks that may comprise copper slugs 260, 262 with further and mechanical, electrical and thermal bonding layers may further provide anode and cathode electrical contacts to the package, as illustrated in FIG. 18D which is a schematic diagram illustrating an LED package electrical circuit. Protection diode 210 may comprise a discrete Zener diode for example in silicon.

Well 205 may thus comprise tapered sides of the body 203 and have a height 201 that is measured at the top of the well 205. Components 206, 208, 210, 207 within the well 205 may be provided and soldered by means of pick and place handling equipment. Wire bonds 207 between the components and heat sinks slugs 260, 262 are arranged within the well 205 and may be protected by the encapsulation of the material 212.

Figure 19:
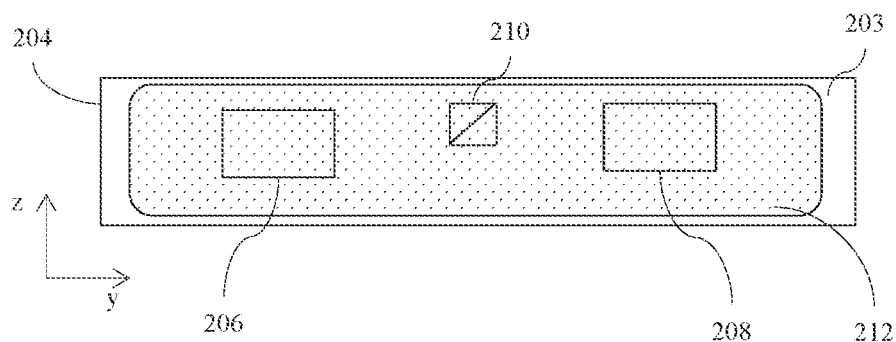
FIG. 19 is a schematic diagram illustrating a front view of an LED package, in accordance with the present disclosure.
Figure 20:
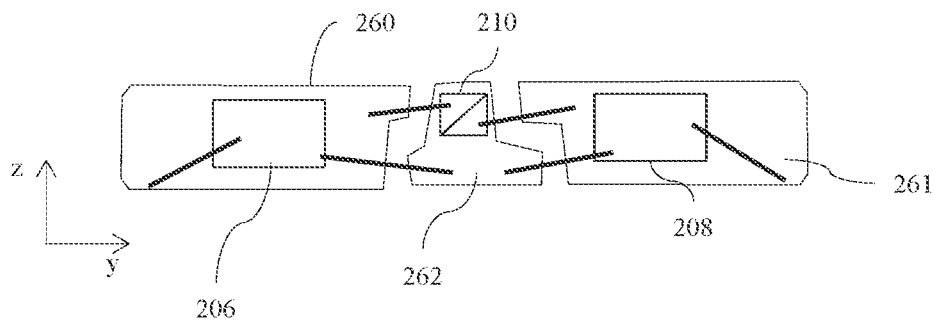
FIG. 20 is a schematic diagram illustrating a front view of an LED heat sink arrangement, in accordance with the present disclosure.

FIG. 19 is a schematic diagram illustrating a front view of an alternative LED package and FIG. 20 is a schematic diagram illustrating a front view of the heat sink arrangement of the package of FIG. 19. Separate heat slugs 260, 261 may be provided for LEDs 206, 208 respectively. The typical known arrangements of FIGS. 18A and 19 comprise ratio of well height 201 to LED 206 height 223 of approximately 200% or greater.

As illustrated in FIG. 17 it may be desirable to increase the APLE 220 for a given well 205 height 201. Improvements in LED technology may provide some increase in LED output for given package sizes and drive currents. However for directional display the arrangement of the elements within the package and array of packages can be further controlled to increase APLE 220 without requiring changes to the underlying LED technology.

Figure 21A:
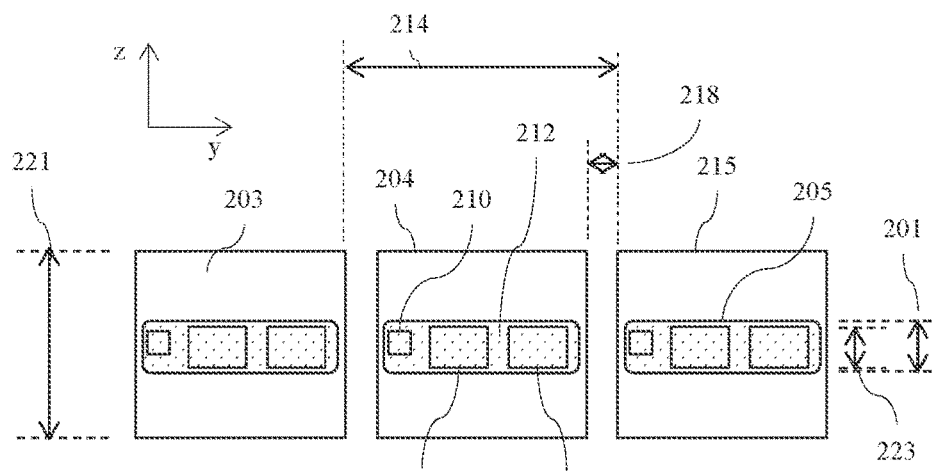
FIGS. 21A, 21B, 22 are schematic diagrams illustrating front views of LED package arrays with increased array package luminous emittance, in accordance with the present disclosure.
Figure 21B:
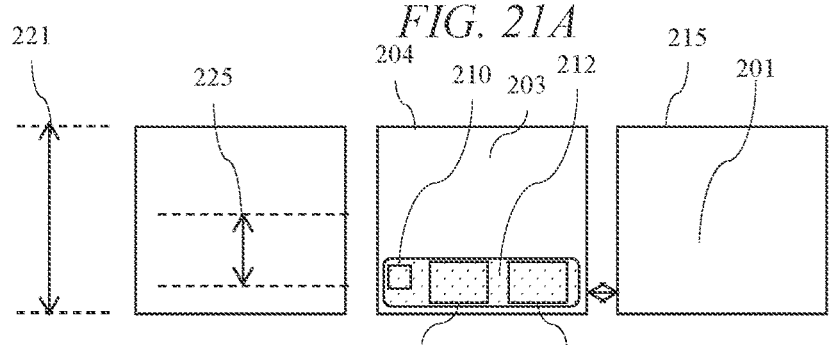
Figure 22:
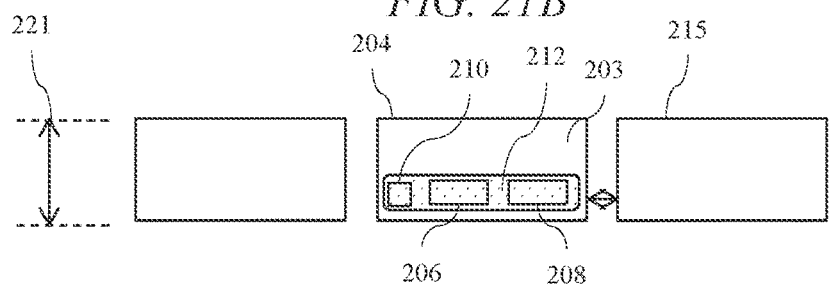

FIGS. 21A, 21B, and 22 are schematic diagrams illustrating front views of LED package arrays with increased array package luminous emittance, APLE 220 in comparison to the arrangement of FIG. 16. The package height 221 may be the same as shown in FIG. 16, so that the size of the heat slugs 260, 262 remain substantially unchanged and the thermal properties are equivalent. In a first APLE 220 increase step, the gap 218 between the packages 204, 215 may be reduced, correspondingly reducing 214 as will be described below.

Further, the height 201 of the well 205 may be reduced to be similar to the height of the LED 206, 205. A light emitting diode package 204 for a directional display apparatus 100 may thus comprise at least one light generation element 206 arranged to generate light in an emission band and a wavelength conversion material 212 arranged to convert at least some of the light in the emission band generated by the light generation element 206 into light in a conversion band; and the at least one light generation element 206 and wavelength conversion material 212 are arranged in a well 205 with a lateral extent in a first direction (y-axis) greater than the lateral extent in a second direction (z direction) that is orthogonal to the first direction; wherein height 201 of the well 205 in the second direction is less than 150% of the height 223 of the light generation element 206 in the second direction. Further the height 201 of the well 205 in the second direction may be less than 125% of the height 223 of the light generation element 206 in the second direction. Further the light emitting diode package may comprise at least two light generation elements 206, 208 arranged as an array in the first direction (y axis) with the same height 223 and position in the second direction (z axis).

Advantageously the APLE 220 of the device can be increased. In an illustrative example and with reference to FIG. 17, for the same maximum drive current, the point 234 can be moved to point 238 and thus within region 226. Such a change can be achieved from reducing the height 201 of the well 205 from 1.0 mm to 0.4 mm with reference to FIG. 16 and FIG. 18A. The LED 206 height may remain the same size, for example 350 microns, with a total chip area of 620×350 microns. The well height may be 400 microns so that the ratio of heights 201 to height 223 is 114%. The thickness of phosphor material 212 may be adjusted to compensate for the loss of phosphor area while maintaining color temperature of the combined output. The package length may be reduced from 3 mm to 2 mm and the gap 218 may be reduced from 0.5 mm to 0.2 mm. Such modifications may achieve a maximum APLE 220 of 25 lm/mm with a well height 201 of 0.4 mm.

FIG. 21B illustrates that the position of the light emitting aperture in the package may be displaced vertically (z axis) by distance 225 so that the light emitting elements may be arranged to one side of the package as will be described below.

FIG. 22 illustrates a further embodiment wherein the LEDs 206, 208 have a height reduced to 175 microns, with the same LED length, thus reducing the achievable luminous flux to approximately half. Further the height 201 of the well 205 is reduced to 0.2 mm. Such an arrangement may achieve a location point 236 on the graph of FIG. 17. An APLE 220 of 13 lm/mm on a 4" display of the present illustrative embodiment.

Advantageously the present embodiments may achieve desirable levels of contrast and perceived display brightness with viewing outdoors images in brightly illuminated environments.

Figures 23, 24:
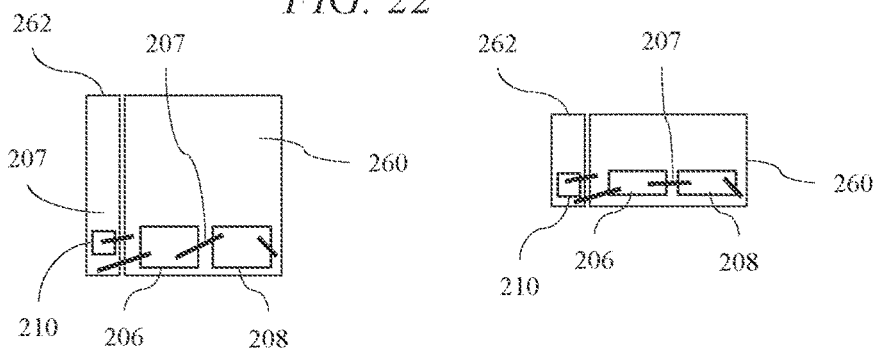
FIGS. 23-24 are schematic diagrams illustrating front views of heat sink arrangements for the packages of FIGS. 21B and 22 respectively, in accordance with the present disclosure.

FIGS. 23-24 are schematic diagrams illustrating front views of heat sink arrangements for the packages of FIGS. 21B and 22 respectively. The heat slugs 262, 260 have nominally the same thermal resistance compared to those of FIG. 18B and thus the thermal performance may be similar. Using the packaging approach of FIG. 18A, the wire bonds are arranged within the well 205 and thus the amount of space available for attachment may be somewhat restricted. It may be desirable to increase the space available for wire bonding in such packages thus achieving high APLE 220 for thin optical valves.

Figure 25A:
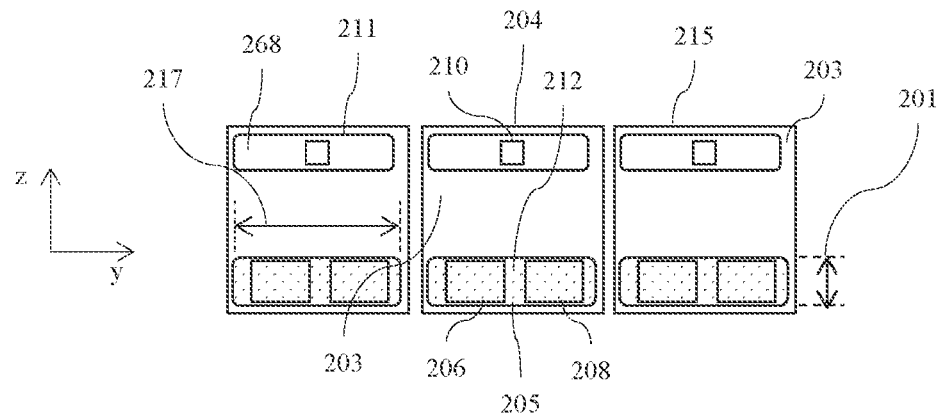
FIGS. 25A-25B are schematic diagrams illustrating front views of LED package arrays with increased array package luminous emittance, in accordance with the present disclosure.

FIGS. 25A-25B and 26A-26E are schematic diagrams illustrating front views of LED package arrays with increased array package luminous emittance, APLE 220. As shown in FIG. 25A, LEDs 206, 208 are arranged in first well 205 and the protection diode 210 may be arranged in a second well 211 in the packaging body 203 that may comprise a material 268 covering the protection diode 210. As the protection diode 210 is arranged in well 211 that is different from the well 205, it can be laterally displaced. Advantageously when used in combination with a waveguide, the protection diode may be placed outside the input side 2 of the waveguide 1 so that the area of the input aperture that can be occupied by light emitting elements 206 can be increased, and thus the APLE 220 can be increased.

The first well 205 may have lateral extents in first direction (y-axis) and second direction (z-axis) that are orthogonal to each other, the lateral extent in the first direction being greater than the lateral extent in the second direction, and the second well 211 being displaced from the first well 205 in the second direction. In other words the at least one light generation element such as LED 206 and wavelength conversion material 212 may be arranged in a first well 205 with a lateral extent 217 in a first direction (y axis) greater than the lateral extent in a second direction (z-axis) that is orthogonal to the first direction; and the protection diode 210 is arranged in a second well 211 that is displaced from the first well 205 in the second direction. The lateral extent of the first well 205 in the second direction may be less than 150% of the lateral extent of the light generation element 206 in the second direction.

For convenience of manufacture the material 268 may be the same as the material 212 used in the well 205, or may be a different material such as an opaque silicone material arranged to protect the diode 210.

Thus a light emitting diode package 204 for a directional display apparatus may comprise a body 203 of packaging material; at least one light generation element 206 arranged to generate light in an emission band; and a protection diode 210; wherein the at least one light generation element 206 is arranged in a first well 205 in said body 203, and the protection diode 210 is not arranged in the first well 205.

Figure 26A:
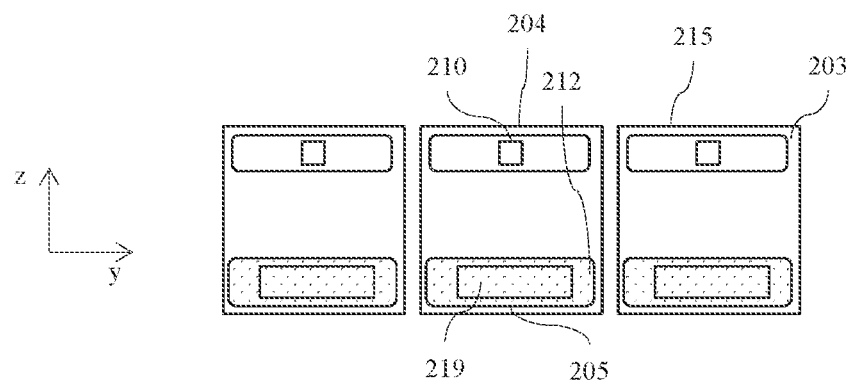
FIGS. 26A-26E are schematic diagrams illustrating front views of LED package arrays with increased array package luminous emittance, in accordance with the present disclosure.

FIG. 26A shows that a single extended LED 219 may be used in place of the at least two light generation elements 206, 208 arranged as an array in the first direction whereas FIG. 25A shows that the at least two light generation elements 206, 208 have the same lateral extent and position in the second direction.

Figure 25B:
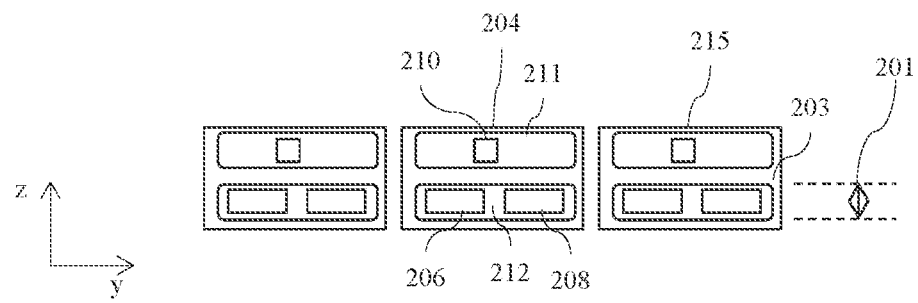

Advantageously the space available for the LEDs 206, 208 is increased for wire bonding purposes as will be described below. FIGS. 25A-B are similar in structure to FIGS. 21B and 22 respectively, whereas FIG. 26A comprises a single extended LED 219. Advantageously the single chip 219 requires fewer wire bonds. However, to achieve the appropriate luminous flux, the current may be increased and the output degraded due to current crowding and increased thermal loading within a single large chip.

The first well 205 may contain a material covering the at least one light generation element 206, which material is a transparent material or a wavelength conversion material 212 arranged to convert at least some of the light in the emission band generated by the light generation element 206 into light in a conversion band. For example the material contained in the first well 211 may be said wavelength conversion material 212, the emission band being blue light and the conversion band being yellow light. The material 212 contained in the first well 211 may be said wavelength conversion material and may be a phosphor or a quantum dot material.

Figure 26B:
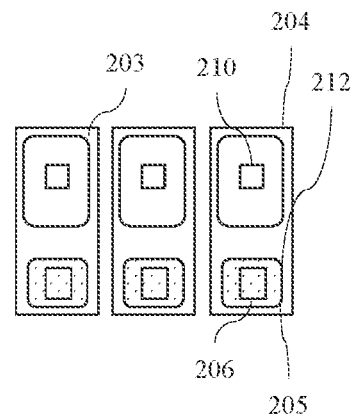

FIG. 26B shows an alternative arrangement wherein the height of the package is greater than the spacing 214 between the packages. Advantageously the size of the heat slugs can be maintained, but the spacing further reduced. Such an arrangement may be desirable in autostereoscopic displays to reduce the spacing between individually addressable LEDs, increasing the uniformity of observer tracking in such displays.

Figure 26C:
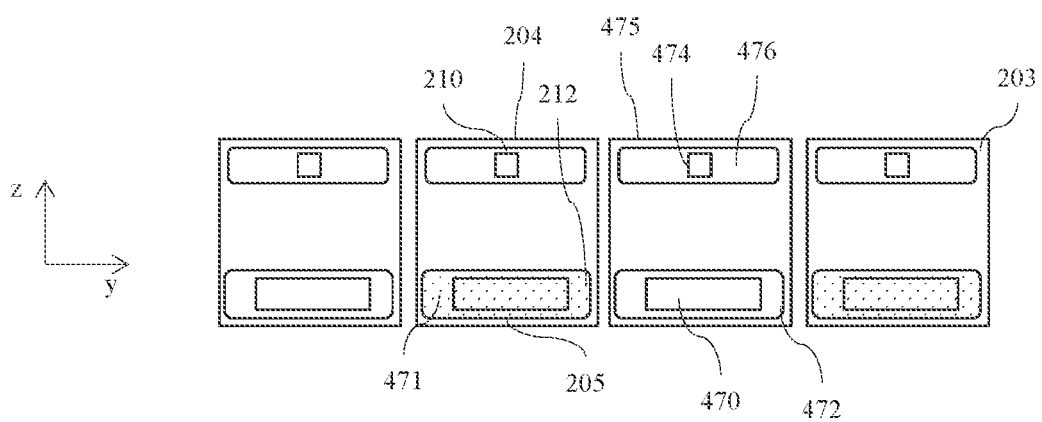

FIG. 26C shows a further arrangement wherein the light emitting elements comprise different means to generate white light. Further LEDs may be provided that comprise red emitting LEDs 470 in well 472 that may comprise an encapsulant 473 that may be transparent. Further diode 474 and respective well 476 may be provided for emitting element 470 in well 472. The phosphor 471 in the package 204 may comprise a wavelength conversion material arranged to provide a green output, so that cyan light is emitted by the package 204 in combination with a blue emission light emitting element. In combination, LED packages 204, 475 may produce white light output. Diffusers in the remainder of the optical system may combine the optical distribution across the display area.

Figures 26D, 26E:
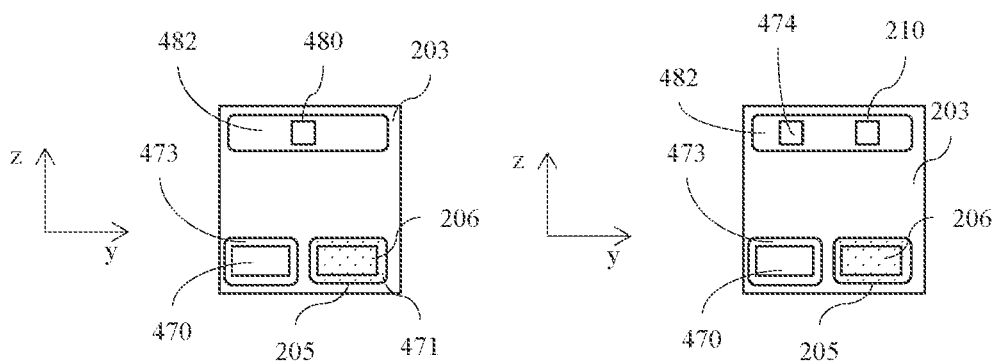

FIG. 26D shows a single package that may be provided with chips 470, 206 and a single protection diode 480 in well 482. Advantageously the color uniformity in the output of the display may be improved. FIG. 26E shows a further embodiment wherein separate protection diodes 210, 474 are provided for the respective LEDs 206, 470, to provide increased ESD protection.

FIGS. 27A-27E are schematic diagrams illustrating front views of LED package assembly steps for the package of FIG. 25A and FIGS. 28A-28E and 29A-29E are schematic diagrams illustrating side views of LED package assembly steps for the package of FIG. 25A. FIGS. 28A-E represent side views in cross section A-A' whereas FIGS. 29A-29E represent side views in cross section B-B'.

Figure 28A:
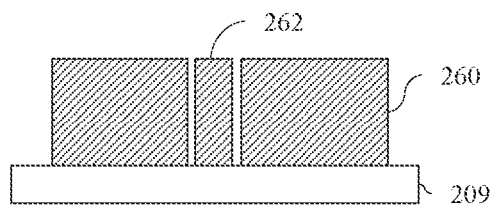
FIGS. 28A-28E are schematic diagrams illustrating side views of LED package assembly steps for the package of FIG. 25A, in accordance with the present disclosure.
Figure 28B:
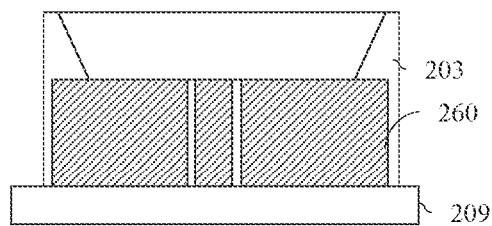
Figure 28C:
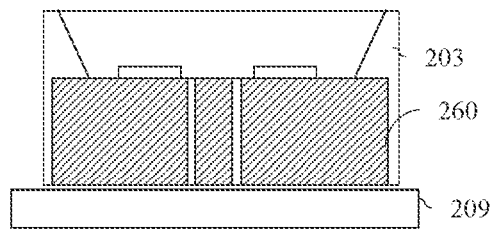
Figure 28D:
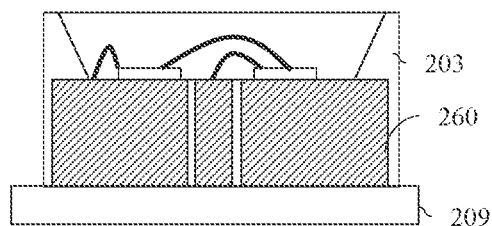
Figure 28E:
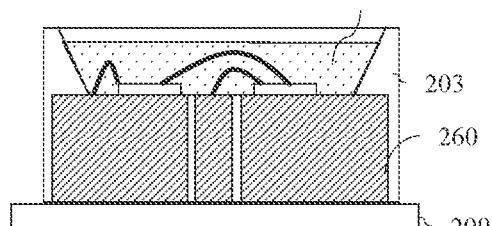
Figure 28F:
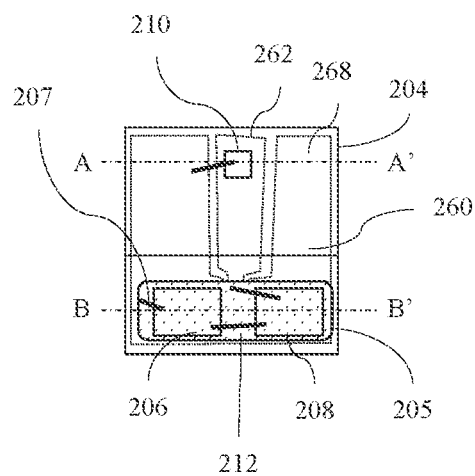
FIG. 28F is a schematic diagram illustrating a front view of an LED package wherein the protection diode is not arranged in a well in the body of the package, in accordance with the present disclosure.
Figures 28G, 28H:
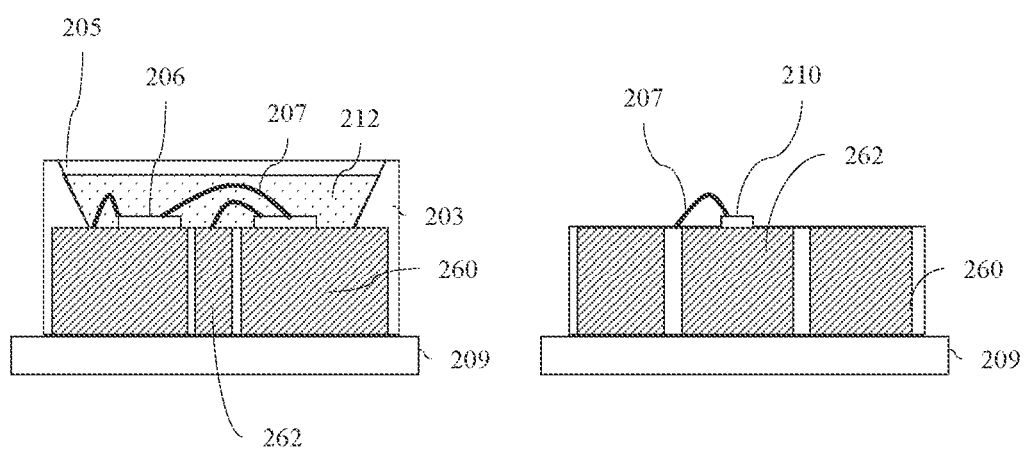
FIGS. 28G-28H are schematic diagrams illustrating side views of an LED package wherein the protection diode is not arranged in a well in the body of the package, in accordance with the present disclosure.

FIGS. 28F is a schematic diagram illustrating a front view of an LED package 204 wherein the protection diode 210 is not arranged in a well in the body 203 of the package 204 and FIGS. 28G-28H are schematic diagrams illustrating side views of an LED package 204 wherein the protection diode 210 is not arranged in a well in the body 203 of the package 204.

Thus the light emitting diode package 204 may further comprise at least two conductive heat slugs 260, 262, the at least one light generation element 206 being located on a first one of the heat slugs 260, the protection diode 210 being located on a second one 262 of the heat slugs, and the first and second heat slugs 260, 262 extending underneath the first well 205; wire bonds 207 connecting the at least one light generation element 206 and the protection diode 210 to the first and second heat slugs 260, 262, the wire bonds 207 that connect the at least one light generation element 206 to the first and second heat slugs 260, 262 being located in the first well 205.

Figure 29A:
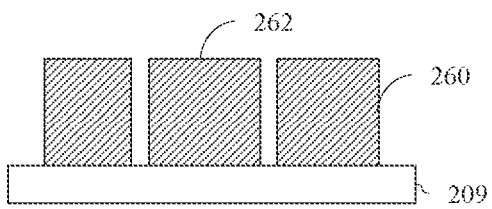
FIGS. 29A-29E are schematic diagrams illustrating side views of LED package assembly steps for the package of FIG. 25A, in accordance with the present disclosure.
Figure 29B:
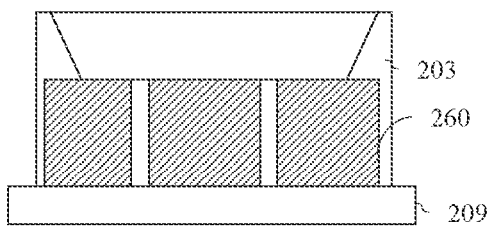
Figure 29C:
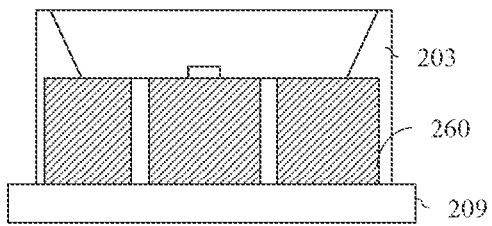
Figure 29D:
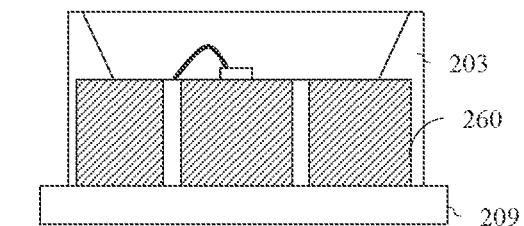
Figure 29E:
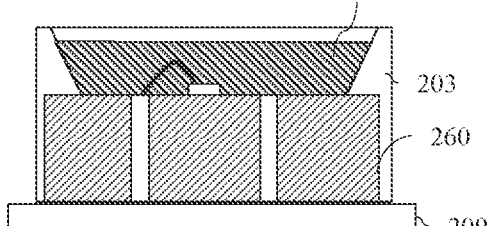

FIGS. 27A, 28A and 29A show a first assembly step wherein heat slugs 260, 262 are formed with slug 262 comprising male bond pad region 263 and slug 260 comprising corresponding female region, with an insulating gap provided therebetween. FIGS. 27B, 28B and 29B show a second step wherein package 204 with first well 205 and second well 211 are formed from body 203. In the third step shown in FIGS. 27C, 28C and 29C, LEDs 206, 208 and protection diode 210 are attached to electrodes 260, 262 respectively and in FIGS. 27D, 28D and 29D, wire bonds are applied within the respective wells 205, 211. Region 263 comprises a wire bond to slug 262 from LED 208 within the well 205. In FIGS. 27E, 28E and 29E, well 205 is filled with wavelength conversion material 212 in the conventional manner. Well 211 may be left empty, may be filled with the same material 212 or may be filled with a further stabilizing encapsulant material to reduce cost and increase ruggedness of the wire bonds for the protection diode 210.

Advantageously the APLE 220 may be increased for outdoors operation in thin packages while providing bonding pad regions that are large enough for conventional handling equipment and wire bond encapsulation to achieve desirable device ruggedness.

The arrangements of FIGS. 28F-28H are provided so that the protection diode 210 is not arranged within a well. The wire bonds 207 to the protection diode 210 may be larger than those shown in FIG. 29E for example to provide increased robustness during handling. Alternatively the protection diode may be a flip chip device with attachment to the connection electrodes by means of conductor/insulator patterning on the surface of the heat slugs 260, 262 respectively.

Figure 30A:
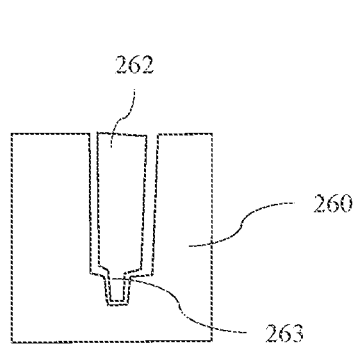
FIGS. 30A-30E are schematic diagrams illustrating front views of alternative LED package assembly steps for the package of FIG. 25A, in accordance with the present disclosure.
Figure 30B:
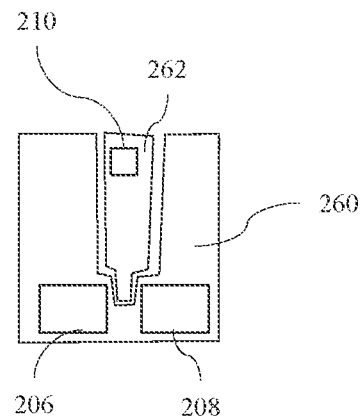
Figure 30C:
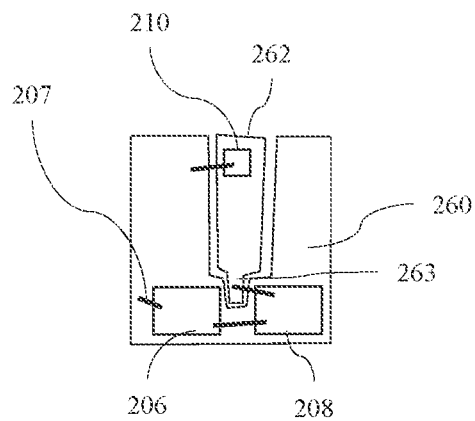
Figure 30D:
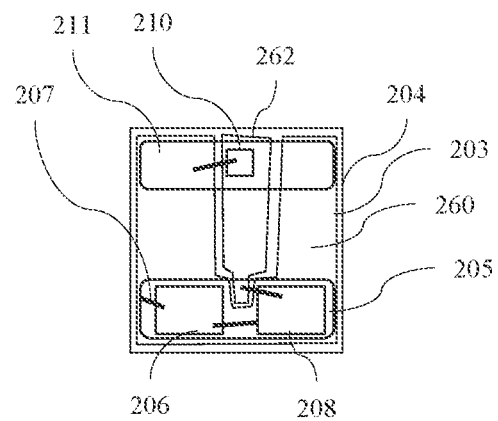
Figure 30E:
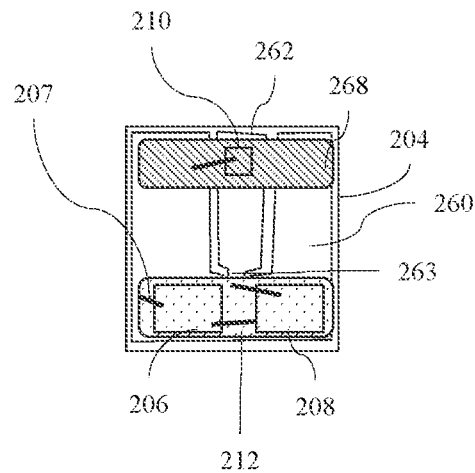

FIGS. 30A-30E are schematic diagrams illustrating front views of alternative LED package assembly steps for the package of FIG. 25A. In FIG. 30B, LEDs 206, 208 and protection diode 210 are mounted prior to wire bonding in FIG. 30C and forming of package 204 with body 203 in FIG. 30D to achieve substantially the same structure 30E as shown in FIG. 27E.

The protection diode 210 is typically not required for operation of the LEDs 206, 208; however during handling of the individual packages 204 and completed array 15 it is desirable to reduce potential device failure from ESD. Further, the diode 210 may be arranged outside the well 205 but may not necessarily be arranged in a separate well as illustrated in FIGS. 31A-31D which are schematic diagrams illustrating front views of an LED package array assembly steps.

Figure 31A:
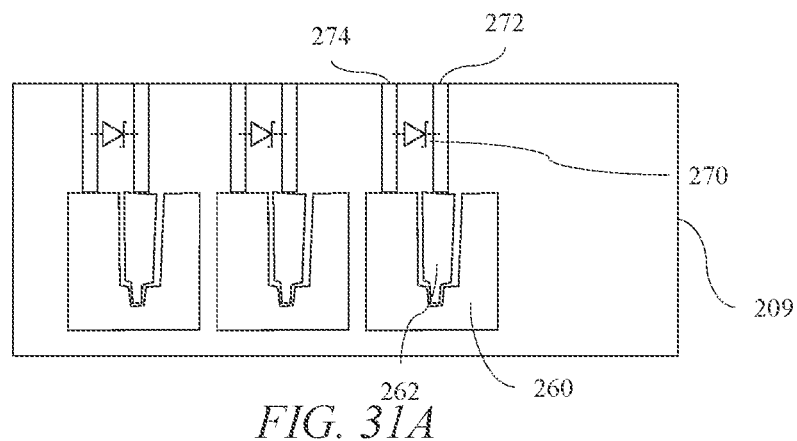
FIGS. 31A-31D are schematic diagrams illustrating front views of an LED package array assembly steps, in accordance with the present disclosure.

In a first step shown in FIG. 31A, a substrate 209 is provided with protection diode 270 and electrodes 272, 274 that are connected to heat slugs 260, 262 respectively. An insulator layer may be provided on substrate 209. The substrate 209 may further comprise the side of the display device such as substrate 850 of FIG. 14 for example.

Figure 31B:
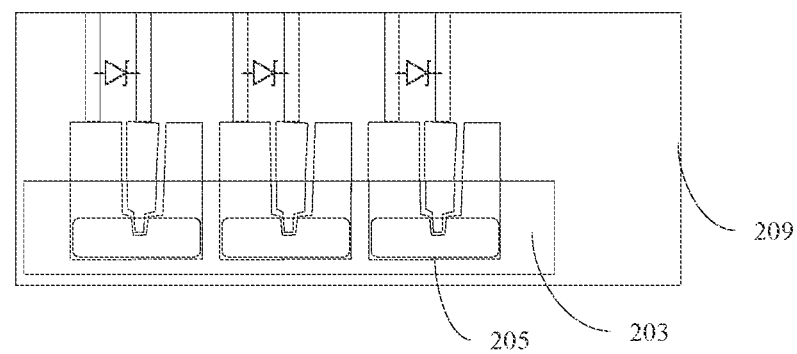
Figure 31C:
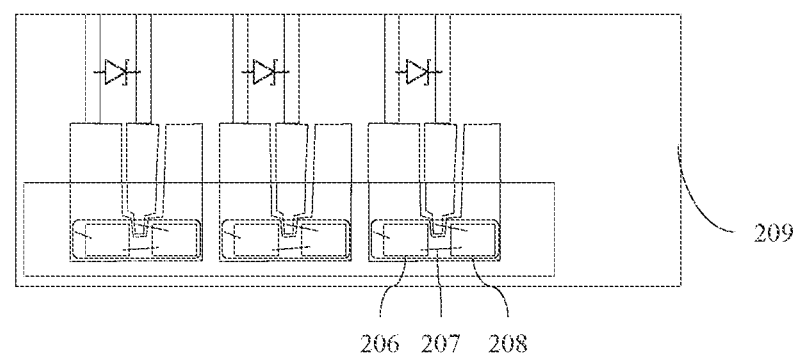
Figure 31D:
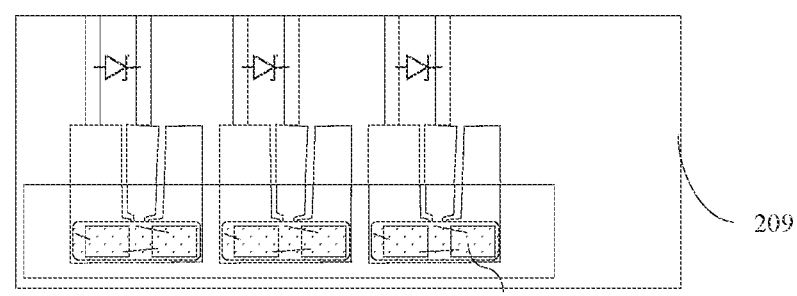

In a second step shown in FIG. 31B an array of wells 205 may be formed in body 203 in the desired emitting region for the array 15. FIG. 31C shows a third step wherein LEDs 206, 208 and wire bonds 207 are provided within the wells 205 and in a fourth step of FIG. 31D the wavelength conversion material is provided as an encapsulant.

Figure 32:
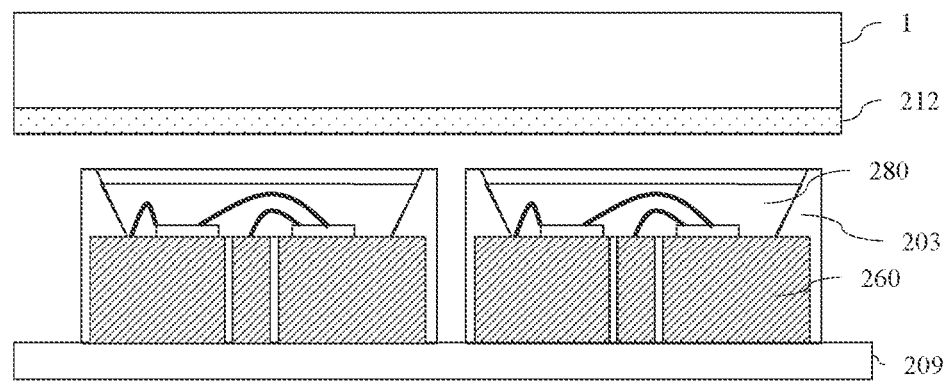
FIG. 32 is a schematic diagram illustrating a side view of an LED package with transparent encapsulant and separate phosphor layer, in accordance with the present disclosure.

FIG. 32 is a schematic diagram illustrating a side view of an LED package with transparent encapsulant and separate phosphor layer. In further embodiments the wavelength conversion material 212 may be exchanged for an encapsulant material 280 that may be transparent. The wavelength conversion material 212 may be provided by a separate layer, for example on the input side of the optical valve or as a linear plate arranged with the output aperture of the wells 205. Thus a light emitting diode package for a directional display apparatus may comprise at least one light generation element arranged to generate light in an emission band; and a protection diode; wherein the at least one light generation element is arranged in a first well with a lateral extent in a first direction greater than the lateral extent in a second direction that is orthogonal to the first direction; the protection diode is arranged in a second well that is displaced from the first well in the second direction.

The arrangement shows the parallel assembly of an array of LED packages on an array substrate 209. Advantageously small spacing can be achieved between each addressable LED and thus high APLE with small well height. With large numbers of elements on the array, such a process may have relatively low production yield. It may be desirable to provide array using separate packages with small spacing between the LED packages.

Figure 33A:
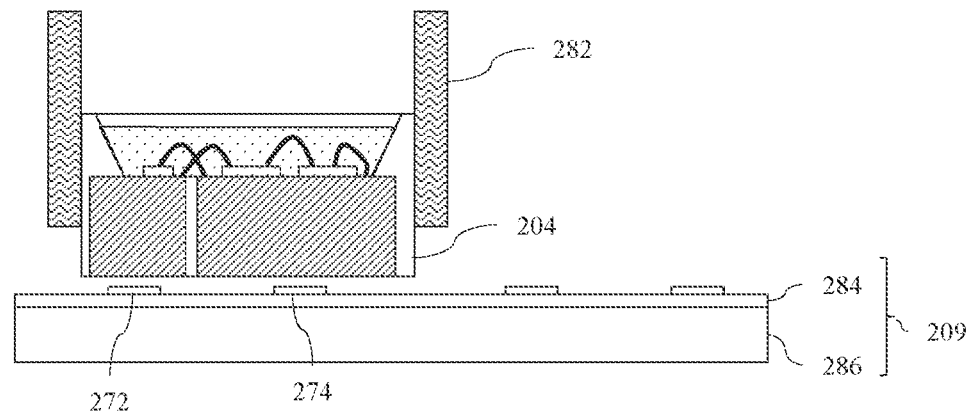
FIGS. 33A-33B are schematic diagrams illustrating side views of an LED package array assembly steps, in accordance with the present disclosure.
Figure 33B:
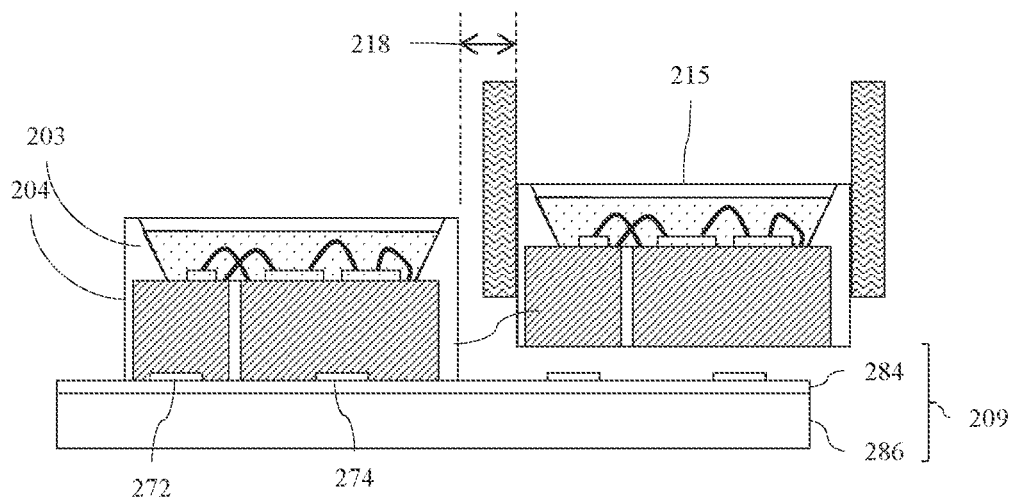

FIGS. 33A-33B are schematic diagrams illustrating side views of assembly steps for an LED package array. Substrate 209 may comprise thermally conducting substrate 286, dielectric layer 284 and array of electrodes 272, 274. Pick and place handling frame 282 has a width and access specification that may limit the minimum spacing 218 between the respective packages 204, 215, thus increasing the APLE 220 that may be achieved.

Figure 34A:
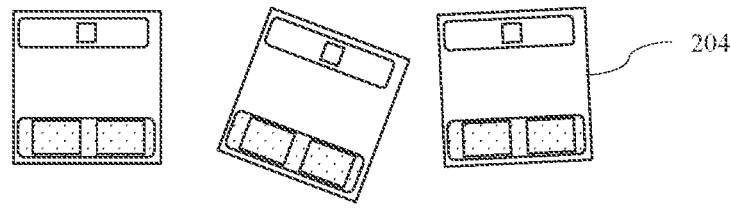
FIGS. 34A-34D are schematic diagrams illustrating front and side views of an LED package array assembly steps, in accordance with the present disclosure.
Figure 34B:
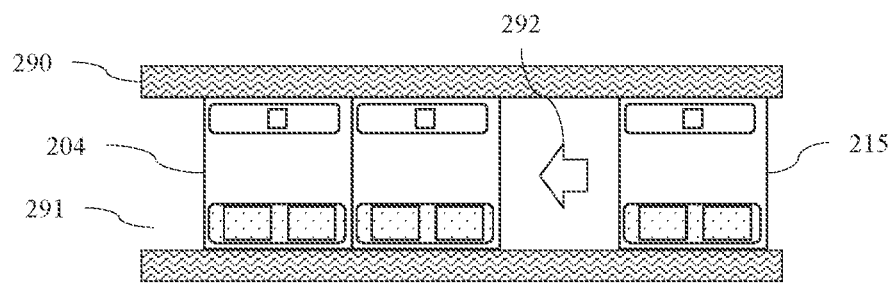
Figure 34C:
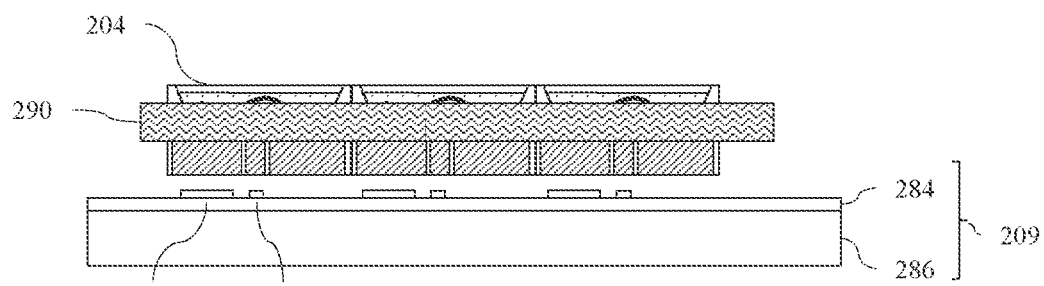
Figure 34D:
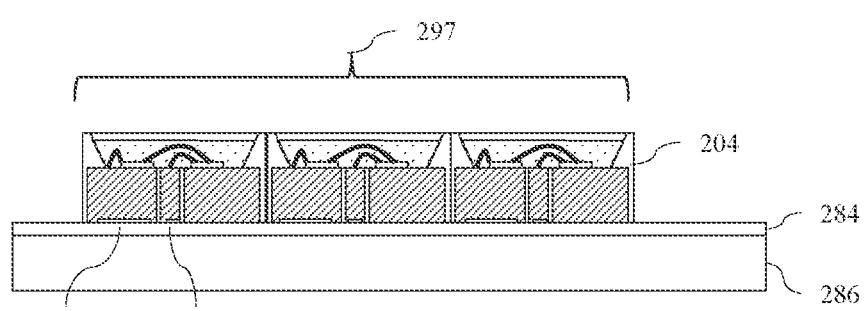

FIGS. 34A-34D are schematic diagrams illustrating front and side views of an LED package array assembly steps. In a first step of FIG. 34A, separate packages 204 are provided. In a second step a frame 290 is arranged to provide a linear array of packages 204. By sliding packages in direction 292 into a slot 291 in the holder 290. The holder 290 may for example comprise a metal or polymer tool of length the same as the array length, which may for example be the same as the width of the optical valve in the y direction. FIGS. 34C and 34D show in side view the attachment of the package 204 array 297 to the substrate 209. Thus a method of forming an array of light emitting diode packages may comprise using a linear holder 290 comprising a slot 291 capable of receiving a line of light emitting diode packages 204, the method comprising: disposing the light emitting diode packages 204 in the slot of the holder 290; aligning the linear holder 290 with an array substrate 209; providing solder 272, 274 and thermal connection between the array of light emitting diode packages 204 and the array substrate 209; and removing the linear holder 290.

Advantageously increased APLE can be achieved from separate packages. The soldering of the array may take place in parallel, further reducing cost and takt time, particularly desirable in arrays of relatively large numbers of LEDs. The individual packages may be tested prior to array assembly for color, luminous flux, voltage, efficiency and other desirable characteristics that may be matched prior to array assembly.

FIGS. 35A-35B are schematic diagrams illustrating front views of some of the assembly steps for an LED package array. It may be desirable to provide some small gaps between the packages 204 of the array 15. Such gaps may be provided by molded lugs 292 as shown in FIG. 35A in an individual package 204 and in assembled array as shown in FIG. 35B. Advantageously space for thermal expansion of the LEDs during operation can be provided to reduce stress on the individual packages 204. Further heat transmission between adjacent packages may be reduced. Thus the method of forming an array of light emitting diode packages 204 may comprise light emitting diode packages 204 that have lugs 292 arranged to provide a controlled spacing in the linear holder 290.

FIG. 36 is a schematic diagram illustrating a side view of a conventional waveguide and aligned LED. The LED package height 221 may be substantially the same as the waveguide 150 input aperture height. Such an arrangement is desirable, as shown in FIG. 13A, the LEDs may be arranged under the bezel 194 of the display 48 such as an LCD panel.

Figure 37A:
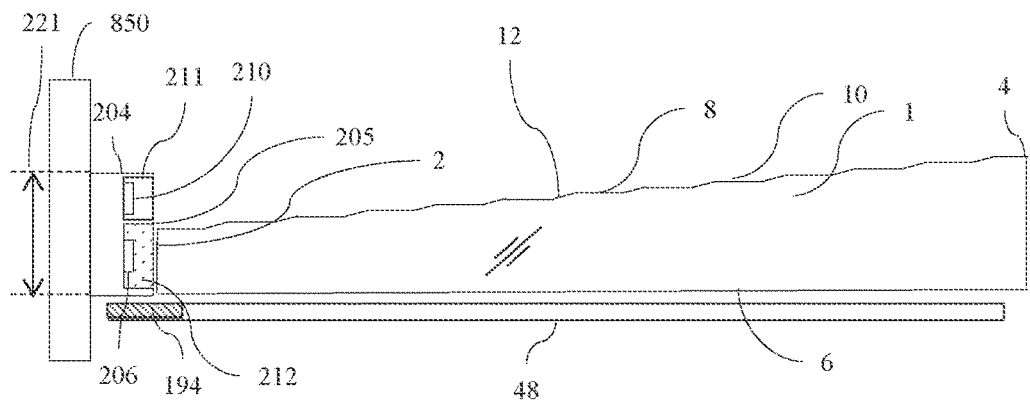
FIG. 37A is a schematic diagram illustrating a side view of an optical valve and aligned LEDs, in accordance with the present disclosure.

FIG. 37A is a schematic diagram illustrating a side view of an optical valve and aligned LEDs. A directional backlight for a directional display apparatus may thus comprise a light emitting diode array such as that shown in FIG. 34D, a waveguide 1 comprising an input end 2 arranged to receive input light from the light emitting diode array 297 at respective input positions, first and second, opposed guide surfaces 6, 8 for guiding input light along the waveguide, and a reflective end 4 for reflecting input light back through the waveguide 1, the second guide surface 8 being arranged to deflect light after reflection from the reflective end 4 as output light through the first guide surface 6, and the waveguide 1 being arranged to direct the output light into optical windows in output directions that are distributed in a lateral direction in dependence on the input position of the input light. The first guide surface 6 may be arranged to guide light by total internal reflection and the second guide surface 8 comprises a plurality of light extraction features 12 oriented to direct light guided through the waveguide 1 in directions allowing exit through the first guide surface 6 as the output light and intermediate regions 10 between the light extraction features 12 that are arranged to guide light through the waveguide 1.

Figure 37B:
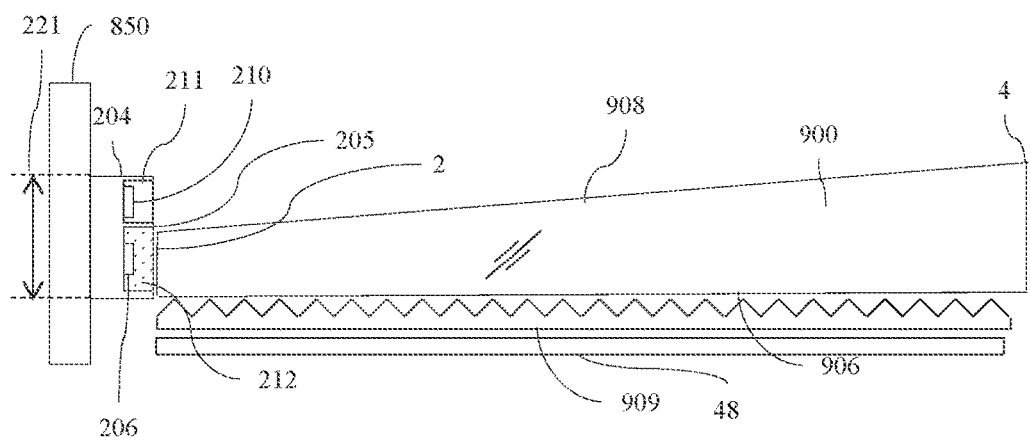
FIG. 37B is a schematic diagram illustrating a side view of an optical wedge backlight and aligned LEDs, in accordance with the present disclosure.

FIG. 37B is a schematic diagram illustrating a side view of an optical wedge backlight and aligned LEDs The first guide surface 906 may arranged to guide light by total internal reflection and the second guide surface 906 is substantially planar and inclined at an angle to direct light in directions that break that total internal reflection for outputting light through the first guide surface 908, and the display device further comprises a deflection element 909 extending across the first guide surface 908 of the waveguide 900 for deflecting light towards the normal to the first guide surface 908.

Further a directional display apparatus may comprise a directional backlight as described herein and a transmissive spatial light modulator 48 arranged to receive the output light from the first guide surface 8 or 908 of the waveguide 1 or 900 and to modulate it to display an image.

The package height 221 may be greater than the input aperture size of the optical valve 1. Further the well 205 is offset towards the edge of the package 204 as shown in FIG. 21B by distance 225 so that the rear of the package is behind the optical valve 1 and does not interfere with the display 48. Further package 204 may be attached to the side wall 850 of the display device as shown in FIG. 14. Advantageously the bezel region is smaller in the optical valve than the conventional backlight due to the region near to the LEDs not extracting light on the first pass through the valve.

Figure 38:
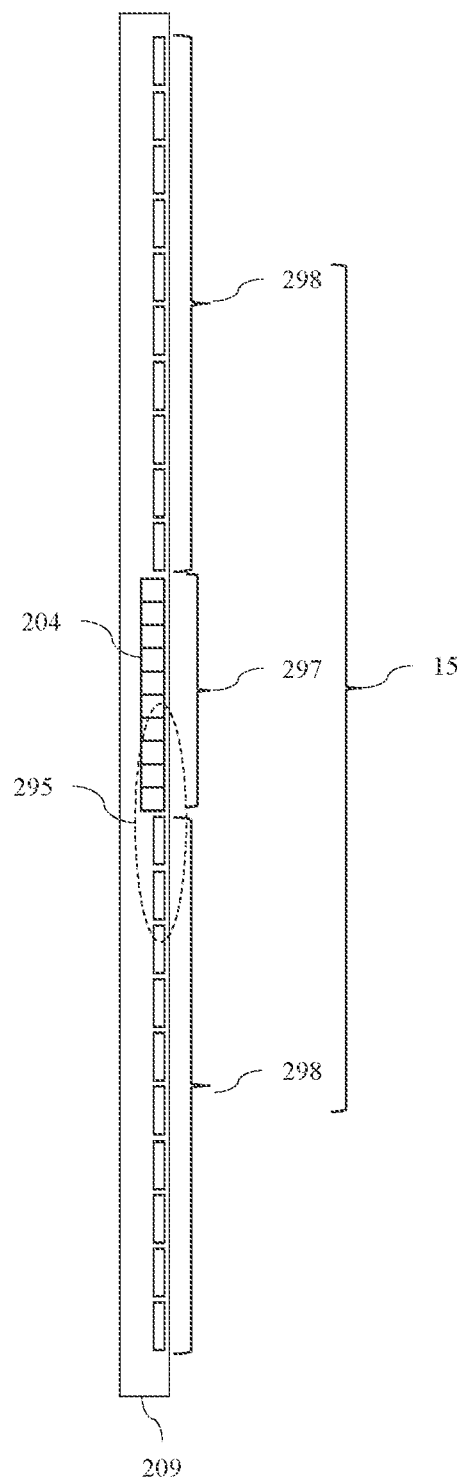
FIGS. 38-39 are schematic diagrams illustrating a side view of a LED array comprising mixed APLE regions, in accordance with the present disclosure.
Figure 39:
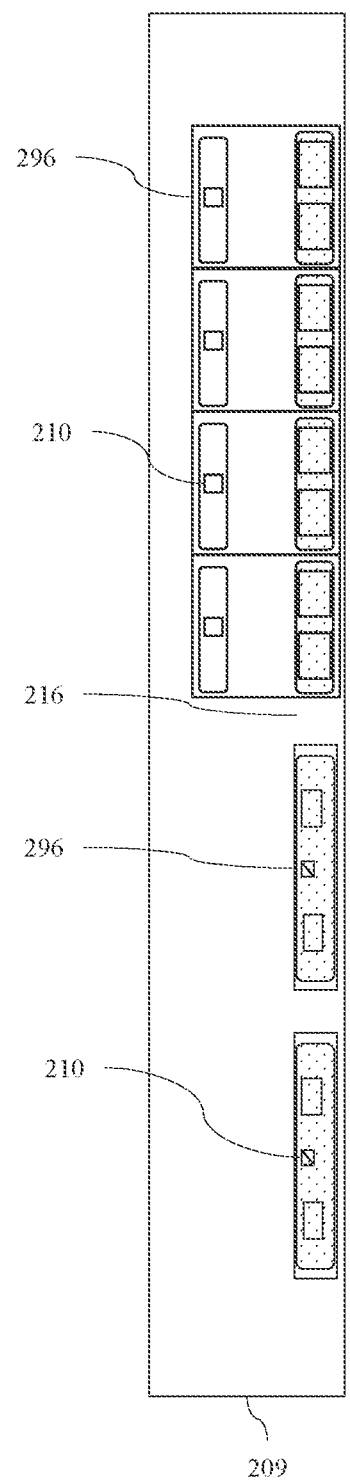

FIGS. 38-39 are schematic diagrams illustrating a side view of a LED array comprising mixed APLE packages. The array may comprise a second array 298 of light emitting diode packages 204, the first array 297 and second array 298 of light emitting diodes having luminous emittances per unit length that are different from each other. A light emitting diode array for a directional display apparatus, may thus comprise a first array of light emitting diode packages 204, each being a light emitting diode package as described herein, being arrayed linearly. Central region 297 may have high APLE capability whereas outer LEDs in regions 298 may have lower APLE. FIG. 39 is a detail of region 295 of FIG. 38 and illustrates that the outer LEDs may comprise conventional arrangements consistent with APLE 220 operation on line 222 of FIG. 17 for example, whereas the LED packages in the central region 297 may have APLE 220 in the region 226 of FIG. 17 for example. Further fewer LEDs may be employed in the outer regions 298. Advantageously the cost of the array may be reduced while achieving high contrast in brightly lit environments. Further the mean time between failure of the array assembly can be reduced by reducing the total number of LED packages in the array. Further the flicker for a moving observer can be reduced in such directional displays that incorporate head tracking, as there may be more optical windows within the viewing window, achieving finer control of viewing window structure according to viewer position.

Figure 40:
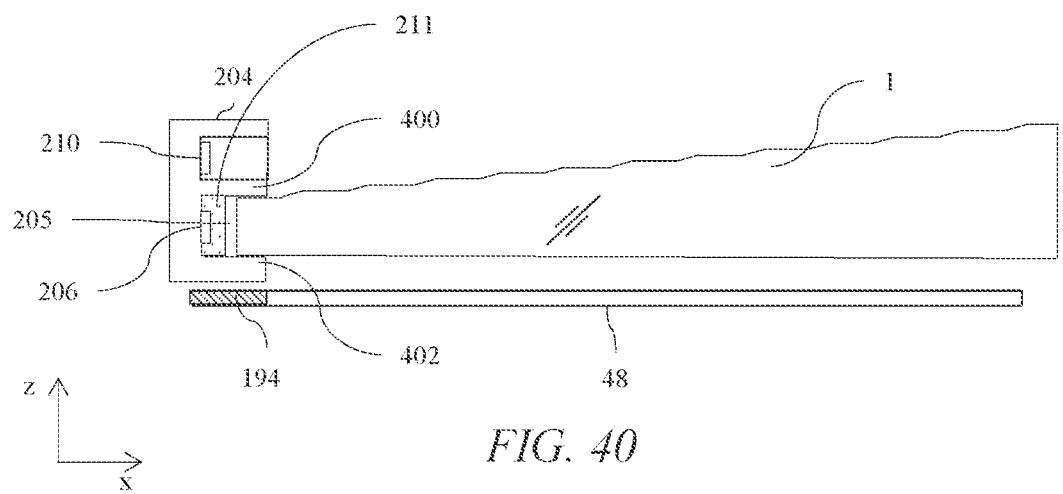
FIG. 40 is a schematic diagram illustrating a side view of an optical valve and aligned LEDs, in accordance with the present disclosure.
Figure 41A:
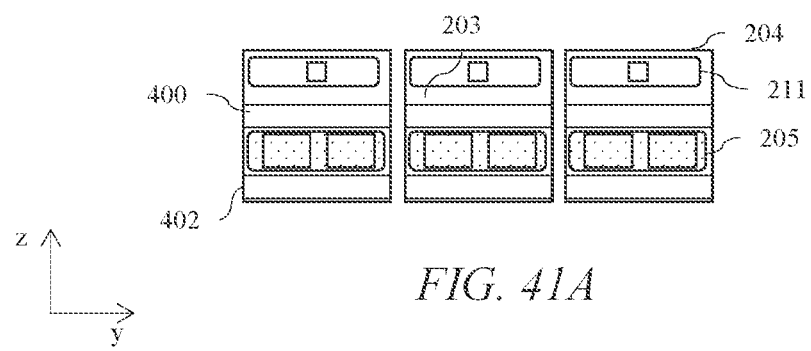
FIG. 41A is a schematic diagram illustrating a front view of the LED array of FIG. 40, in accordance with the present disclosure.
Figure 41B:
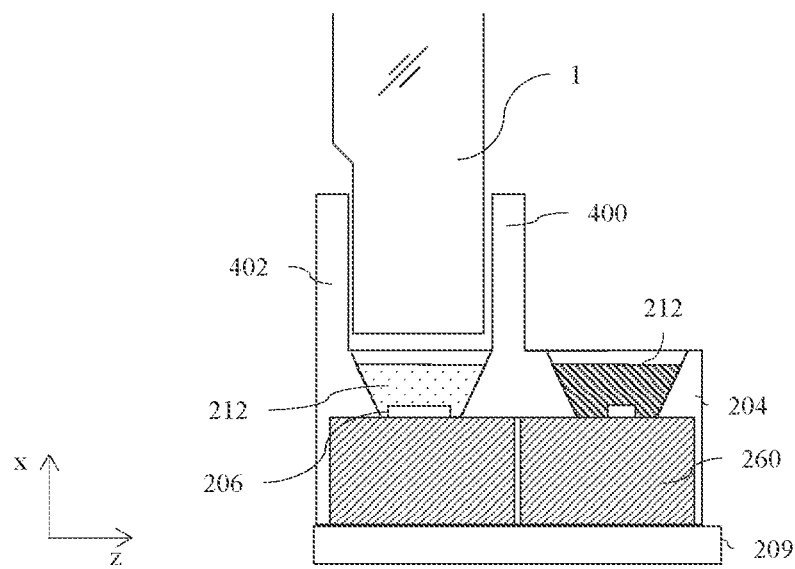
FIGS. 41B-41D are schematic diagrams illustrating side views of the insertion of a waveguide into an LED package, in accordance with the present disclosure.
Figure 41C:
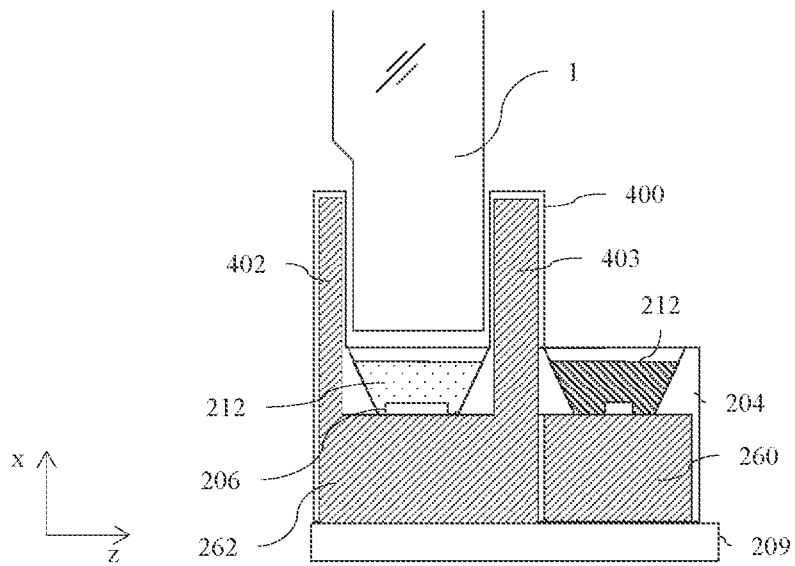
Figure 41D:
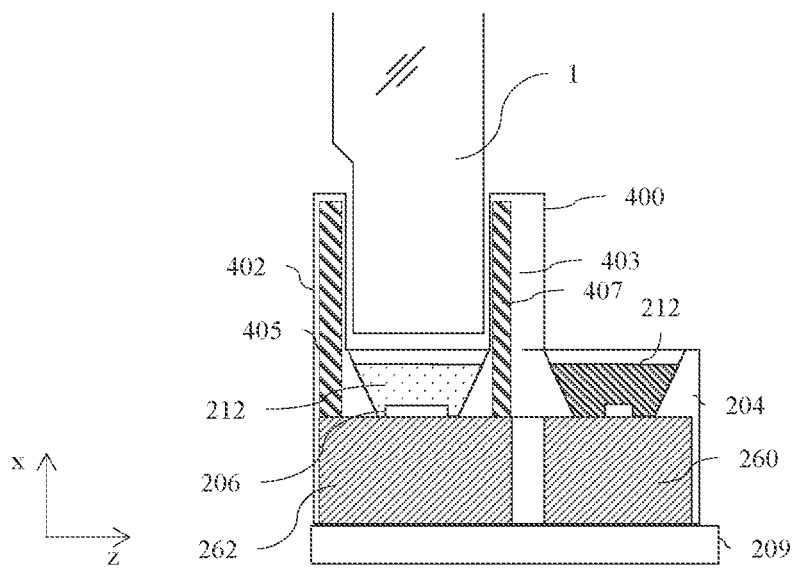

FIG. 40 is a schematic diagram illustrating a side view of an optical valve and aligned LEDs; FIG. 41A is a schematic diagram illustrating a front view of the LED array of FIG. 40; and FIGS. 41B-41D are schematic diagrams illustrating side views of the insertion of a waveguide into an LED package. The well 205 may be provided with a greater depth than shown in previous embodiments and the valve input aperture may be inserted directly into the valve. The light emitting diode package 204 may comprise a pair of walls 400, 402 extending outwardly from the body 203 on opposite sides of the well 205, the walls 400, 402 forming a slot for receiving an input end of a waveguide 1, the protection diode 210 being displaced from the first well 205 laterally of the slot. Advantageously the mechanical coupling between the two may have reduced cost and complexity. Further light loss due to scatter near the injection point of the optical valve may be further reduced, minimizing the size of the bezel, 194 of the display 48. In operation the high luminance mode to achieve acceptable contrast and luminance at high illuminance levels may use substantially higher levels of power on a small number of typically central LEDs in the array 15. If all of the LEDs have the same high power level then excessive battery drain may result.

In FIG. 41B, the mechanical strength of the material of the wall 400 may be limited by the properties of typically used polymeric materials. It may be desirable to further increase the mechanical strength of the walls. FIG. 41C illustrates that the walls 400, 402 may be strengthened by forming the walls 400, 402 from the material 403 of the heat slugs 260, 262. For example the material of the heat slugs 260, 262 may be a ceramic material or may be a metal such as copper. Advantageously mechanical strength may be increased.

Alternatively as shown in FIG. 41D additional members 405, 407 may be attached to the heat slug 262. Advantageously the members 405, 407 may be attached after bonding of the LED 206, reducing the complexity of attachment of the LED 206 and wire bonds where appropriate.

Figure 42A:
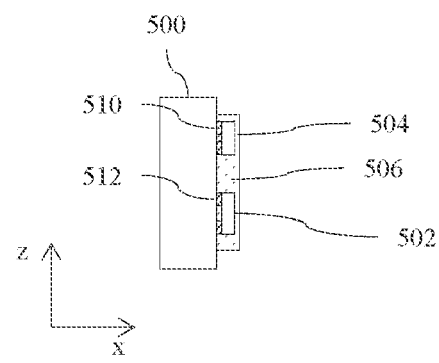
FIGS. 42A-42B are schematic diagrams illustrating side and front views of a LED package comprising flip chip light emission elements, in accordance with the present disclosure.
Figure 42B:
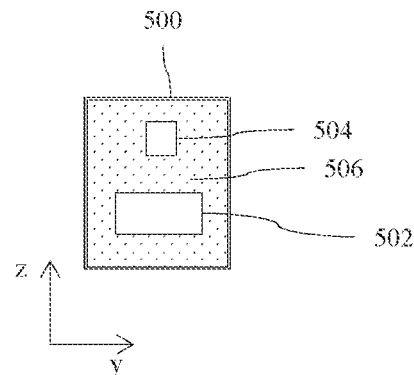

In the present disclosure, the LED package is referred to as at least the combination of light emitting elements 206, wavelength conversion materials, heat slugs 260, 262 and well 205 formed in body 203. FIGS. 42A-42B are schematic diagrams illustrating side and front views respectively of a LED package comprising flip chip light emission elements. Substrate 500 forming a body of the package may comprise heat slugs and electrode connections has flip chip light emitting element 502 with electrodes 512 arranged between the element 502 and substrate 500; and diode 504 with electrodes 510. Conductive and insulating tracking may be arranged to provide electrical contact to the diodes 502, 504. Wavelength conversion layer 506 is coated on the diodes 502, 504.

Figure 42C:
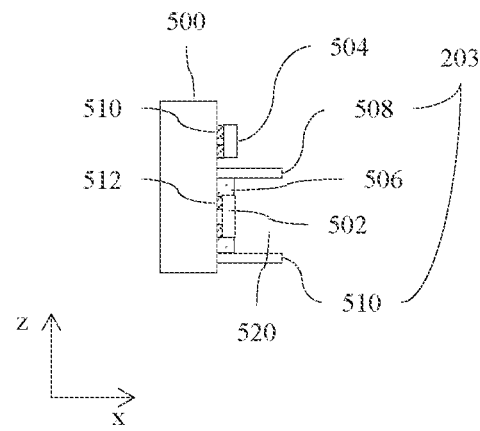
FIGS. 42C-42E are schematic diagrams illustrating side and front views of a LED package comprising flip chip light emission elements further comprising a light emitting well, in accordance with the present disclosure.
Figure 42D:
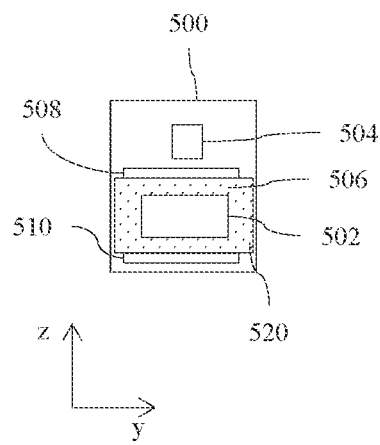
Figure 42E:
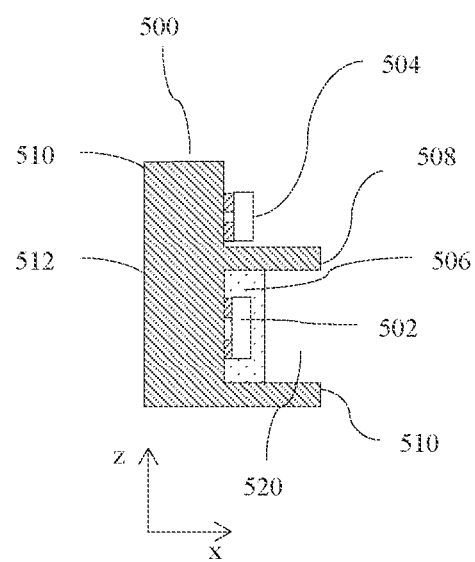

FIGS. 42C-42E are schematic diagrams illustrating side and front views of a LED package comprising flip chip light emission elements 502 further comprising a light emitting well 520 comprising a pair of walls 508, 510 formed on the body 500 extending outwardly from the substrate 500 on opposite sides of a well 520 formed by the walls, the walls 400, 402 forming a slot for receiving an input end of a waveguide 1, the protection diode 210 being displaced from the first well 205 laterally of the slot. Advantageously the efficiency at high luminous flux of the flip chip device can be increased and the robustness of the device enhanced by removing wire bonds 207. The walls 508 may extend across the full lateral direction of the package 500, or may be over a partial width so as to provide convenient electrical connection paths while achieving mechanical alignment of the waveguide 1.

Figure 43:
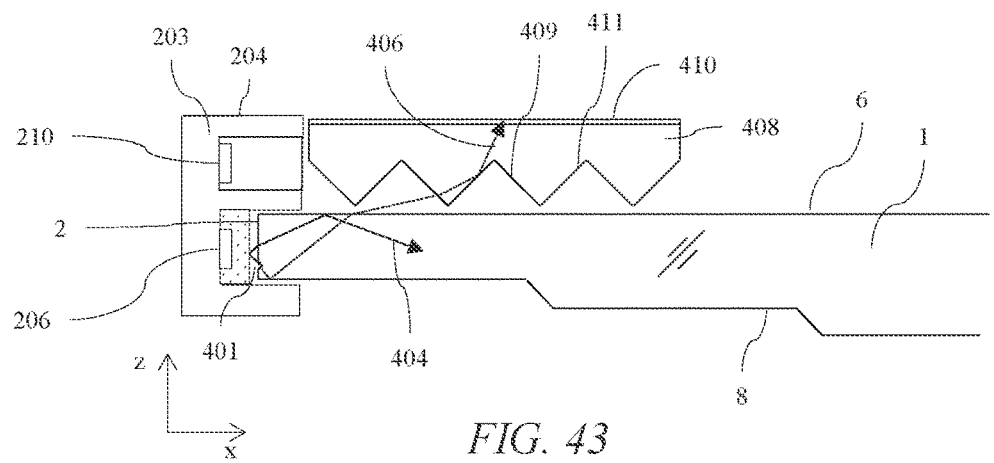
FIGS. 43-45 are schematic diagrams illustrating light shielding arrangements for LED arrays and respective aligned waveguides, in accordance with the present disclosure.
Figure 44:
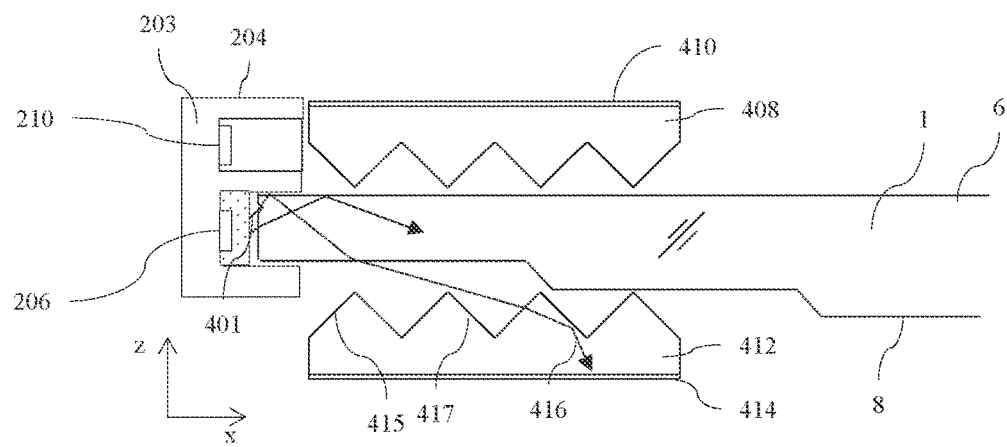
Figure 45:
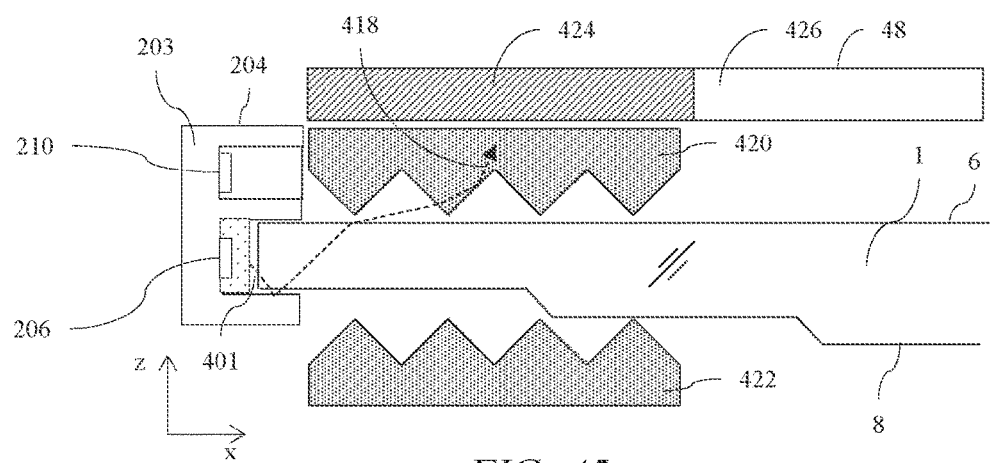

FIG. 42E shows that the walls 508, 510 may be formed from the material used to form the substrate 500, advantageously increasing mechanical strength of the components. FIGS. 43-45 are schematic diagrams illustrating light shielding arrangements for LED arrays and respective aligned waveguides. A directional backlight for a directional display apparatus may comprise: an array 297 of light sources 206 that may comprise packages 204, a waveguide 1 comprising an input end 2 arranged to receive input light from the light emitting diode array 297 at respective input positions, and first and second, opposed guide surfaces for guiding input light along the waveguide, the second guide surface 8 being arranged to deflect light as output light through the first guide surface 6, and the waveguide 1 being arranged to direct the output light into optical windows in output directions that are distributed in a lateral direction in dependence on the input position of the input light; and an input end, front light shielding arrangement for shielding the light sources, comprising: an extraction film strip 408 extending across the first guide surface 6 adjacent the input end 2, the extraction film strip 408 comprising an array of alternating first and second facets 409, 411, the first facets 409 being oriented to receive light 406 that leaks from the first guide surface 6 while being guided along the waveguide 1, and the second facets 411 being arranged to deflect the received light towards the normal to the first guide surface 6; and a mask 410 arranged outside the extraction film strip 408 arranged to absorb the received light after deflection by the second facets 411.

In operation, light from element 206 is refracted at the input end 2 of the waveguide 1. For substantially flat input side, the light rays 404 are captured by the waveguide 1 and guided to the mirror at the end 4 of the waveguide. However, defects 401 near the input side of the waveguide 1 will create light rays 406 that are not guided and can escape the waveguide 1. At positions close to the input side, the fan of light rays from the element 206 is small and the intensity of the escaping light can be high. Desirably, the light may be hidden from a display observer.

It has been appreciated that such escaping light rays 406 may typically be close to grazing incidence to the surface 6 and can thus be difficult to absorb in planar mask layers that can remain reflective to rays with high angles of incidence and thus not capture leaking light effectively. Further, planar light absorption layers may contact the waveguide plate and cause light loss due to lack of light guiding. It may be desirable to increase the absorption of such light rays using a mask that does not substantially contact the surfaces 6, 8 of the waveguide. The present embodiments achieve improved absorption by deflection of escaping light rays towards the normal wherein absorbing elements can efficiently remove their visibility. The facets 409, 411 may be formed in a microstructured optical element.

FIG. 43 illustrates that the extraction film strip may be arranged between the waveguide 1 and spatial light modulator 48 (not shown). Preferably a second extraction film strip 412 with absorbing layer 414 is arranged to absorb rays 416 emitted towards the bottom of the waveguide 1 as shown in FIG. 44. Thus an extraction film strip 412 may extend across the second guide surface 8 adjacent the input end 2, the extraction film strip 412 comprising an array of alternating first and second facets 415, 417, the first facets 415 being oriented to receive light 416 that leaks from the second guide surface 8 while being guided along the waveguide 1 and the second facets 417 being arranged to deflect the received light 416 towards the normal to the first guide surface 6; and a mask 414 arranged outside the extraction film strip 414 arranged to absorb the received light after deflection by the second facets 417.

Further as shown in FIG. 45, the extraction film strip may be absorptive for absorbing at least part of the received light. The extraction film strip may comprise absorbing materials within its bulk. Advantageously absorption of rays 418 may be increased while capturing light that is close to grazing incidence to surfaces 6, 8. FIG. 45 further shows the position of spatial light modulator 48 with active pixel area 426 and bezel 424.

Figure 46:
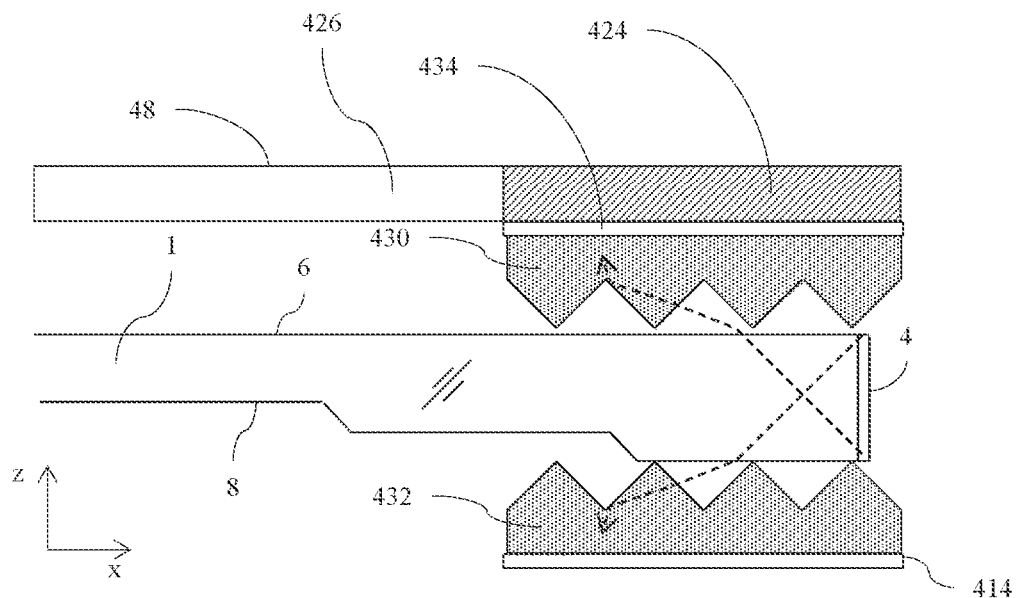
FIG. 46 is a schematic diagram illustrating a light shielding arrangement for the mirror end of a waveguide, in accordance with the present disclosure.

FIG. 46 is a schematic diagram illustrating a light shielding arrangement for the mirror end 4 of a waveguide 1. Thus the waveguide 1 further comprises a reflective end 4 for reflecting input light back through the waveguide 1, the second guide surface 8 being arranged to deflect light after reflection from the reflective end 4 as said output light. Front light shielding arrangement 430 for shielding the light sources, may comprise: an extraction film strip 430 extending across the first guide surface adjacent the reflective end, the extraction film strip 430 comprising an array of alternating first and second facets, the first facets being oriented to receive light that leaks from the first guide surface while being guided along the waveguide, and the second facets being arranged to deflect the received light towards the normal to the first guide surface; and a mask 424 arranged outside the extraction film strip arranged to absorb the received light after deflection by the second facets. Further a rear light shielding arrangement 432 for shielding the light sources may be provided. The masks 410, 414 of the or each light shielding arrangement may be a layer formed on the outside surface of the extraction film strip 408, 412. The mask of the input end, front light shielding arrangement may be a portion 424 of the spatial light modulator 48.

The waveguide 1 of the present embodiments may be a valve type such as shown in FIG. 37A or a wedge type such as shown in FIG. 37B.

Figure 47:
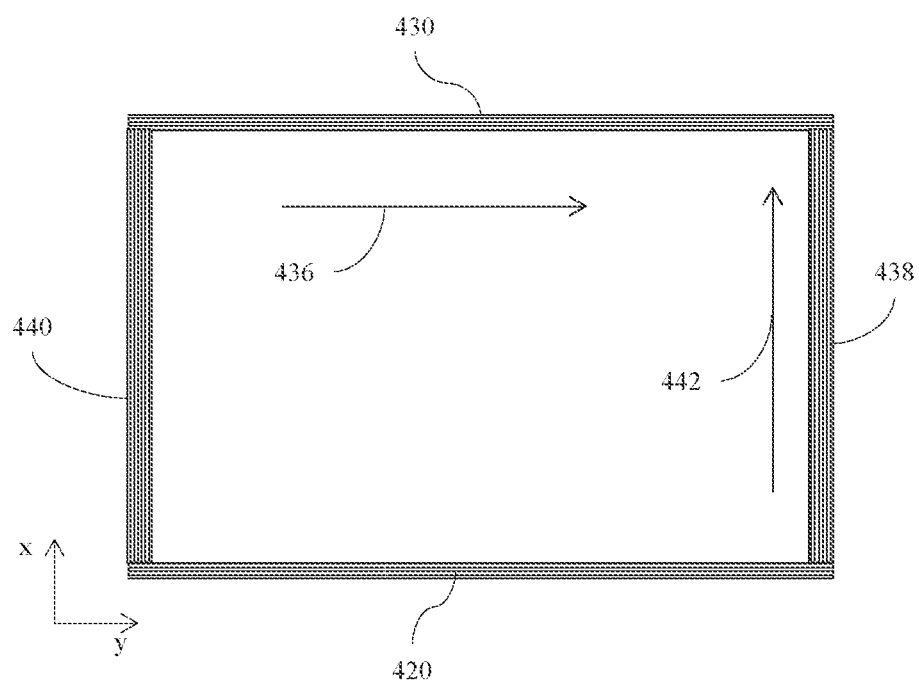
FIG. 47 is a schematic diagram illustrating a top view of a light shielding arrangement for a directional backlight, in accordance with the present disclosure.

FIG. 47 is a schematic diagram illustrating a top view of a light shielding arrangement for a directional backlight. Extraction film strips 430, 432 may be arranged with facets that are extended in the first direction 436. Further, additional film extraction strips 438, 440 that are extended in direction 442 that is orthogonal to direction 436 to reduce light loss from the edge of the waveguide 1. Advantageously, the visibility of manufacturing errors in the waveguide 1 at each edge of the waveguide 1 can be minimised. Further, the light extraction strip can be provided as a single layer to reduce assembly cost.

As may be used herein, the terms "substantially" and "approximately" provide an industry-accepted tolerance for its corresponding term and/or relativity between items. Such an industry-accepted tolerance ranges from zero percent to ten percent and corresponds to, but is not limited to, component values, angles, et cetera. Such relativity between items ranges between approximately zero percent to ten percent.

While various embodiments in accordance with the principles disclosed herein have been described above, it should be understood that they have been presented by way of example only, and not limitation. Thus, the breadth and scope of this disclosure should not be limited by any of the above-described exemplary embodiments, but should be defined only in accordance with any claims and their equivalents issuing from this disclosure. Furthermore, the above advantages and features are provided in described embodiments, but shall not limit the application of such issued claims to processes and structures accomplishing any or all of the above advantages.

Additionally, the section headings herein are provided for consistency with the suggestions under 37 CFR 1.77 or otherwise to provide organizational cues. These headings shall not limit or characterize the embodiment(s) set out in any claims that may issue from this disclosure. Specifically and by way of example, although the headings refer to a "Technical Field," the claims should not be limited by the language chosen under this heading to describe the so-called field. Further, a description of a technology in the "Background" is not to be construed as an admission that certain technology is prior art to any embodiment(s) in this disclosure. Neither is the "Summary" to be considered as a characterization of the embodiment(s) set forth in issued claims. Furthermore, any reference in this disclosure to "invention" in the singular should not be used to argue that there is only a single point of novelty in this disclosure. Multiple embodiments may be set forth according to the limitations of the multiple claims issuing from this disclosure, and such claims accordingly define the embodiment(s), and their equivalents, that are protected thereby. In all instances, the scope of such claims shall be considered on their own merits in light of this disclosure, but should not be constrained by the headings set forth herein.

The invention claimed is:

1. A directional backlight for a directional display apparatus, comprising:
    an array of light sources;
    a waveguide comprising an input end arranged to receive input light from the array of light sources at respective input positions, and first and second, opposed guide surfaces for guiding input light along the waveguide, the second guide surface being arranged to deflect light as output light through the first guide surface;
    an input end, front light shielding arrangement for shielding the light sources, comprising:
        an extraction film strip extending across the first guide surface adjacent the input end, the extraction film strip comprising an array of alternating first and second facets, the first facets being oriented to receive light that leaks from the first guide surface while being guided along the waveguide, and the second facets being arranged to deflect the received light towards the normal to the first guide surface; and
        a mask arranged outside the extraction film strip arranged to absorb the received light after deflection by the second facets; and
    an input end, rear light shielding arrangement for shielding the light sources comprising:
        an extraction film strip extending across the second guide surface adjacent the input end, the extraction film strip comprising an array of alternating first and second facets, the first facets being oriented to receive light that leaks from the second guide surface while being guided along the waveguide and the second facets being arranged to deflect the received light towards the normal to the second guide surface; and
        a mask arranged outside the extraction film strip arranged to absorb the received light after deflection by the second facets.

2. A directional backlight according to claim 1, wherein at least one of:
    the extraction film strip of the input end, front light shielding arrangement, and
    the extraction film strip of the input end, rear light shielding arrangement is absorptive for absorbing at least pan of the received light.

3. A directional backlight according to claim 1, wherein the waveguide further comprises a reflective end for reflecting input light back through the waveguide, the second guide surface being arranged to deflect light after reflection from the reflective end as said output light.

4. A directional backlight according to claim 3, further comprising a reflective end, front light shielding arrangement for shielding the light sources, comprising:
    an extraction film strip extending across the first guide surface adjacent the reflective end, the extraction film strip comprising an array of alternating first and second facets, the first facets being oriented to receive lion that leaks from the first guide surface while being guided along the waveguide, and the second facets being arranged to deflect the received light towards the normal to the first guide surface; and
    a mask arranged outside the extraction film snip arranged to absorb the received light after deflection by the second facets.

5. A directional backlight according to claim 4, further comprising a reflective end, rear light shielding arrangement for shielding the light sources, comprising:
    an extraction film strip extending across the second guide surface adjacent the reflective end, the extraction film strip comprising an army of alternating first and second facets, the first facets being oriented to receive light that leaks from the second guide surface while being guided along the waveguide and the second facets being arranged to deflect the received light towards the normal to the first guide surface; and
    a mask arranged outside the extraction film strip arranged to absorb the received light after deflection by the second facets.

6. A directional backlight according to claim 5, wherein at least one of the masks of:
    the input end, front light shielding arrangement,
    the input end, rear light shielding arrangement,
    the reflective end, front light shielding arrangement, and
    the reflective end, rear light shielding arrangement is a layer formed on the outside surface of the extraction film strip.

7. A directional backlight according to claim 1, wherein the first guide surface is arranged to guide light by total internal reflection and the second guide surface comprises a plurality of light extraction features oriented to direct light guided through the waveguide in directions allowing exit through the first guide surface as the output light and intermediate regions between the light extraction features that are arranged to guide light through the waveguide.

8. A directional backlight according to claim 1, wherein
    the first guide surface is arranged to guide light by total internal reflection and the second guide surface is substantially planar and inclined at an angle to direct, light in directions that break that total internal reflection for outputting light through the first guide surface, and
    the directional display apparatus further comprises a deflection element extending across the first guide surface of the waveguide for deflecting light towards the normal to the first guide surface.

9. A directional display apparatus comprising:
    a directional backlight according to claim 1; and
    a transmissive spatial light modulator arranged to receive the output light from the first guide surface of the waveguide and to modulate it to display an image.

10. A directional display apparatus according to claim 9, wherein the mask of the input end, front light shielding arrangement is a portion of the spatial light modulator.

11. A directional backlight tor a directional display apparatus, comprising:
    an array of light sources;
    a waveguide comprising an input end arranged to receive input light from the array of light sources at respective input positions, and first and second, opposed guide surfaces for guiding input light along the waveguide, the second guide surface being arranged to deflect light as output light through the first guide surface;

a first extraction film strip extending across at least a portion of the first guide surface, the extraction film strip comprising a first array of alternating first and second facets, the first array of first facets being oriented to receive light that leaks from the first guide surface while being guided along the waveguide, and the first, array of second facets being arranged to deflect the received light towards the normal to the first guide surface;

a first mask arranged outside the first extraction film strip arranged to absorb the received light after deflection by the first array of second facets;

a second extraction film strip extending across at least a portion of the second guide surface, the extraction film strip comprising a second array of alternating first and second facets, the second array of first facets being oriented to receive light that leaks from the second guide surface while being guided along the waveguide and; the second array of second facets being arranged to deflect the received light towards the normal to the second guide surface; and a second mask arranged outside the second extraction film strip arranged to absorb the received light after deflection by the second array of second facets.

12. A directional backlight according to claim 11, wherein the waveguide further comprises a reflective end for reflecting input light back through the waveguide, the second guide surface being arranged to deflect light after reflection from the reflective end as said output light.

13. A directional backlight according to claim 12, wherein at least one of the first and second extraction strips is adjacent to the reflective end of the waveguide.

14. A directional backlight according to claim 13, wherein one of the first and second extraction strips is adjacent to the reflective end of the waveguide, and the other of the first and second extraction strips is adjacent to the input end of the waveguide.

15. A directional backlight according to claim 11, wherein for at least one of the first and second arrays of first alternating first and second facets, ridges between respective pairs of the alternating first and second facets extend in a direction orthogonal to the normal to an input-end surface of the waveguide and orthogonal to the normal to the first guide surface.

16. A directional backlight for a directional display, apparatus, comprising:

an array of light sources;

a waveguide comprising an input end arranged to receive input, light from the array of light sources at respective input positions, and first and second, opposed guide surfaces for guiding input light along the waveguide, the second guide surface being arranged to deflect light as output light through the first guide surface;

a front light shielding arrangement for shielding the light sources, the front light shielding arrangement extending across at least a portion of the first guide surface, the a front light shielding arrangement comprising a first array of alternating first and second facets, the first array of first facets being oriented to receive light that leaks from the first guide surface while being guided along the waveguide, and the first array of second facets being arranged to deflect the received light towards the normal to the first guide surface, the front light shielding arrangement being configured to absorb the received light after deflection by the first array of second facets; and a rear light shielding arrangement for shielding the light sources, the rear light shielding arrangement extending across at least a portion of the second guide surface, the rear light shielding arrangement comprising a second array of alternating first and second facets, the second array of first facets being oriented to receive light that leaks from the second guide surface while being guided along the waveguide and the second array of second facets being arranged to deflect the received light towards the normal to the second guide surface, the rear light shielding arrangement being configured to absorb the received light after deflection by the second array of second facets.

17. A directional backlight according to claim 16, wherein the waveguide further comprises a reflective end for reflecting input light back through the waveguide, the second guide surface being, arranged to deflect, light after reflection from the reflective end as said output light.

18. A directional backlight according to claim 17, wherein at least a portion of at least one of the front and rear light shielding arrangements is adjacent to the reflective end of the waveguide.

19. A directional backlight according to claim 18, wherein at least a portion of one of the front and rear light shielding arrangements is adjacent to the reflective end of the waveguide, and the other of the front and rear light shielding arrangements is adjacent to the input end of the waveguide.

20. A directional backlight according to claim 16, wherein for at least one of the first and second arrays of first alternating first and second facets, ridges between respective pairs of the alternating first and second facets extend in a direction orthogonal to the normal to an input-end surface of the waveguide and orthogonal to the normal to the first guide surface.

* * * * *